US007356150B2

(12) United States Patent
Ejima et al.

(10) Patent No.: US 7,356,150 B2
(45) Date of Patent: Apr. 8, 2008

(54) METHOD AND APPARATUS FOR EXTENDING BAND OF AUDIO SIGNAL USING NOISE SIGNAL GENERATOR

(75) Inventors: Naoki Ejima, Osaka (JP); Kazuya Iwata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 154 days.

(21) Appl. No.: 10/566,131

(22) PCT Filed: Jul. 23, 2004

(86) PCT No.: PCT/JP2004/010886

§ 371 (c)(1), (2), (4) Date: May 10, 2006

(87) PCT Pub. No.: WO2005/011127

PCT Pub. Date: Feb. 3, 2005

(65) Prior Publication Data

US 2006/0227018 A1 Oct. 12, 2006

(30) Foreign Application Priority Data

Jul. 29, 2003 (JP) ............................ 2003-281549

(51) Int. Cl.
*H03G 3/00* (2006.01)

(52) U.S. Cl. ........................ 381/61; 381/98; 381/94.1; 381/94.3

(58) Field of Classification Search .................. 381/61, 381/98, 94.1-94.9; 704/500-502
See application file for complete search history.

(56) References Cited

U.S. PATENT DOCUMENTS

| | | | | |
|---|---|---|---|---|
| 5,754,666 | A | 5/1998 | Nakagawa | |
| 6,829,360 | B1 * | 12/2004 | Iwata et al. | 381/61 |
| 6,941,333 | B2 | 9/2005 | Akune et al. | |
| 7,236,839 | B2 * | 6/2007 | Fujita et al. | 700/94 |
| 2002/0121999 | A1 | 9/2002 | Akune et al. | |
| 2004/0234083 | A1 * | 11/2004 | Katou et al. | 381/101 |
| 2007/0064956 | A1 * | 3/2007 | Iwata | 381/61 |

FOREIGN PATENT DOCUMENTS

| | | |
|---|---|---|
| EP | 0 706 299 | 4/1996 |
| EP | 1 126 620 | 8/2001 |

FOREIGN PATENT DOCUMENTS

| | | |
|---|---|---|
| JP | 9-18351 | 1/1997 |
| JP | 9-23162 | 1/1997 |
| JP | 2002-15522 | 1/2002 |
| JP | 2002-252562 | 9/2002 |
| JP | 2002-366178 | 12/2002 |
| JP | 2002-372993 | 12/2002 |
| JP | 2003-15695 | 1/2003 |
| WO | 00/70769 | 11/2000 |

* cited by examiner

*Primary Examiner*—Vivian Chin
*Assistant Examiner*—Disler Paul
(74) *Attorney, Agent, or Firm*—Wenderoth, Lind & Ponack, L.L.P.

(57) ABSTRACT

A bandpass filter bandpass-filters an inputted signal X to pass therethrough a partial band of a band of the inputted signal X, and a level correlated white noise generator circuit generates a white noise signal having a level changing according to a level of the inputted signal and correlated to the inputted signal. A signal processing circuit executes a signal processing that includes a predetermined bandpass filtering processing, an echo adding processing, and a level adjustment processing, and that multiplies the inputted white noise signal by a predetermined transfer function, and outputs a processed white noise signal to an adder. The adder adds up the white noise signal from the signal processing circuit and the inputted signal X, and outputs a band-extended signal having an addition result, as an outputted signal.

22 Claims, 33 Drawing Sheets

PROBABILITY DENSITY OF WHITE NOISE SIGNAL AT N=1

PROBABILITY DENSITY OF DIAMOND NOISE SIGNAL AT N=2

PROBABILITY DENSITY OF BELL NOISE SIGNAL AT N=3

METHOD AND APPARATUS FOR EXTENDING BAND OF AUDIO SIGNAL USING NOISE SIGNAL GENERATOR

TECHNICAL FIELD

The present invention relates to a method and an apparatus for extending a band of an audio signal, capable of improving sound quality of the audio signal reproduced by an audio equipment, in particular in a higher frequency range, and capable of reproducing such an audio signal comfortable to the human ear. In particular, the present invention relates to an audio signal band extending apparatus and a method thereof for extending a band of an inputted audio signal by performing a digital processing on the inputted audio signal. In addition, the present invention relates to a program that includes steps of the above-mentioned audio signal band extending method and a computer readable recording medium that stores the program.

BACKGROUND ART

A method and an apparatus (referred to as a prior art hereinafter) for extending a band of an audio signal are disclosed in, for example, a pamphlet of international application publication No. WO00/70769. According to the prior art, a higher harmonic wave component is generated based on an inputted audio signal, a level of the inputted audio signal is detected, and a noise signal, which is a random higher harmonic wave component, is generated independently of the inputted audio signal. Then, after a level of a generated noise signal is changed according to a detected level, a generated higher harmonic wave component is added to a level-changed noise signal, and a predetermined bandpass filtering processing is executed on a signal having an addition result. Further, the inputted audio signal is added to a signal on which the bandpass filtering processing has been executed while adjusting the level of the inputted audio signal, and a signal having an addition result is outputted as an outputted signal from the apparatus.

DISCLOSURE OF INVENTION

According to the prior art, the noise signal, which is the random higher harmonic wave component, is generated independently of the inputted audio signal. Accordingly, it is necessary to adjust the level of the generated noise signal to that of the inputted audio signal. This requires level detection means and variable amplification and attenuation means for amplitude adjustment, and this leads to such a problem that a rising of an audio signal is delayed and the spectral continuity thereof becomes unnatural. Therefore, it is impossible to obtain a satisfactory audio signal in terms of both frequency characteristic and time characteristic.

An object of the present invention is to provide an audio signal band extending apparatus and a method thereof, solving the above-mentioned problems, having such a configuration that is simpler than that of the prior art, and capable of generating a band-extended audio signal having improved frequency characteristic and time characteristic.

Another object of the present invention is to provide an optical disc system that includes the audio signal band extending apparatus, a program that includes steps of the audio signal band extending method, and a computer readable recording medium that stores the program.

According to the first aspect view of the present invention, there is provided an audio signal band extending apparatus.

The audio signal band extending apparatus includes a noise generating device, a signal processing device, and an adding device. The noise generating device generates a noise signal level-correlated to and so as to change according to one of a level of an inputted signal and a level of a signal in a partial band obtained by bandpass-filtering the inputted signal using a bandpass filtering device. The signal processing device multiplies a generated noise signal by a predetermined transfer function so that, at a lower limit frequency of a predetermined band-extended signal, a level of the generated noise signal substantially coincides with the level of the inputted signal and a spectral continuity thereof is kept when addition is executed by an adding device, and outputs a signal having a multiplication result. The adding device adds up the inputted signal and an outputted signal from the signal processing means, and outputs a signal having an addition result.

The above-mentioned audio signal band extending apparatus preferably further includes a first conversion device provided so as to be inserted at the previous stage of the bandpass filtering device, for converting the inputted signal into a digital signal, and a second conversion device provided so as to be inserted between the signal processing device and the adding device, for converting the outputted signal from the signal processing device into an analog signal.

In addition, the above-mentioned audio signal band extending apparatus preferably further includes an oversampling type low-pass filtering device provided so as to be inserted at the previous stage of the bandpass filtering device and the adding device, for oversampling and low-pass filtering the inputted signal, and for outputting a resultant signal to the bandpass filtering device and the adding device.

Further, the above-mentioned audio signal band extending apparatus preferably further includes an oversampling type low-pass filtering device provided to be inserted at the previous stage of the adding device, for oversampling and low-pass filtering the inputted signal, and for outputting a resultant signal to the adding device, and an oversampling device provided to be inserted between the noise generating device and the signal processing device, for oversampling the noise signal from the noise generating device, and for outputting a resultant signal to the signal processing device.

Still further, in the above-mentioned audio signal band extending apparatus the noise generating device preferably includes a level signal generating device, a noise signal generating device, and a multiplying device. The level signal generating device detects a level of a signal inputted to the noise generating device, and generates and outputs a level signal having a detected level. The noise signal generating device generates and outputs a noise signal according to the signal inputted to the noise generating device. The multiplying device multiplies the level signal from the level signal generating device by the noise signal from the noise signal generating device, and outputs a noise signal having a multiplication result.

In addition, in the above-mentioned audio signal band extending apparatus, the noise signal generating device preferably includes a delta sigma modulator type quantizer, generates a quantized noise signal of a signal inputted to the noise signal generating device, and outputs a generated quantized noise signal as the noise signal.

Further, the above-mentioned audio signal band extending apparatus includes a first cutting-out device, at least one second cutting-out device, and a multiplying device. The first cutting-out device cuts out predetermined higher-order bits from the signal inputted to the noise generating device, and outputs a signal including the higher-order bits. The at least one second cutting-out device cuts out at least one of predetermined intermediate-order bits and predetermined lower-order bits from the signal inputted to the noise generating device, and outputs a signal including the at least one of the predetermined intermediate-order bits and predetermined lower-order bits. The multiplying device multiplies a signal from the first cutting-out device by a signal from the second cutting-out device, and outputs a noise signal having a multiplication result.

In this case, the second cutting-out device preferably cuts out either one of a combination of intermediate-order bits and lower-order bits, and two intermediate-order bits, at different bit locations and with a predetermined bit width, adding up cut out bits, and outputs a signal having an addition result. Alternatively, the second cutting-out device preferably cuts out either one of a combination of intermediate-order bits and two lower-order bits, and three intermediate-order bits, at different bit locations and with a predetermined bit width, adding up cut out bits, and outputs a signal having an addition result. In stead, the above-mentioned audio signal band extending apparatus preferably includes an independent noise generating device for generating a noise signal independent of the inputted signal, and a further adding device for adding up the noise signal from the second cutting-out device and the noise signal from the independent noise generating device, and for outputting a signal having an addition result to the multiplying device.

In addition, in the above-mentioned audio signal band extending apparatus, the independent noise generating device preferably generates a plurality of noise signals different from each other, adds up the plurality of noise signals, and outputs a signal having an addition result.

Further, in the above-mentioned audio signal band extending apparatus, the independent noise generating device preferably generates a diamond dithering noise signal.

In the above-mentioned audio signal band extending apparatus, the noise generating device preferably includes a non-uniformity quantization device, a dequantization device, and a subtraction device. The non-uniformity quantization device quantizes a signal inputted to the noise generating device non-uniformly relative to a level thereof, and outputs a resultant signal. The dequantization device executes a processing opposite to a processing executed by the non-uniformity quantization device on a signal from the non-uniformity quantization device, and outputs a resultant signal. The subtraction device generates and outputs a quantized noise signal of the signal inputted to the noise generating device by calculating a difference between the signal inputted to the noise generating device and a signal from the dequantization device.

In this case, in the above-mentioned audio signal band extending apparatus, the non-uniformity quantization device preferably quantizes an inputted signal so as to increase a quantization width as a level of the inputted signal is larger.

In addition, in the above-mentioned audio signal band extending apparatus, the non-uniformity quantization device preferably compresses a run length of a linear code of L bits into 1/N thereof so as to generate and output data of M bits, where L, M and N are positive integers each of which equals to or larger than 2.

In the above-mentioned audio signal band extending apparatus, the non-uniformity quantization device preferably converts a linear code of L bits that consists of continuous data Q0 of continuous bits each having a predetermined logic and being allocated in a higher order part, an inverted bit T0 that breaks continuity of the continuous data Q0, and lower-order data D0 following the inverted bit T0, into compressed data of M bits consisting of compressed continuous data Q1 obtained by compressing a run length of the continuous data Q0, an inverted bit T1 for that breaks continuity of the compressed continuous data Q1, compressed residual data F1 representing a residue generated upon compressing the run length, and mantissa data D1 obtained by rounding the lower-order data D0, and outputs the compressed data of M bits. Provided that the run length of the continuous data Q0 is L0, a run length of the compressed continuous data Q1 is L1, and that N is an integer equal to or larger than 2, the run length L1 of the compressed continuous data Q1 and the compressed residual data F1 are expressed by L1=Int (L0/N) and F1=L0 mod N, respectively, where Int is a function that represents an integer value of an argument, and A mod B is a function that represents a residue obtained when A is divided by B.

In addition, in the above-mentioned audio signal band extending apparatus, the dequantization device preferably extends a compressed data that consists of compressed continuous data Q1 of continuous bits each having a predetermined logic and being allocated in a higher-order part, an inverted bit T1 that breaks continuity of the compressed continuous data Q1, compressed residual data F1 representing a residue generated upon compressing a run length of the compressed continuous data Q1, and a mantissa data D1, by extending the run length of the compressed continuous data Q1 by "N" times, adding continuous data having a length corresponding to a value of the F1, adding an inverted bit T0 that breaks continuity of Q0, further adding the mantissa data D1 to a resultant data, reading out the continuous data Q0, the inverted bit T0, and the mantissa data D0, and outputting an extended data. Provided that a run length of the continuous data Q0 is L0, a run length of the compressed continuous data Q1 is L1, a residue obtained from the compressed residual data F1 is F1, and N is an integer equal to or larger than 2, the run length L0 and the mantissa data D0 are expressed by L0=L1*n+F1 and D0=D1, respectively, where * is an arithmetic symbol representing multiplication.

Further, in the above-mentioned audio signal band extending apparatus, the non-uniformity quantization device preferably floating-encodes an inputted linear code into a floating code having a predetermined effective bit length, and outputs an encoded signal having the floating code.

In the above-mentioned audio signal band extending apparatus, the noise generating device preferably includes a table memory device for storing a relationship between the signal inputted to the noise generating device and a noise signal level-correlated to the signal inputted to the noise generating device so as to change according to a level of the signal inputted to the noise generating device, and conversion means for, responsive to the signal inputted to the noise generating means, reading out and outputting a noise signal corresponding to the signal inputted to the noise generating device from the table memory device.

In the above-mentioned audio signal band extending apparatus, the signal processing device preferably includes at least a first filtering device, and filters out frequency bands higher than a frequency band of the inputted signal.

In addition, in the above-mentioned audio signal band extending apparatus, the signal processing device preferably includes at least a (1/f) filtering device, and applies a (1/f) reduction characteristic to a higher frequency band spectrum of the signal inputted to the signal processing device.

Further, in the above-mentioned audio signal band extending apparatus, the signal processing device preferably includes at an least echo adding processing device, and adds an echo signal to a higher frequency band spectrum of the signal inputted to the signal processing device.

Still further, in the above-mentioned audio signal band extending apparatus, the signal processing device preferably includes at least a second filtering device, filters out frequency bands higher than a frequency band of the signal inputted to the signal processing device so as to include frequency bands exceeding a Nyquist frequency.

According to the second aspect of the present invention, there is provided an audio signal band extending method including a noise generating step, a signal processing step, and an adding step. The noise generating step generates a noise signal level-correlated to and so as to change according to one of a level of an inputted signal and a level of a signal in a partial band obtained by bandpass-filtering the inputted signal using a bandpass filtering step. The signal processing step of multiplies a generated noise signal by a predetermined transfer function so that, at a lower limit frequency of a predetermined band-extended signal, a level of the generated noise signal substantially coincides with the level of the inputted signal and a spectral continuity thereof is kept when addition is executed in an adding step, and outputs a signal having a multiplication result. The adding step adds up the inputted signal and an outputted signal from the signal processing step, and outputs a signal having an addition result.

The above-mentioned audio signal band extending preferably further includes a first conversion step inserted and executed prior to the bandpass filtering step, and a second conversion step inserted and executed between the signal processing step and the adding step. The first conversion step converts the inputted signal into a digital signal, and the second conversion step converts the outputted signal from the signal processing step into an analog signal.

In addition, the above-mentioned audio signal band extending method preferably further includes an oversampling type low-pass filtering step inserted and executed prior to the bandpass filtering step and the adding step. The oversampling type low-pass filtering step oversamples and low-pass filters the inputted signal, and outputs a resultant signal to the bandpass filtering step and the adding step.

Further, the above-mentioned audio signal band extending method preferably further includes an oversampling type low-pass filtering step inserted and executed prior to the adding step, and an oversampling step inserted and executed between the noise generating step and the signal processing step. The oversampling type low-pass filtering step oversamples and low-pass filters the inputted signal, and outputs a resultant signal to the adding step. The oversampling step oversamples the noise signal from the noise generating step, and outputs a resultant signal to the signal processing step.

Still further, in the above mentioned audio signal band extending method, the noise generating step preferably includes a level signal generating step, a noise signal generating step, and a multiplying step. The level signal generating step detects a level of a signal inputted to the noise generating step, and generates and outputs a level signal having a detected level. The noise signal generating step generates and outputs a noise signal according to the signal inputted to the noise generating step. The multiplying step multiplies the level signal from the level signal generating step by the noise signal from the noise signal generating step, and outputs a noise signal having a multiplication result.

In addition, in the above-mentioned audio signal band extending method the noise signal generating step preferably includes a delta sigma modulator type quantizer step, generates a quantized noise signal of a signal inputted to the noise signal generating step, and outputs a generated quantized noise signal as the noise signal.

Further, in the above-mentioned audio signal band extending method the noise generating step preferably includes a first cutting-out step, at least one second cutting-out step, and a multiplying step. The first cutting-out cuts out predetermined higher-order bits from the signal inputted to the noise generating step, and outputs a signal including the higher-order bits. The at least one second cutting-out step of cuts at least one of predetermined intermediate-order bits and predetermined lower-order bits from the signal inputted to the noise generating step, and outputs a signal including the at least one of the predetermined intermediate-order bits and predetermined lower-order bits. The multiplying step multiplies a signal from the first cutting-out step by a signal from the second cutting-out step, and outputs a noise signal having a multiplication result.

In this case, in the above-mentioned audio signal band extending method, the second cutting-out step preferably cuts out either one of a combination of intermediate-order bits and lower-order bits, and two intermediate-order bits, at different bit locations and with a predetermined bit width, adding up cut out bits, and outputs a signal having an addition result. Alternatively, the second cutting-out step preferably cuts out either one of a combination of intermediate-order bits and two lower-order bits, and three intermediate-order bits, at different bit locations and with a predetermined bit width, adding up cut out bits, and outputs a signal having an addition result. In stead, the above-mentioned audio signal band extending method preferably further includes an independent noise generating step of generating a noise signal independent of the inputted signal, and a further adding step of adding up the noise signal from the second cutting-out step and the noise signal from the independent noise generating step, and of outputting a signal having an addition result to the multiplying step.

In addition, in the above-mentioned audio signal band extending method the independent noise generating step preferably generates a plurality of noise signals different from each other, adds up the plurality of noise signals, and outputs a signal having an addition result.

Further, in the above-mentioned audio signal band extending method, the independent noise generating step preferably generates a diamond dithering noise signal.

In the above-mentioned audio signal band extending method, the noise generating step preferably includes a non-uniformity quantization step, a dequantization step, and a subtraction step. The non-uniformity quantization step quantizes a signal inputted to the noise generating step non-uniformly relative to a level thereof, and outputs a resultant signal. The dequantization step executes a processing opposite to a processing executed by the non-uniformity quantization step on a signal from the non-uniformity quantization step, and outputs a resultant signal. The subtraction step generates and outputs a quantized noise signal of the signal inputted to the noise generating step by calculating a difference between the signal inputted to the noise generating step and a signal from the dequantization step.

In the above-mentioned audio signal band extending, the non-uniformity quantization step preferably quantizes an inputted signal so as to increase a quantization width as a level of the inputted signal is larger.

In addition, in the above-mentioned audio signal band extending method the non-uniformity quantization step preferably compresses a run length of a linear code of L bits into 1/N thereof so as to generate and output data of M bits, where L, M and N are positive integers each of which equals to or larger than 2.

In the above-mentioned audio signal band extending, the non-uniformity quantization step preferably converts a linear code of L bits that consists of continuous data Q0 of continuous bits each having a predetermined logic and being allocated in a higher order part, an inverted bit T0 that breaks continuity of the continuous data Q0, and lower-order data D0 following the inverted bit T0, into compressed data of M bits consisting of compressed continuous data Q1 obtained by compressing a run length of the continuous data Q0, an inverted bit T1 for that breaks continuity of the compressed continuous data Q1, compressed residual data F1 representing a residue generated upon compressing the run length, and mantissa data D1 obtained by rounding the lower-order data D0, and outputs the compressed data of M bits. Provided that the run length of the continuous data Q0 is L0, a run length of the compressed continuous data Q1 is L1, and that N is an integer equal to or larger than 2, the run length L1 of the compressed continuous data Q1 and the compressed residual data F1 are expressed by L1=Int (L0/N) and F1=L0 mod N, respectively, where Int is a function that represents an integer value of an argument, and A mod B is a function that represents a residue obtained when A is divided by B.

In addition, in the above-mentioned audio signal band extending method, the dequantization step preferably extends a compressed data that consists of compressed continuous data Q1 of continuous bits each having a predetermined logic and being allocated in a higher-order part, an inverted bit T1 that breaks continuity of the compressed continuous data Q1, compressed residual data F1 representing a residue generated upon compressing a run length of the compressed continuous data Q1, and a mantissa data D1, by extending the run length of the compressed continuous data Q1 by "N" times, adding continuous data having a length corresponding to a value of the F1, adding an inverted bit T0 that breaks continuity of Q0, further adding the mantissa data D1 to a resultant data, reading out the continuous data Q0, the inverted bit T0, and the mantissa data D0, and outputting an extended data. Provided that a run length of the continuous data Q0 is L0, a run length of the compressed continuous data Q1 is L1, a residue obtained from the compressed residual data F1 is F1, and N is an integer equal to or larger than 2, the run length L0 and the mantissa data D0 are expressed by L0=L1*n+F1 and D0=D1, respectively, where * is an arithmetic symbol representing multiplication.

Further, in the above-mentioned audio signal band extending method, the non-uniformity quantization step preferably floating-encodes an inputted linear code into a floating code having a predetermined effective bit length, and outputs an encoded signal having the floating code.

In the above-mentioned audio signal band extending method, the noise generating step preferably includes a table memory step and a conversion step. The table memory step stores a relationship between the signal inputted to the noise generating step and a noise signal level-correlated to the signal inputted to the noise generating step so as to change according to a level of the signal inputted to the noise generating step. The conversion step, responsive to the signal inputted to the noise generating step, reads out and outputs a noise signal corresponding to the signal inputted to the noise generating step from the table memory step.

In the above-mentioned audio signal band extending, the signal processing step preferably includes at least a first filter step, and filters out frequency bands higher than a frequency band of the inputted signal.

In addition, in the above-mentioned audio signal band extending method, the signal processing step preferably includes at least a (1/f) filtering step, and applies a (1/f) reduction characteristic to a higher frequency band spectrum of the signal inputted to the signal processing step.

Further, in the above-mentioned audio signal band extending method, the signal processing step preferably includes at least an echo adding processing step, and adds an echo signal to a higher frequency band spectrum of the signal inputted to the signal processing step.

Still further, in the above-mentioned audio signal band extending method the signal processing step preferably includes at least a second filtering step, and filters out frequency bands higher than a frequency band of the signal inputted to the signal processing step so as to include frequency bands exceeding a Nyquist frequency.

According to the third aspect view of the present invention, there is provided an optical disk system including a reproduction apparatus for reproducing an audio signal stored in an optical disk, and the above-mentioned audio signal band extending apparatus for extending a band of a reproduced audio signal, and for outputting a band-extended audio signal.

According to the fourth aspect view of the present invention, there is provided a program that includes the respective steps of the above-mentioned audio signal band extension method.

According to the fifth aspect view of the present invention, there is provided a computer readable recording medium that stores a program including the respective steps of the above-mentioned audio signal band extension method.

Therefore, according to the audio signal band extending apparatus and the method thereof according to the present invention, there is generated a noise signal having a level changing according to a level of an inputted signal and correlated to the level of the inputted signal in bands equal to or higher than the band of the inputted signal, and the noise signal is added to the inputted signal so as to keep the spectral continuity thereof. Accordingly, it is possible to easily generate a signal having an extended audio band as compared with the prior art. In addition, a band-extended signal obtained as stated above changes according to a level of an original sound and keeps its spectral continuity. Accordingly, the method or apparatus according to the present invention exhibits such an advantageous effect that a higher frequency component of the band-extended signal sounds not artificial but natural relative to the original sound.

In addition, according to the audio signal band extending apparatus and the method thereof according to the present invention, the bandpass filtering processing, the level correlated white noise generating processing, and the signal processing are executed by digital signal processing. Accordingly, variations in performance do not occur due to variations in components that constitute circuits, and temperature characteristic. In addition, deterioration in sound quality does not occur when the audio signal passes through each of the circuits. Further, even if the accuracy of each filter that constitutes the same circuit is improved, size of circuits is not made large and manufacturing cost is not increased, in a manner different from that of an apparatus constituted by analog circuits.

Further, according to the audio signal band extending apparatus and the method thereof according to the present invention, before the bandpass filtering processing and the final adding processing are executed, the oversampling processing and a low-pass filtering processing are executed. Accordingly, the lower-order analog low-pass filter can be provided at the previous stage of the A/D converter, and this leads to extremely large reduction in the phase distortion and the noise accompanied by the filtering processing. In addition, the quantized noise can be reduced, and_conversion at a low quantization bit rate can be easily performed. Further, a higher-order higher harmonic wave component of the inputted signal X can be generated in advance and used, and therefore a higher-order higher harmonic wave component can be easily generated.

Still further, according to the audio signal band extending apparatus and the method thereof according to the present invention, the oversampling processing is inserted between the level correlated white noise generating processing and the signal processing, and executed. In addition, before the final adding processing is executed, the oversampling processing and the low-pass filtering processing are executed on the inputted signal. Accordingly, it is possible to set a signal rate to a higher signal rate in the circuits provided at the subsequent stage of the oversampling type low-pass filter and the oversampling circuit. In other words, it is possible to set signal rates of circuits provided at the previous stage of the oversampling type low-pass filter and the oversampling circuit to lower signal rates, and this leads to simplification of the circuit configuration.

In addition, the optical disk system according to the present invention can reproduce an audio signal stored in an optical disk, extends a band of a reproduced audio signal, and output a band-extended audio signal. Accordingly, it is possible to easily generate a signal having an extended audio band based on the audio signal stored in the optical disk as compared with the prior.

Further, according to the program according to the present invention, there can be provided a program that includes the respective steps of the above-mentioned audio signal band extending method.

Still further, according to the computer readable recording medium according to the present invention, there can be provided a recording medium that stores the program including the respective steps of the above-mentioned audio signal band extending method.

DETAILED DESCRIPTION OF THE INVENTION

Preferred embodiments according the present invention will be described below with reference to the drawings. In the attached drawings, components similar to each other are denoted by the same numerical references, respectively, and will not be repeatedly described in detail.

First Preferred Embodiment

Figure 1:
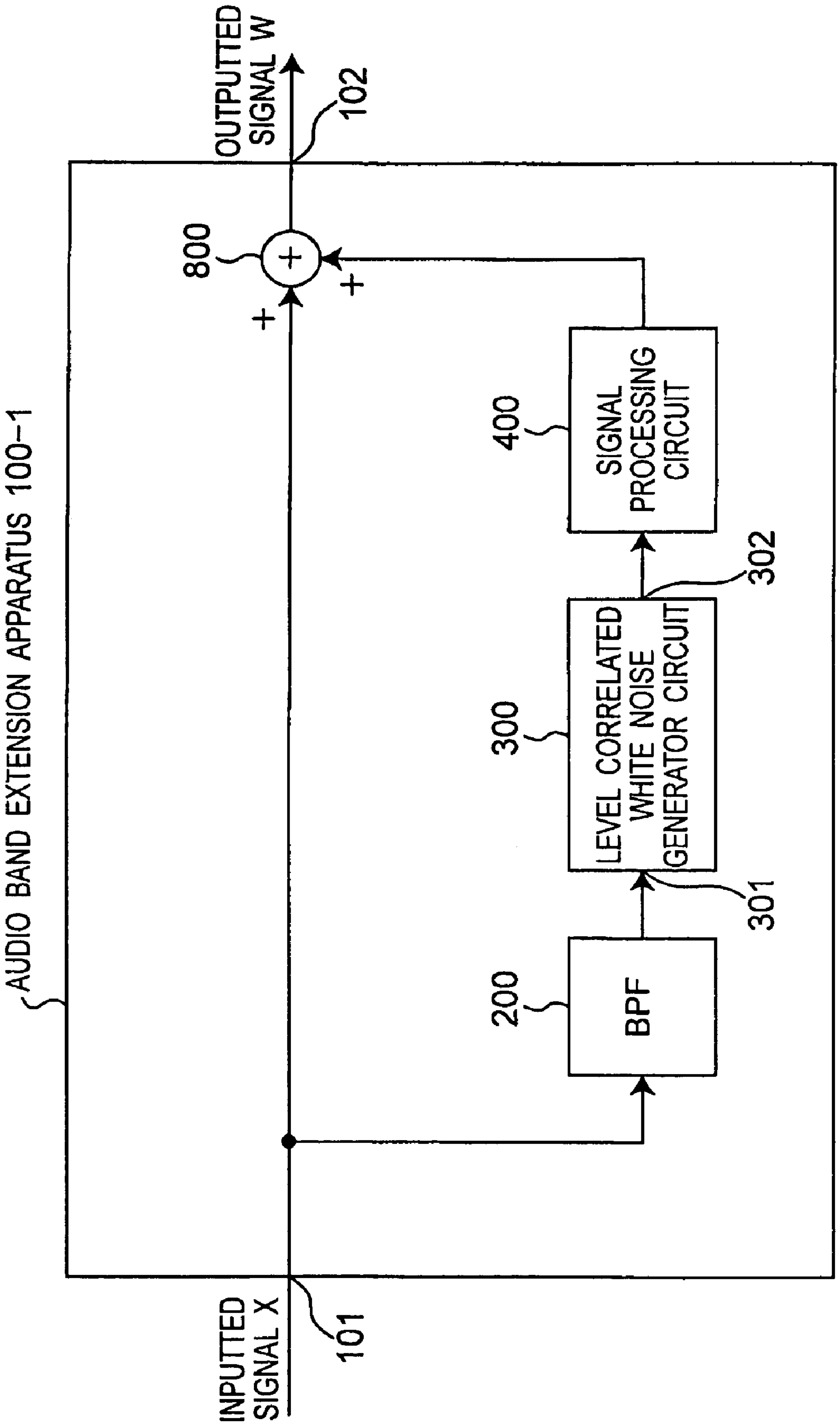
FIG. 1 is a block diagram showing a configuration of an audio signal band extending apparatus 100-1 according to a first preferred embodiment of the present invention.

FIG. 1 is a block diagram showing a configuration of an audio signal band extending apparatus 100-1 according to a first preferred embodiment of the present invention. As shown in FIG. 1, the audio signal band extending apparatus 100-1 according to the first preferred embodiment is an analog signal processing circuit that is inserted between an input terminal 101 and an output terminal 102, and constructed by including a bandpass filter (BPF) 200, a level correlated white noise generator circuit 300, a signal processing circuit 400, and an adder 800.

Referring to FIG. 1, an analog audio signal (referred to as an inputted signal hereinafter) X is inputted to the bandpass filter 200 and the adder 800 via the input terminal 101. The inputted signal X is such a signal that is reproduced from a compact disk (CD) or such a signal that has, for example, a band from 20 Hz to 20 kHz. The bandpass filter 200 bandpass-filters the inputted signal X to pass therethrough a part of a band (referred to as a partial band hereinafter, which is a higher band of the inputted signal from, for example, 10 kHz to 20 kHz or from 5 kHz to 15 kHz in another example)

of the inputted signal X, and outputs a resultant signal to the level correlated white noise generator circuit 300. Next, the level correlated white noise generator circuit 300 generates a white noise signal having a level changing according to a level of an audio signal in the partial band inputted via an input terminal 301 thereof, that is, having a level-correlated level, and outputs the white noise signal to the signal processing circuit 400 via an output terminal 302 thereof. Further, the signal processing circuit 400 executes such a signal processing that includes predetermined bandpass filtering processing, echo adding processing, and level adjusting processing on an inputted white noise signal, so to speak a processing for multiplying the inputted white noise signal by a predetermined transfer function, and thereafter outputs a processed white noise signal to the adder 800. Finally, the adder 800 adds the white noise signal from the signal processing circuit 400 to the inputted signal X, and outputs a band-extended signal having an addition result, as an outputted signal W.

The processings executed by the signal processing circuit 400 will be described later in detail with reference to FIG. 25. In this case, preferably, a lower limit frequency of a passing band for the bandpass filtering processing executed by the signal processing circuit 400 is substantially the same as a maximum frequency of the inputted signal X so that levels of two signals on which the addition processing is executed by the adder 800 substantially coincide with each other at the lower limit frequency, and so that the spectral continuity thereof can be kept. In addition, a higher limit frequency of the passing band for the bandpass filtering processing executed by the signal processing circuit 400 is preferably set to be equal to or higher than a twofold or fourfold of the maximum frequency of the inputted signal X. Further, when the bandpass filter 200 has such a bandpass characteristic that an upper limit frequency of the bandpass filter 200 is the same as a Nyquist frequency, for example, when the bandpass filter 200 has a passing band from 10 kHz to 20 kHz, the bandpass filter 200 may be replaced by a high-pass filter for passing therethrough a signal at a frequency equal to or higher than 10 kHz.

The audio signal band extending apparatus 100-1 configured as stated above does not need any level detections and easily generates an audio signal having an extended audio band. In addition, an obtained band-extended signal has a level changing according to a level of an original sound of the inputted signal X, correlates with the level of the original sound of the inputted signal X, changes according to the level of the original sound of the inputted signal X, and keeps its spectral continuity. Accordingly, the audio signal band extending apparatus 100-1 method exhibits such an advantageous effect that a higher frequency component of the band-extended signal sounds not artificial but natural relative to the original sound.

In the above-stated preferred embodiment, the audio signal band extending apparatus 100-1 includes the bandpass filter 200. However, the present invention is not limited to this, and the apparatus 100-1 does not necessarily include the bandpass filter 200. In this case, the level correlated white noise generator circuit 300 generates a white noise signal level-correlated so that a level of the level-correlated noise signal changes according to that of the inputted signal X.

Second Preferred Embodiment

Figure 2:
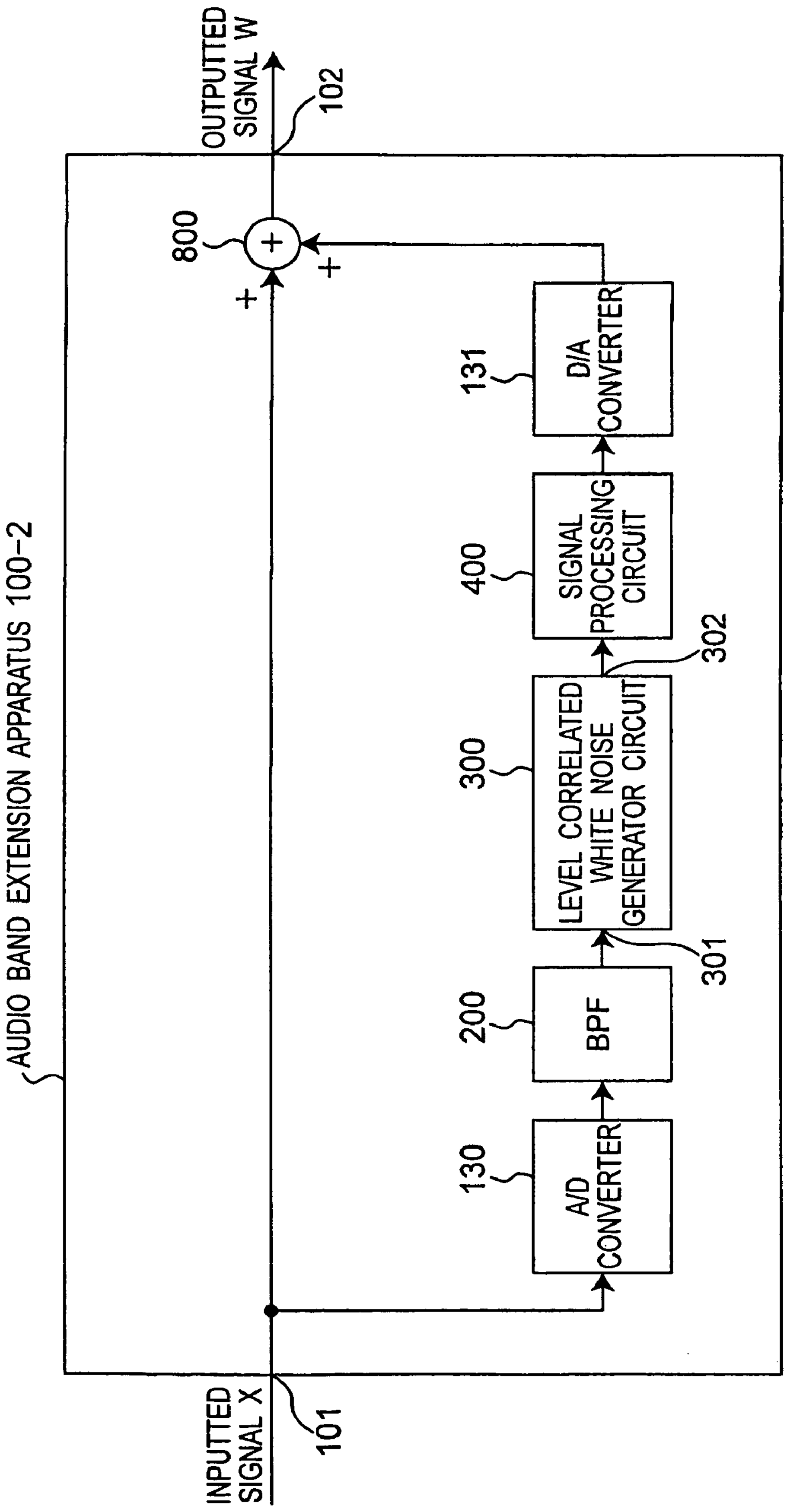
FIG. 2 is a block diagram showing a configuration of an audio signal band extending apparatus 100-2 according to a second preferred embodiment of the present invention.

FIG. 2 is a block diagram showing a configuration of an audio signal band extending apparatus 100-2 according to a second preferred embodiment of the present invention. The audio signal band extending apparatus 100-2 according to the second preferred embodiment is characterized, as compared with the audio signal band extending apparatus 100-1 shown in FIG. 1, by inserting an A/D converter 130 at the previous stage of a bandpass filter 200 and inserting a D/A converter 131 at the subsequent stage of the signal processing circuit 400 so that the respective processings of the bandpass filter (BPF) 200, the level correlated white noise generator circuit 300, and the signal processing circuit 400 are executed as digital signal processings instead of analog signal processing. Differences between the present preferred embodiment and the first preferred embodiment will be described in detail hereinafter.

Referring to FIG. 2, the inputted signal X is converted into a signal which has, for example, a sampling frequency fs of 44.1 kHz and a word length of 16 bits, by the A/D converter 130. In addition, the D/A converter 131 converts an outputted signal from the signal processing circuit 400 into an analog audio signal, and outputs the analog audio signal to the adder 800. Finally, the adder 800 adds the inputted signal, which is an analog audio signal, to a D/A converted band-extended signal, and outputs an audio signal having an addition result.

The audio signal band extending apparatus 100-2 configured as stated above exhibits not only the functions and advantageous effects according to the audio signal band extending apparatus 100-1 shown in FIG. 1, but also such a unique advantageous effect, that by executing the respective processings of the bandpass filter (BPF) 200, the level correlated white noise generator circuit 300, and the signal processing circuit 400 by digital signal processings, the respective processings can be designated and executed by software using a digital signal processor (referred to as a DSP hereinafter) or the like, and a configuration of a hardware can be simplified as compared with the prior art. In addition, in this case, by changing the software, contents of the processing executed by the digital signal processings can be easily changed.

Third Preferred Embodiment

Figure 3:
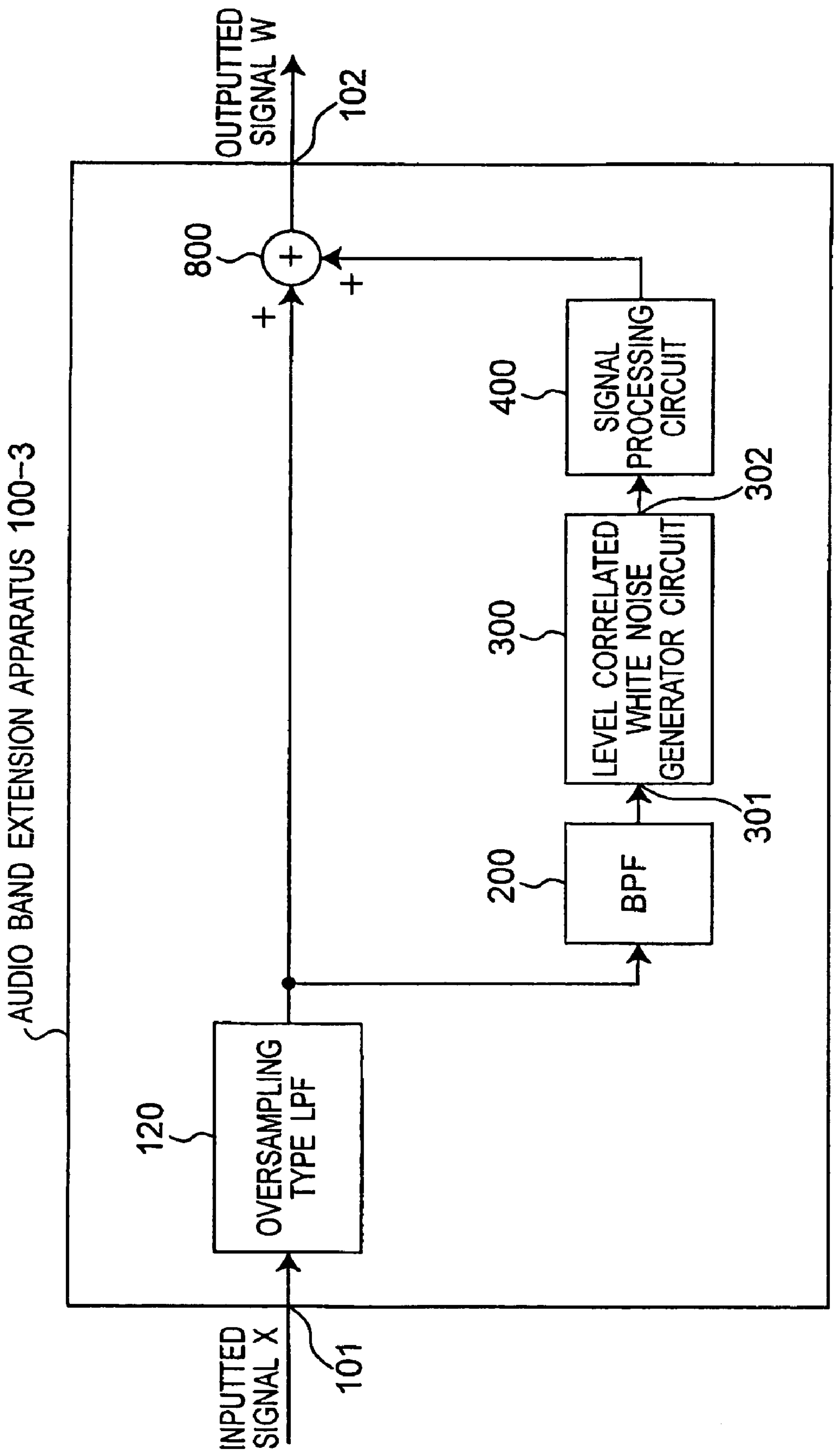
FIG. 3 is a block diagram showing a configuration of an audio signal band extending apparatus 100-3 according to a third preferred embodiment of the present invention.

FIG. 3 is a block diagram showing a configuration of an audio signal band extending apparatus 100-3 according to a third preferred embodiment of the present invention. The audio signal band extending apparatus 100-3 according to the third preferred embodiment is different from the audio signal band extending apparatus 100-1 shown in FIG. 1 in the following points:

(1) The inputted signal X and outputted signal W are digital audio signals;

(2) Processings in the audio signal band extending apparatus 100-3 are all executed by digital signal processings; and (3) At the prior stage of the bandpass filter (BPF) 200 and the adder 800, an oversampling type low-pass filter (LPF) 120 is inserted.

The differences will be described in detail hereinafter.

Figure 5:
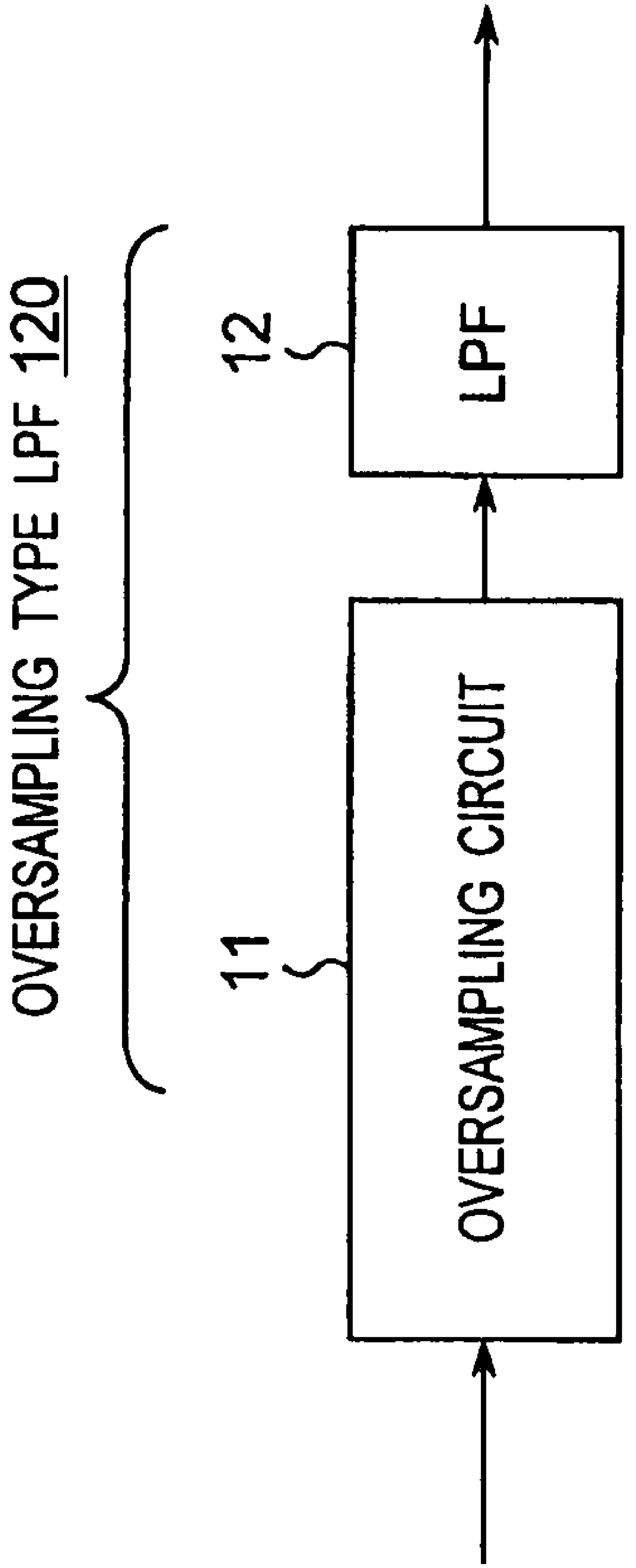
FIG. 5 is a block diagram showing a configuration of an oversampling type low-pass filter (LPF) 120 shown in FIGS. 3 and 4.

Referring to FIG. 3, the inputted signal X that is the digital audio signal is inputted to the oversampling type LPF 120 via the input terminal 101. This digital audio signal is reproduced from, for example, a compact disk (CD), and in this case, the digital audio signal has a sampling frequency fs of 44.1 kHz and a word length of 16 bits. As shown in FIG. 5, the oversampling type LPF 120 is constructed by including an oversampling circuit 11 and a digital low-pass filter (LPF) 12. The oversampling type LPF 120 is such a digital filter circuit that multiplies a sampling frequency fs of the digital audio signal inputted via the input terminal 101 by "p" (where "p" is a positive integer equal to or larger than 2), and attenuates a signal fallen within unnecessary band that extends from a frequency of fs/2 to a frequency of pfs/2 by 60 dB or larger.

Figure 6:
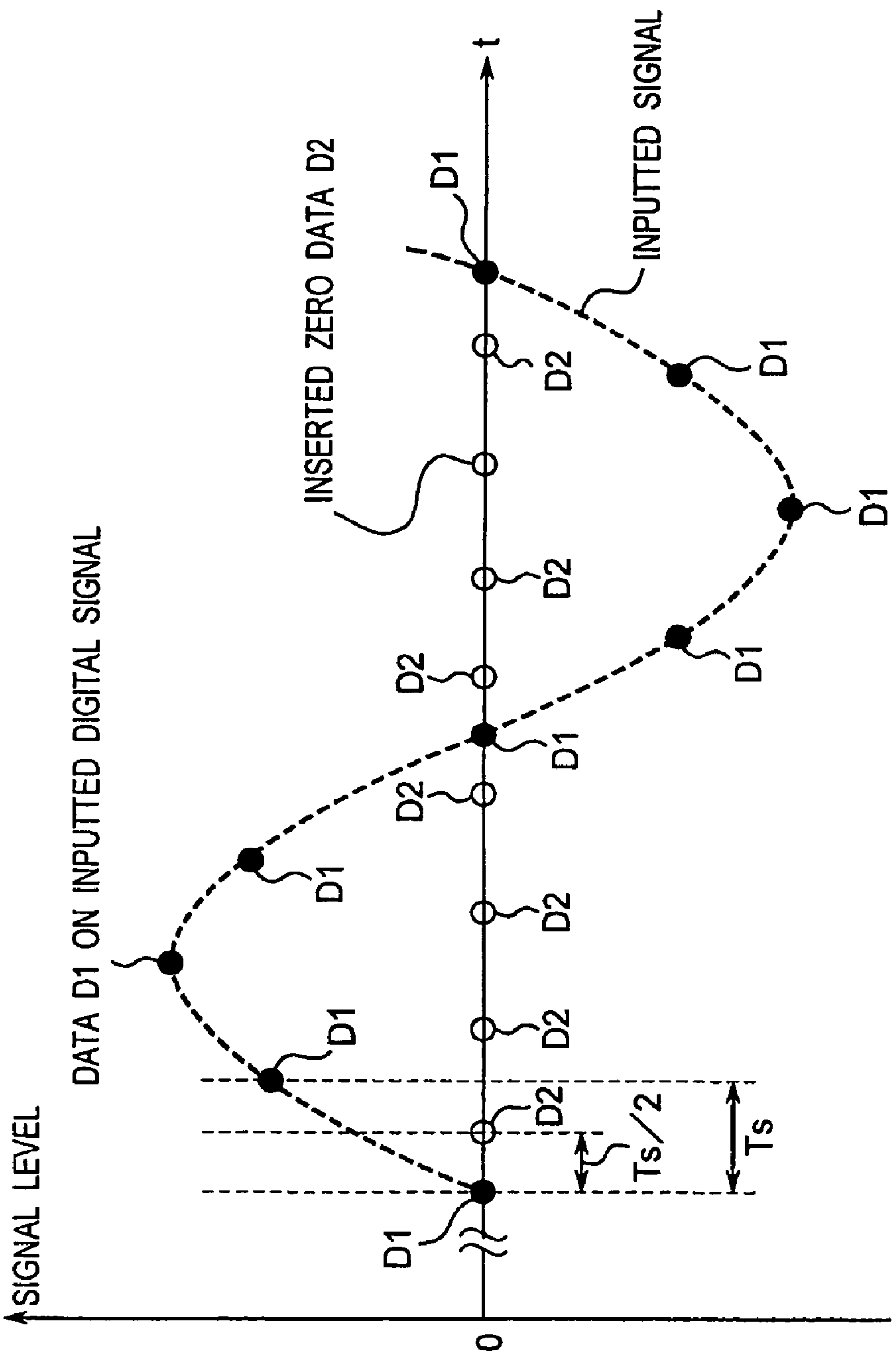
FIG. 6 is a signal waveform view showing an operation of an oversampling circuit 11 shown in FIG. 5.

When the "p" is, for example, 2, the digital audio signal having the sampling frequency fs (having a sampling cycle Ts=1/fs) is inputted to the oversampling circuit 11. As shown in FIG. 6, the oversampling circuit 11 executes an oversampling processing on data D1 of an inputted digital audio signal by inserting "zero" data D2 into intermediate positions (relative to time axis) of respective two D1 data adjacent to each other at the sampling cycle Ts so as to interpolates the data D1, and converts the inputted digital audio signal into a digital audio signal having a sampling frequency 2fs (having a sampling cycle Ts/2). Finally, the oversampling circuit 11 outputs a resultant digital audio signal to the digital low-pass filter 12. The digital low-pass filter 12 has the following:

(a) a passband that extends from frequency of 0 to 0.45fs;

(b) a stop band that extends from frequency of 0.45fs to fs; and (c) an attenuation amount of equal to or larger than 60 dB at a frequency equal to or higher than fs. The digital low-pass filter 12 limits a band of an inputted digital audio signal so as to remove an aliasing noise generated by the oversampling processing by low-pass filtering the inputted digital audio signal, and passes only an effective band (that extends from frequency of 0 to 0.45fs) which the inputted digital audio signal substantially has. Then, the digital low-pass filter 12 outputs a resultant signal to the adder 800 shown in FIG. 3 and the bandpass filter 200.

Further, the adder 800 adds an oversampled low-pass filtered digital audio signal and the low-pass filtering processing to a digital band-extended signal from the signal processing circuit 400, and outputs an audio signal having an addition result as the outputted signal W.

The audio signal band extending apparatus 100-3 configured as stated above exhibits not only the functions and advantageous effects according to the audio signal band extending apparatuses 100-1 and 100-2 shown in FIGS. 1 and 2, but also such a unique advantageous effect, that by executing all of the processings by digital signal processings, the respective processings can be designated and executed by software using a digital signal processor or the like, and a configuration of a hardware can be simplified as compared with the prior art. In addition, in this case, by changing the software, contents of the processing executed by the digital signal processings can be easily changed. Further, since the oversampling type low-pass filter 120 is employed to execute the oversampling processing and the low-pass filtering processing on the inputted signal X, the audio signal band extending apparatus 100-3 exhibits the following advantageous effects:

(1) A lower-order analog low-pass filter can be provided at the previous stage of the A/D converter, and this leads to extremely large reduction in the phase distortion and the noise accompanied by the filtering processing;

(2) A quantized noise can be reduced, and conversion at a low quantization bit rate can be easily performed; and (3) A higher-order higher harmonic wave component of the inputted signal X can be generated in advance and used, and therefore the higher-order higher harmonic wave component can be easily generated.

Fourth Preferred Embodiment

Figure 4:
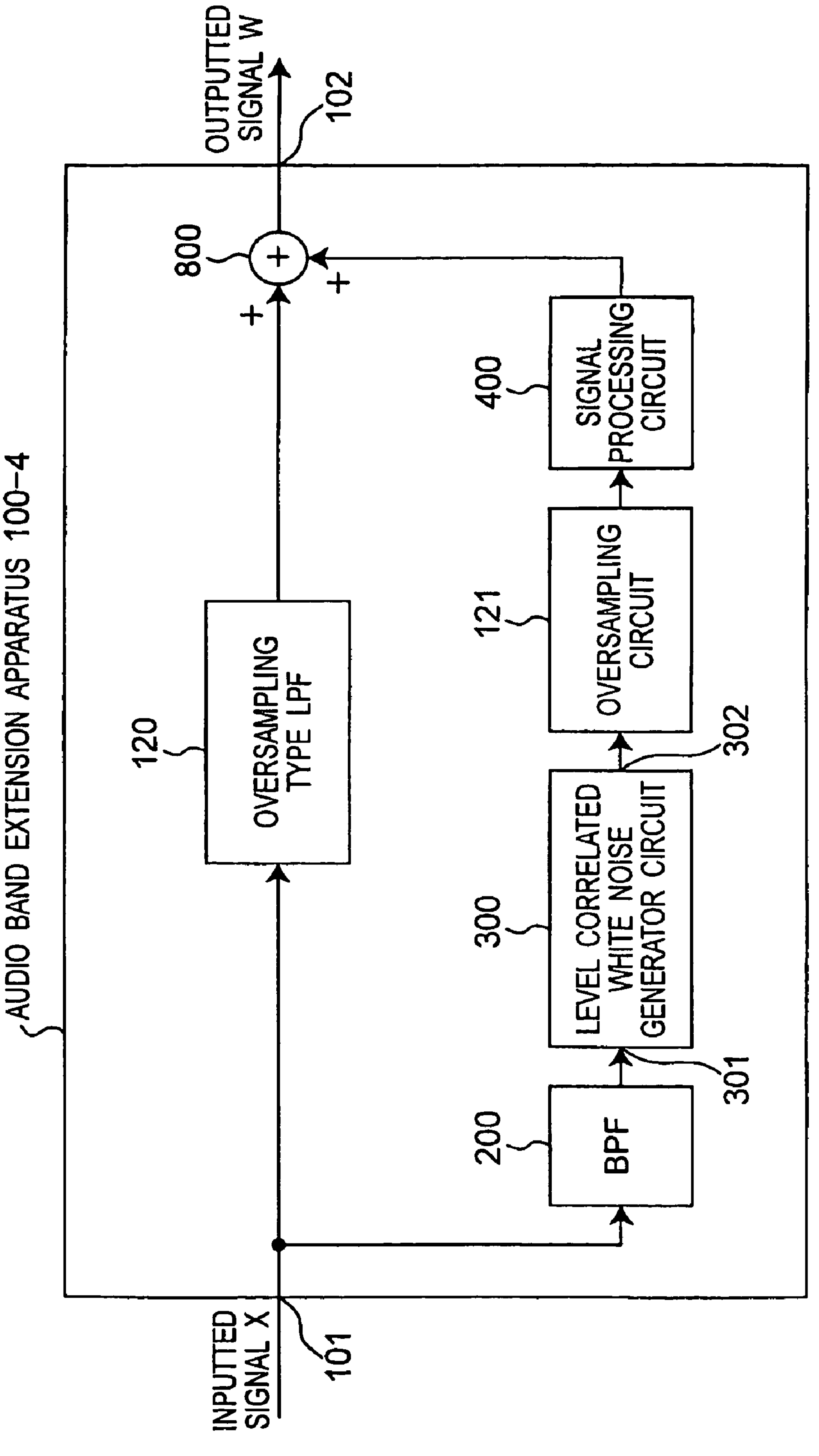
FIG. 4 is a block diagram showing a configuration of an audio signal band extending apparatus 100-4 according to a fourth preferred embodiment of the present invention.

FIG. 4 is a block diagram showing a configuration of an audio signal band extending apparatus 100-4 according to a fourth preferred embodiment of the present invention. The audio signal band extending apparatus 100-4 according to the fourth preferred embodiment is different from the audio signal band extending apparatus 100-3 shown in FIG. 3 in the following points:

(1) The oversampling type low-pass filter 120 is inserted between the input terminal 101 and the adder 800; and (2) An oversampling circuit 121 is inserted between the level correlated white noise generator circuit 300 and the signal processing circuit 400.

The differences will be described in detail hereinafter.

Referring to FIG. 4, the oversampling type low-pas filter 120 executes the oversampling processing and the low-pass filtering processing on the inputted signal X, and outputs a resultant signal to the adder 800. In addition, the oversampling circuit 121 executes an oversampling processing on the white noise signal outputted from the level correlated white noise generator circuit 300, and outputs a resultant signal to the signal processing circuit 400. Accordingly, it is possible to set signal rates of circuits provided at the subsequent stage of the oversampling type low-pass filter 120 and the oversampling circuit 121 to higher signal rates. In other words, In other words, signal rates of circuits provided at the previous stage of the oversampling type LPF 120 and the oversampling circuit 121 to lower signal rates, and this leads to simplification of the circuit configuration. The audio signal band extending apparatus 100-4 configured as stated above exhibits functions and advantageous effects similar to those according to the audio signal band extending apparatus 100-3 according to the third preferred embodiment.

FIRST IMPLEMENTAL EXAMPLE

Figure 7:
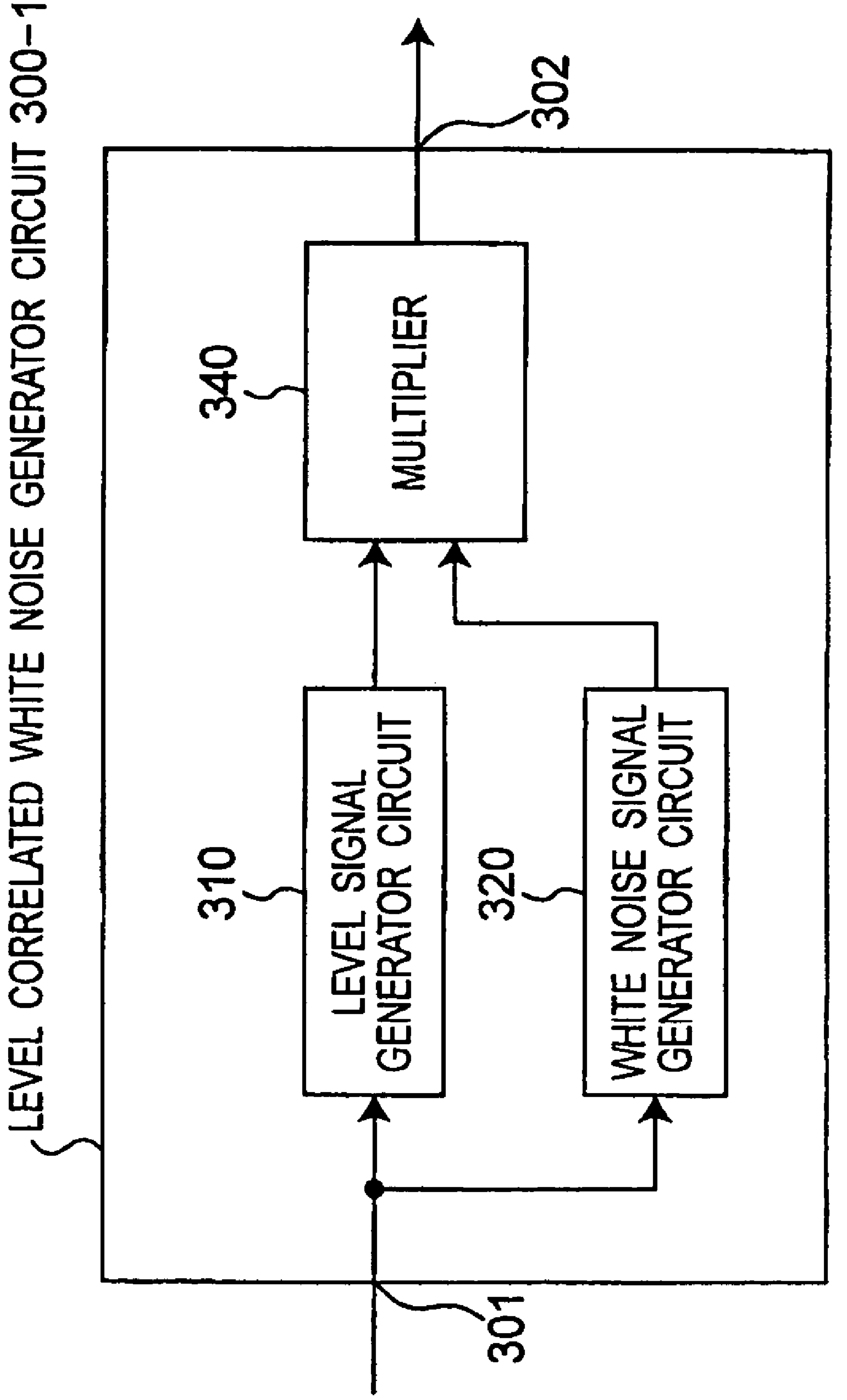
FIG. 7 is a block diagram showing a configuration of a level correlated white noise generator circuit 300-1 according to a first implemental example of a level correlated white noise generator circuit 300 shown in FIGS. 1 to 4.

FIG. 7 is a block diagram showing a configuration of a level correlated white noise generator circuit 300-1 according to a first implemental example of the level correlated white noise generator circuit 300 shown in FIGS. 1 to 4. Referring to FIG. 7, the level correlated white noise generator circuit 300-1 includes the input terminal 301 and output terminal 302, and is characterized by being constructed to include a level signal generator circuit 310, a white noise signal generator circuit 320, and a multiplier 340.

Referring to FIG. 7, an audio signal having a predetermined partial band is inputted to the level signal generator circuit 310 and the white noise signal generator circuit 320 via the input terminal 301. The level signal generator circuit 310 detects a level of an inputted audio signal, generates a level signal having a detected level, and outputs the level signal to the multiplier 340. A concrete example of the level signal generator circuit 310 is a higher-order bits cutting-out circuit 311 shown in FIGS. 9 to 12. Since higher-order bits of an inputted signal indicate a level of the inputted signal, a signal of bits outputted from the higher-order bits cutting-out circuit 311 indicates an approximate level of the inputted signal. The white noise signal generator circuit 320 is constructed by including, for example, a first-order delta sigma modulator type quantizer 20 shown in FIG. 8, generates a white noise signal having a substantially fixed level, which is not correlated to a level of an inputted signal, and outputs the white noise signal to the multiplier 340. Finally, the multiplier 340 multiplies an inputted white noise signal by an inputted level signal to generate a white noise signal, whose level is changed according to the level signal, and outputs the white noise signal via the output terminal 302.

Figure 8:
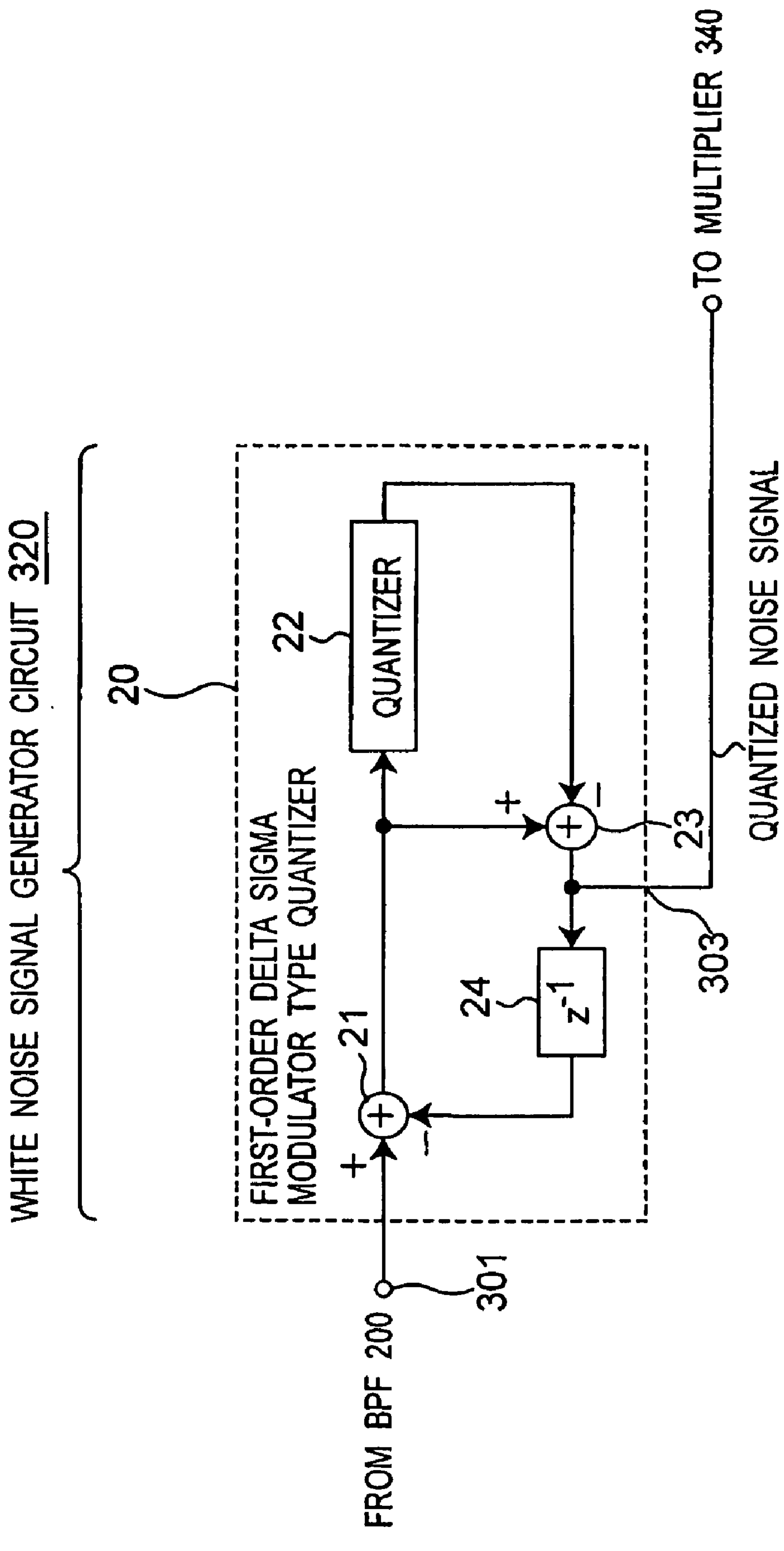
FIG. 8 is a block diagram showing a configuration of a white noise signal generator circuit 320 shown in FIG. 7.

FIG. 8 is a block diagram showing a configuration of the white noise signal generator circuit 320 shown in FIG. 7. Referring to FIG. 8, the white noise signal generator circuit 320 is constructed by the first-order delta sigma modulator type quantizer 20, and the quantizer 20 is constructed by including a subtracter 21, a quantizer 22 for quantization, a subtracter 23, and a delay circuit 24 for delaying a signal by one sample.

Referring to FIG. 8, an inputted signal from the bandpass filter 200 is outputted to the subtracter 21 via the input terminal 301. The subtracter 21 subtracts an audio signal from the delay circuit 24 from an audio signal from the bandpass filter 200, and outputs an audio signal having a subtraction result to the subtracter 21 via the delay circuit 24. The audio signal having the subtraction result outputted from the subtracter 23 is a quantized noise signal that indicates a quantized noise generated during the quantization. The quantized noise signal is outputted to the multiplier 340 via the output terminal 303. In the first-order delta sigma modulator type quantizer 20 configured as shown in FIG. 8, a modulated signal, which is first-order delta-sigma modulated, can be generated based on a digital audio signal from the oversampling type low-pass filter 120, that is, a noise signal that is a band signal generated based on the audio signal of the original sound can be generated.

In the white noise signal generator circuit 320 shown in FIG. 8, the first-order delta sigma modulator type quantizer 20 is employed. However, the present invention is not limited to this, and a plural-order delta-sigma modulator type quantizer may be employed. In addition, a sigma delta modulator type quantizer that that subjects an inputted audio signal to a sigma-delta modulation may be employed instead of the delta sigma modulator type quantizer.

SECOND IMPLEMENTAL EXAMPLE

Figure 9:
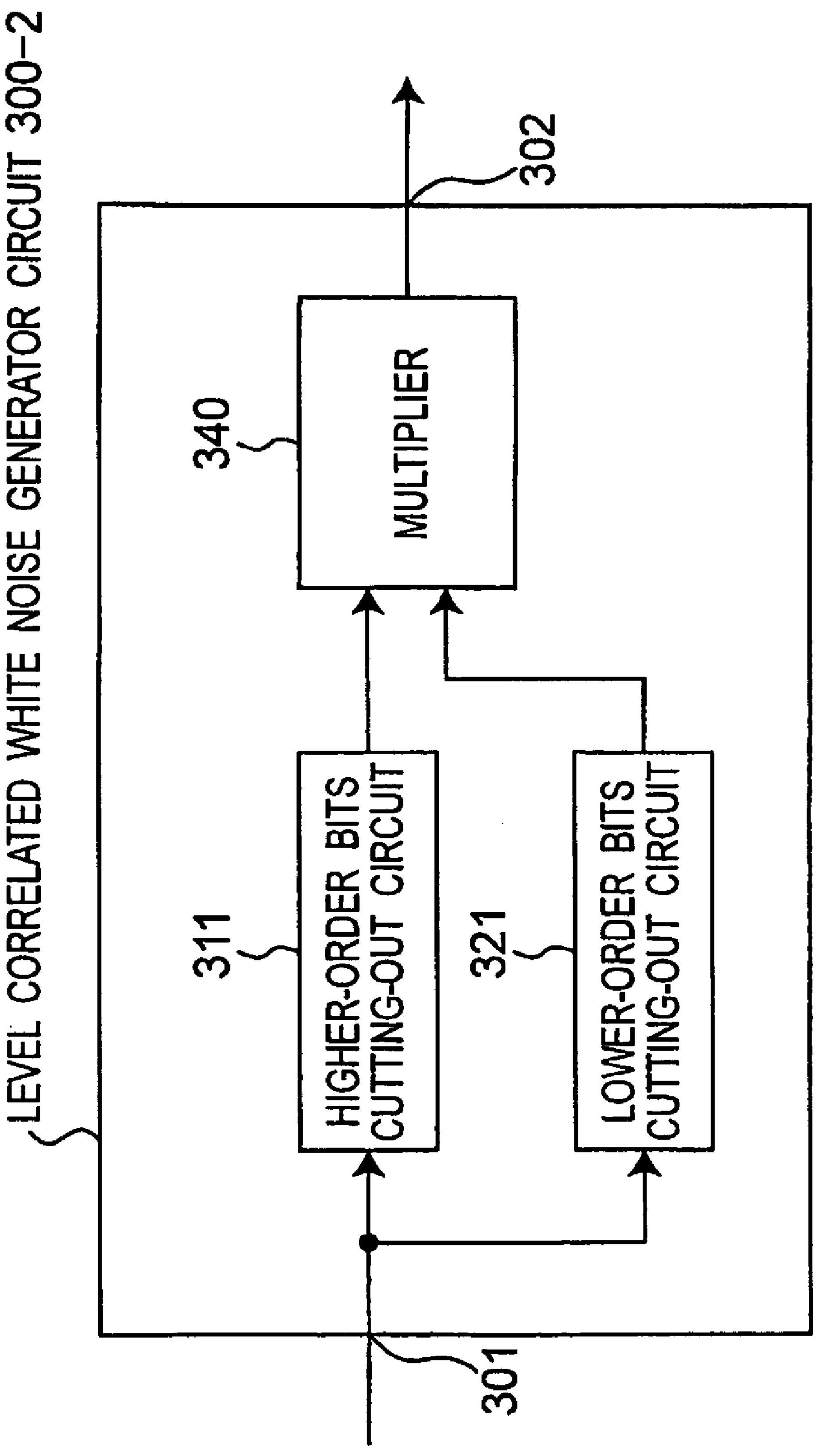
FIG. 9 is a block diagram showing a configuration of a level correlated white noise generator circuit 300-2 according to a second implemental example of the level correlated white noise generator circuit 300 shown in FIGS. 1 to 4.
Figure 16A:
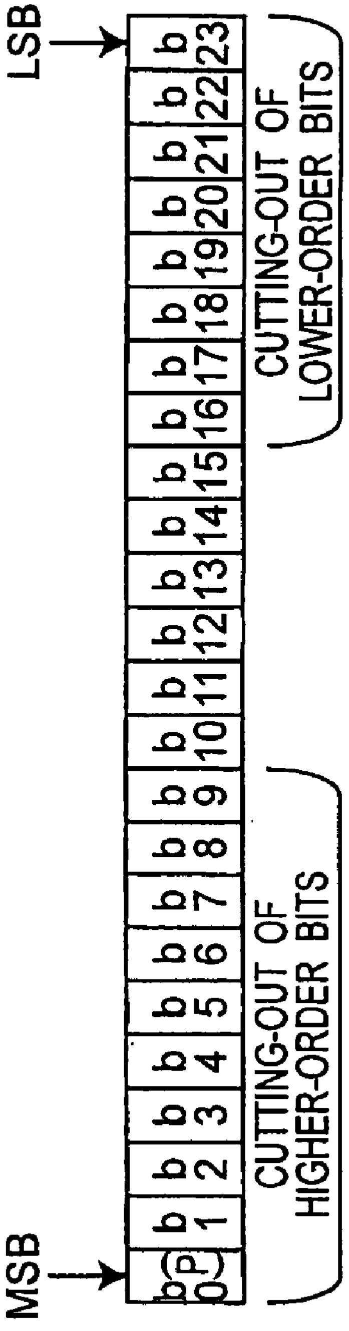
FIG. 16A is a bit arrangement view showing locations of bits to be_cut out for the level correlated white noise generator circuits 300-2, 300-5, and 300-6 shown in FIG. 9.
Figure 16B:
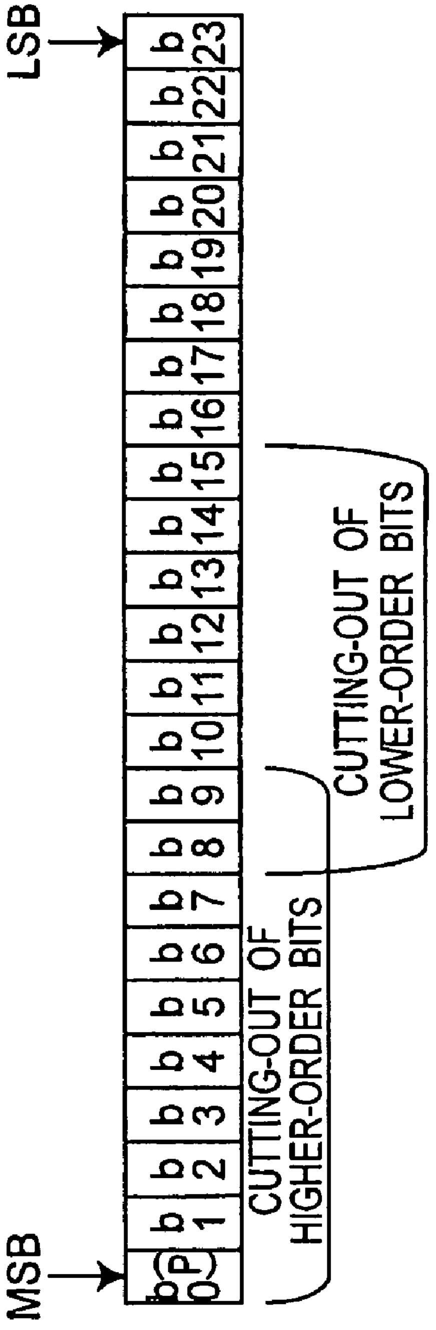
FIG. 16B is a bit arrangement view showing a modified example of locations of bits to be cut out for the level correlated white noise generator circuits 300-2, 300-5, and 300-6 shown in FIG. 9.

FIG. 9 is a block diagram showing a configuration of a level correlated white noise generator circuit 300-2 according to a second implemental example of the level correlated white noise generator circuit 300 shown in FIGS. 1 to 4. Referring to FIG. 9, the level correlated white noise generator circuit 300-2 includes the input terminal 301 and output terminal 302, and is constructed by including the higher-order bits cutting-out circuit 311, a lower-order bits cutting-out circuit 321, and the multiplier 340. In this case, the higher-order bits cutting-out circuit 311 cuts out, for example, ten higher-order bits (b0-b9) out of an inputted signal inputted via the input terminal 301 as shown in FIG. 16A or 16B, and outputs a signal of the ten bits to the multiplier 340 as a level detection signal. In this case, a most significant bit b0 is a sign bit "P". In addition, the lower-order bits cutting-out circuit 321 cuts out, for example, eight lowest-order bits (b16-b23) as shown in FIG. 16A, or cuts out, for example, predetermined lower-order bits (b8-b15) lower than the above-stated higher-order bits as shown in FIG. 16B out of the inputted signal inputted via the input terminal 301. Then, the lower-order bits cutting-out circuit 321 generates a signal of the eight bits as a white noise signal that correlates to the inputted signal but that is changed at random, and outputs the signal of the eight bits to the multiplier 340. Finally, the multiplier 340 multiplies an inputted white noise signal by an inputted level signal to generate a white noise signal whose level is changed according to the level signal and outputs the white noise signal via the output terminal 302.

In the case shown in FIG. 16B, in such a case where lower-order bits, that are lower than a predetermined word length, of the inputted signal X are rounded so that data of the lower-order bits becomes fixed data, and bits in an intermediate part included within a range of the effective word length are cut out by a predetermined bit width.

THIRD IMPLEMENTAL EXAMPLE

Figure 10:
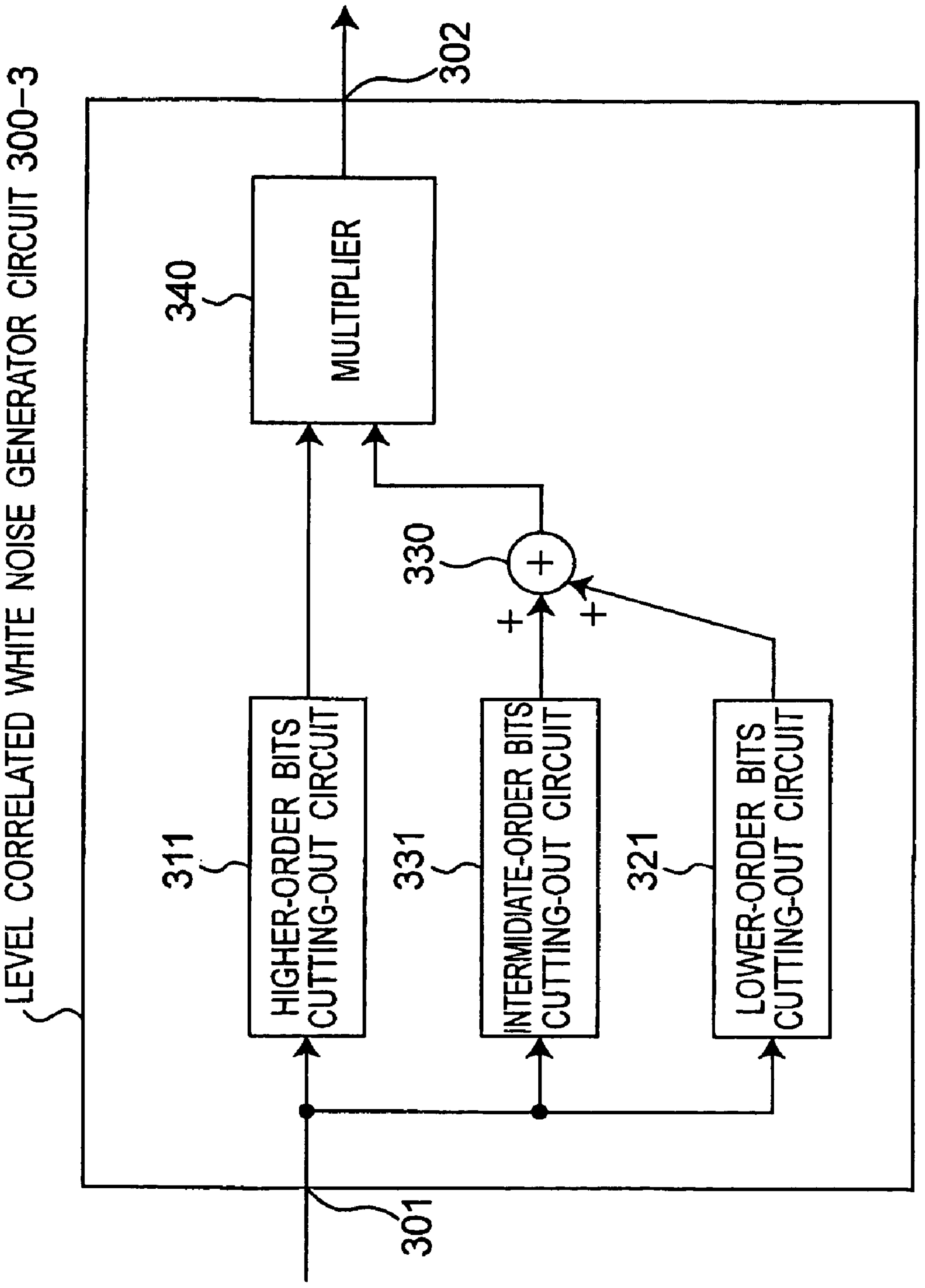
FIG. 10 is a block diagram showing a configuration of a level correlated white noise generator circuit 300-3 according to a third implemental example of the level correlated white noise generator circuit 300 shown in FIGS. 1 to 4.
Figure 17A:
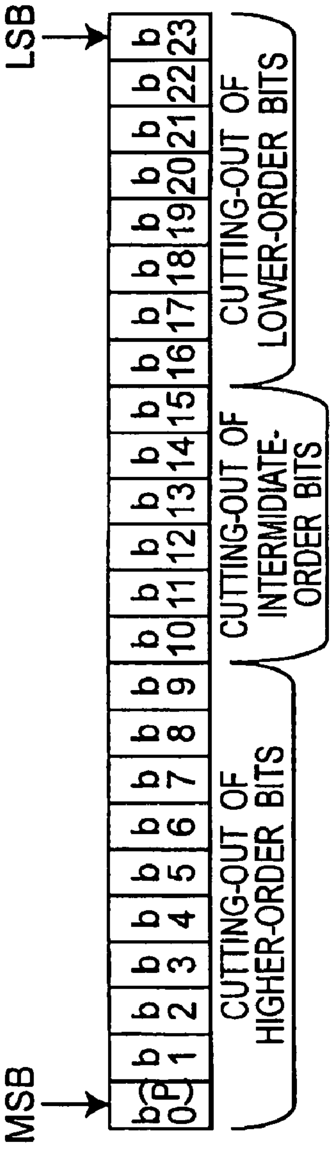
FIG. 17A is a bit arrangement view showing locations of bits to be cut out for the level correlated white noise generator circuit 300-3 shown in FIG. 10.

FIG. 10 is a block diagram showing a configuration of a level correlated white noise generator circuit 300-3 according to a third implemental example of the level correlated white noise generator circuit 300 shown in FIGS. 1 to 4. Referring to FIG. 10, the level correlated white noise generator circuit 300-3 includes the input terminal 301 and the terminal 302, and is constructed by including the higher-order bits cutting-out circuit 311, an intermediate-order bits cutting-out circuit 331, the lower-order bits cutting-out circuit 321, and the multiplier 340. In this case, the higher-order bits cutting-out circuit 311 cuts out, for example, the ten higher-order bits (b0-b9) out of the inputted signal inputted via the input terminal 301 as shown in FIG. 17A, and outputs the signal of the ten bits to the multiplier 340 as the level detection signal. In addition, the intermediate-order bits cutting-out circuit 331 cuts out, for example, six intermediate-order bits (b10-b15) out of the inputted signal inputted via the input terminal 301 as shown in FIG. 17A. Then, intermediate-order bits cutting-out circuit 331 generates a signal of the six bits as a white noise signal that correlates to the inputted signal but that is changed at random, and outputs the signal of the six bits to the multiplier 340 via an adder 330. Further, the lower-order bits cutting-out circuit 321 cuts out, for example, eight intermediate-order bits (b16-b23) out of the inputted signal inputted via the input terminal 301 as shown in FIG. 17A. Then, the lower-order bits cutting-out circuit 321 generates a signal of the eight bits as a white noise signal that correlates to the inputted signal but that is changed at random, and outputs the signal of the eight bits to the multiplier 340 via the adder 330. Finally, the multiplier 340 multiplies two inputted white noise signals by the inputted level signal to generate a white noise signal whose level is changed according to the level signal and outputs the white noise signal via the output terminal 302.

FOURTH IMPLEMENTAL EXAMPLE

Figure 11:
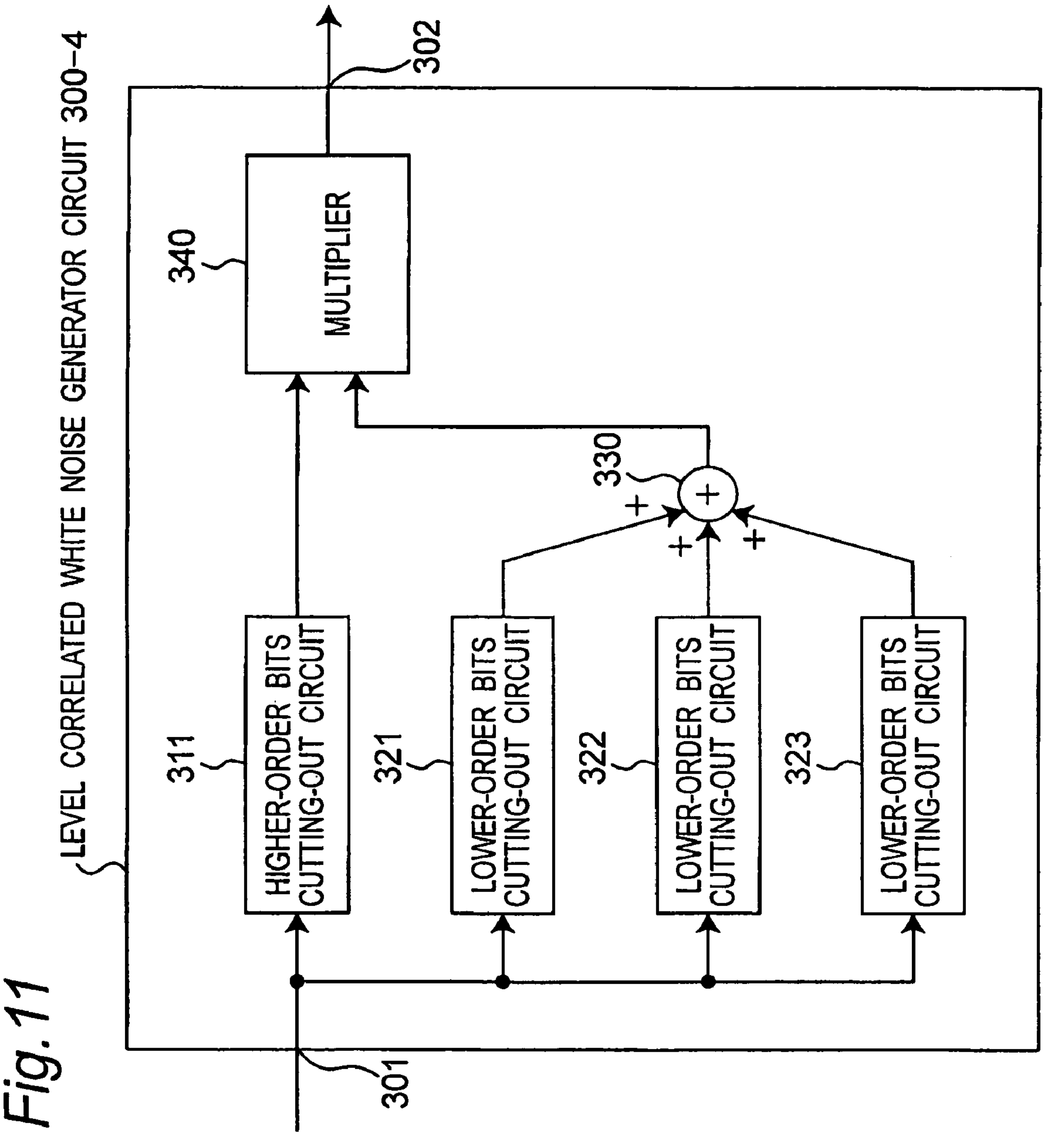
FIG. 11 is a block diagram showing a configuration of a level correlated white noise generator circuit 300-4 according to a fourth implemental example of the level correlated white noise generator circuit 300 shown in FIGS. 1 to 4.
Figure 17B:
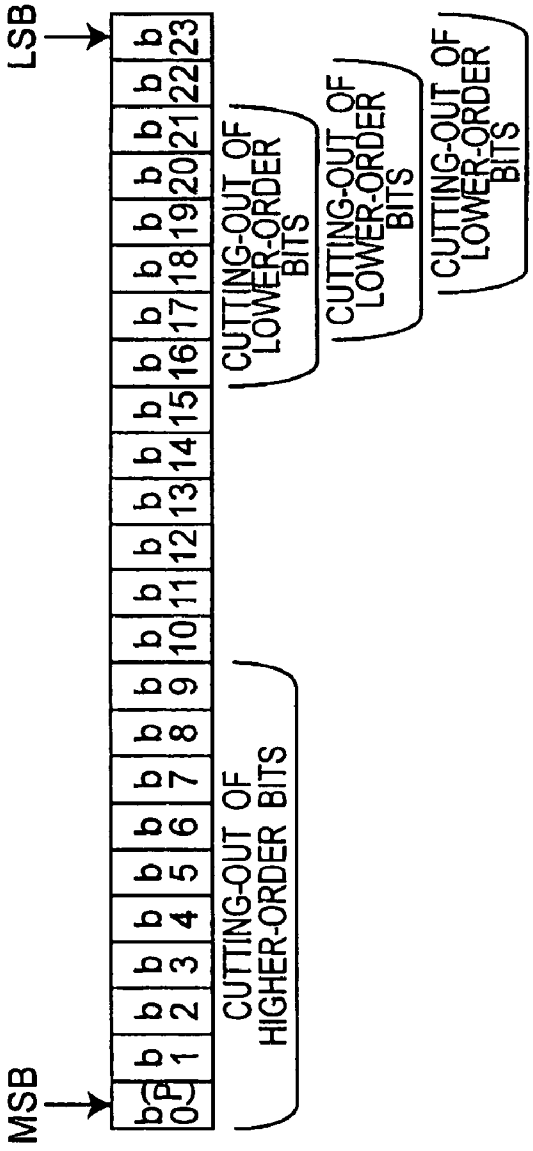
FIG. 17B is a bit arrangement view showing locations of bits to be cut out for the level correlated white noise generator circuit 300-4 shown in FIG. 11.

FIG. 11 is a block diagram showing a configuration of a level correlated white noise generator circuit 300-4 according to a fourth implemental example of the level correlated white noise generator circuit 300 shown in FIGS. 1 to 4. Referring to FIG. 11, the level correlated white noise generator circuit 300-4 includes the input terminal 301 and output terminal 302, and is constructed by including the higher-order bits cutting-out circuit 311, three lower-order bits cutting-out circuits 321, 322, and 323, and the multiplier 340. In this case, the higher-order bits cutting-out circuit 311 cuts out, for example, the ten higher-order bits (b0-b9) out of the inputted signal inputted via the input terminal 301 as shown in FIG. 17B, and outputs the signal of the ten bits to the multiplier 340 as the level detection signal. In addition, the lower-order bits cutting-out circuit 321 cuts out, for example, six intermediate-order bits (b16-b21) out of the inputted signal inputted via the input terminal 301 as shown in FIG. 17B. Then, the lower-order bits cutting-out circuit 321 generates a signal of the six bits as a white noise signal that correlates to the inputted signal but that is changed at random, and outputs the signal of the six bits to the multiplier 340 via the adder 330. Further, the lower-order bits cutting-out circuit 322 cuts out, for example, six intermediate-order bits (b17-b22) out of the inputted signal inputted via the input terminal 301 as shown in FIG. 17B. Then, the lower-order bits cutting-out circuit 322 generates a signal of the six bits as a white noise signal that correlates to the inputted signal but that is changed at random, and outputs the signal of the six bits to the multiplier 340 via the adder 330. Still further, the lower-order bits cutting-out circuit 323 cuts out, for example, six intermediate-order bits (b18-b23) out of the inputted signal inputted via the input terminal 301 as shown in FIG. 17B. Then, the lower-order bits cutting-out circuit 321 generates a signal of the six bits as a white noise signal that correlates to the inputted signal but that is changed at random, and outputs the signal of the six bits to the multiplier 340 via the adder 330. Finally, the multiplier 340 multiplies three inputted white noise signals by the inputted level signal to generate a white noise signal whose level is changed according to the level signal and outputs the white noise signal via the output terminal 302.

FIFTH IMPLEMENTAL EXAMPLE

Figure 12:
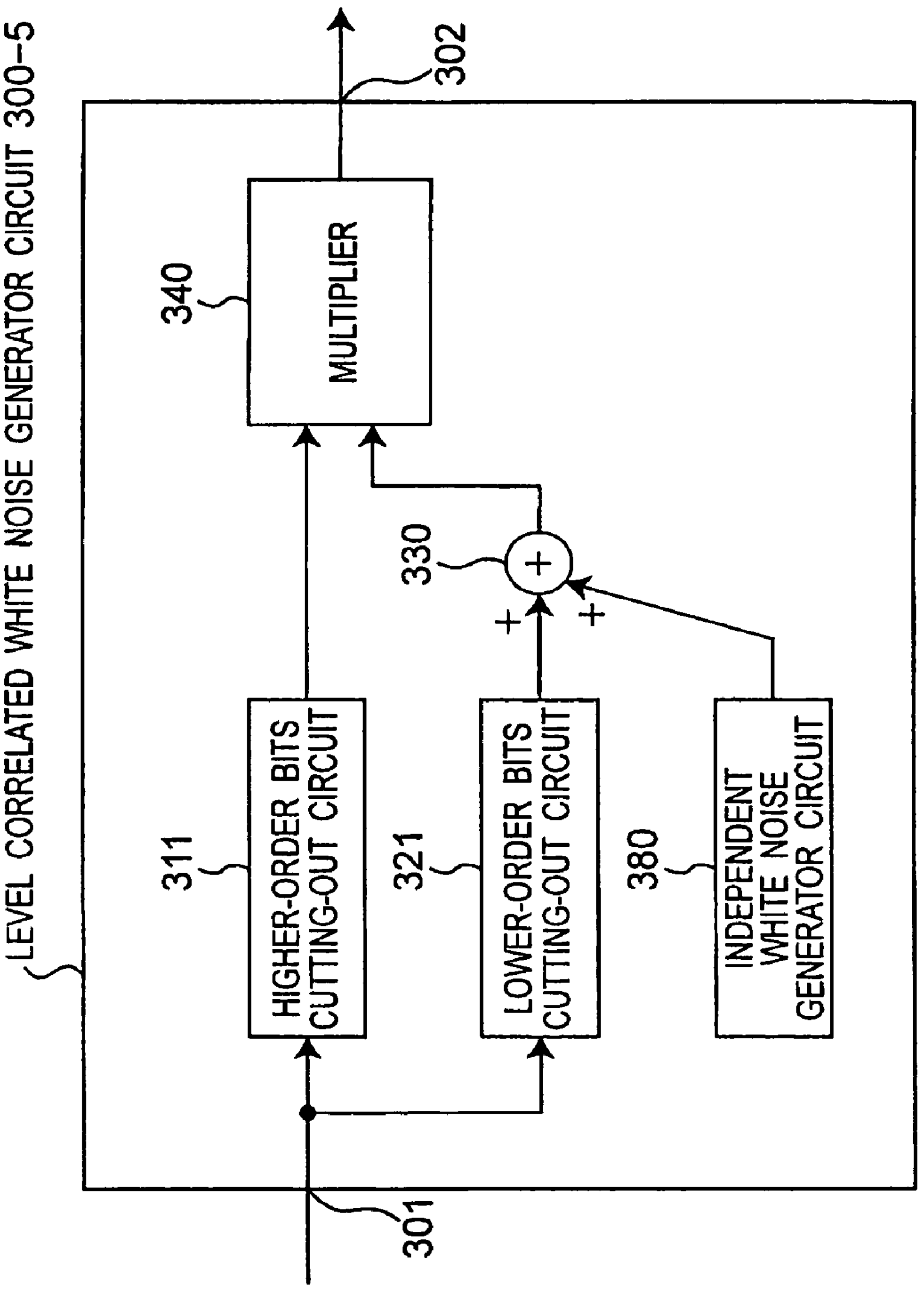
FIG. 12 is a block diagram showing a configuration of a level correlated white noise generator circuit 300-5 according to a fifth implemental example of the level correlated white noise generator circuit 300 shown in FIGS. 1 to 4.

FIG. 12 is a block diagram showing a configuration of a level correlated white noise generator circuit 300-5 according to a fifth implemental example of the level correlated white noise generator circuit 300 shown in FIGS. 1 to 4. Referring to FIG. 12, the level correlated white noise generator circuit 300-5 includes the input terminal 301 and output terminal 302, and is constructed by including the higher-order bits cutting-out circuit 311, the lower-order bits cutting-out circuit 321, an independent white noise generator circuit 380, an adder 330, and the multiplier 340. Accordingly, the level correlated white noise generator circuit 300-5 is characterized by further including the independent white noise generator circuit 380 and the adder 330, as compared with the level correlated white noise generator circuit 300-2 shown in FIG. 9. The differences will be described in detail hereinafter.

Figure 13:
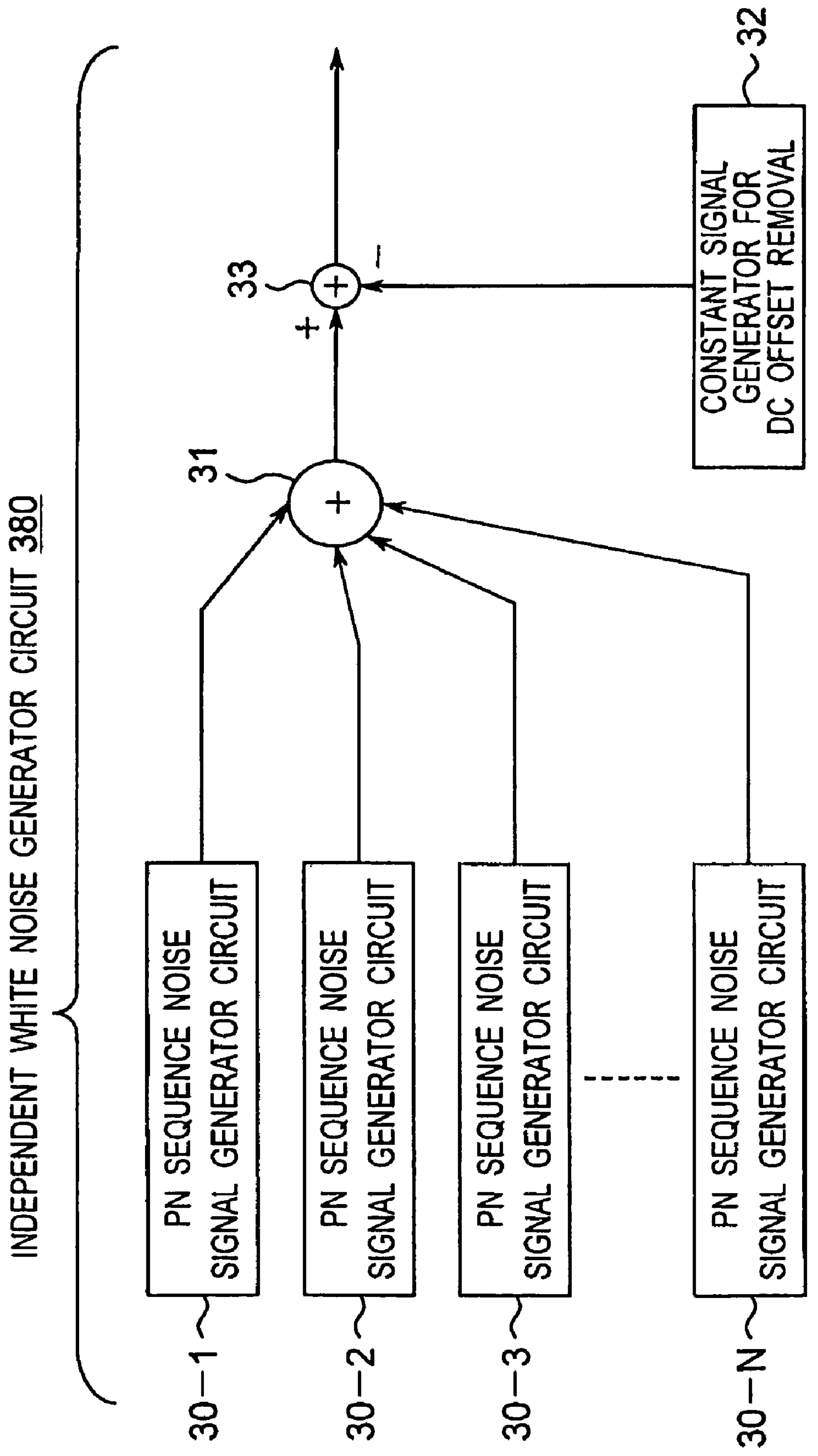
FIG. 13 is a block diagram showing a configuration of an independent white noise generator circuit 380 shown in FIG. 11.

FIG. 13 is a block diagram showing a configuration of the independent white noise generator circuit 380 shown in FIG. 11. Referring to FIG. 13, the independent white noise generator circuit 380 is constructed by including a plurality of “N” PN sequence noise signal generator circuits 30-n (n=1, 2, . . . , N), an adder 31, a constant signal generator for DC offset removal 32, and a subtracter 33, and characterized by generating a noise signal which is independent of the inputted signal X. In this case, the PN sequence is an abbreviation of a pseudo noise sequence. Respective PN sequence noise signal generator circuits 30-n have independent initial values, generate pseudo noise (PN) signals having uniformly random amplitude levels, for example, M sequence noise signals, and output generated PN signals to the adder 31. Next, the adder 31 adds up a plurality of “N” PN signals outputted from the respective PN sequence noise signal generator circuits 30-1 to 30-N so as to obtain a PN signal, and outputs the PN signal having an addition result to the subtracter 33. On the other hand, the constant signal generator for DC offset removal 32 generates a constant signal for DC offset removal, which has a sum of time averaged values of the PN signals from a plurality of “N” PN sequence noise signal generator circuits 30-1 to 30-N, and outputs a generated signal to the subtracter 33. Then, the subtracter 33 subtracts the constant signal for DC offset removal from a sum of the PN signals so as to generate a dither signal without a DC offset, and outputs the dither signal.

Figure 14:
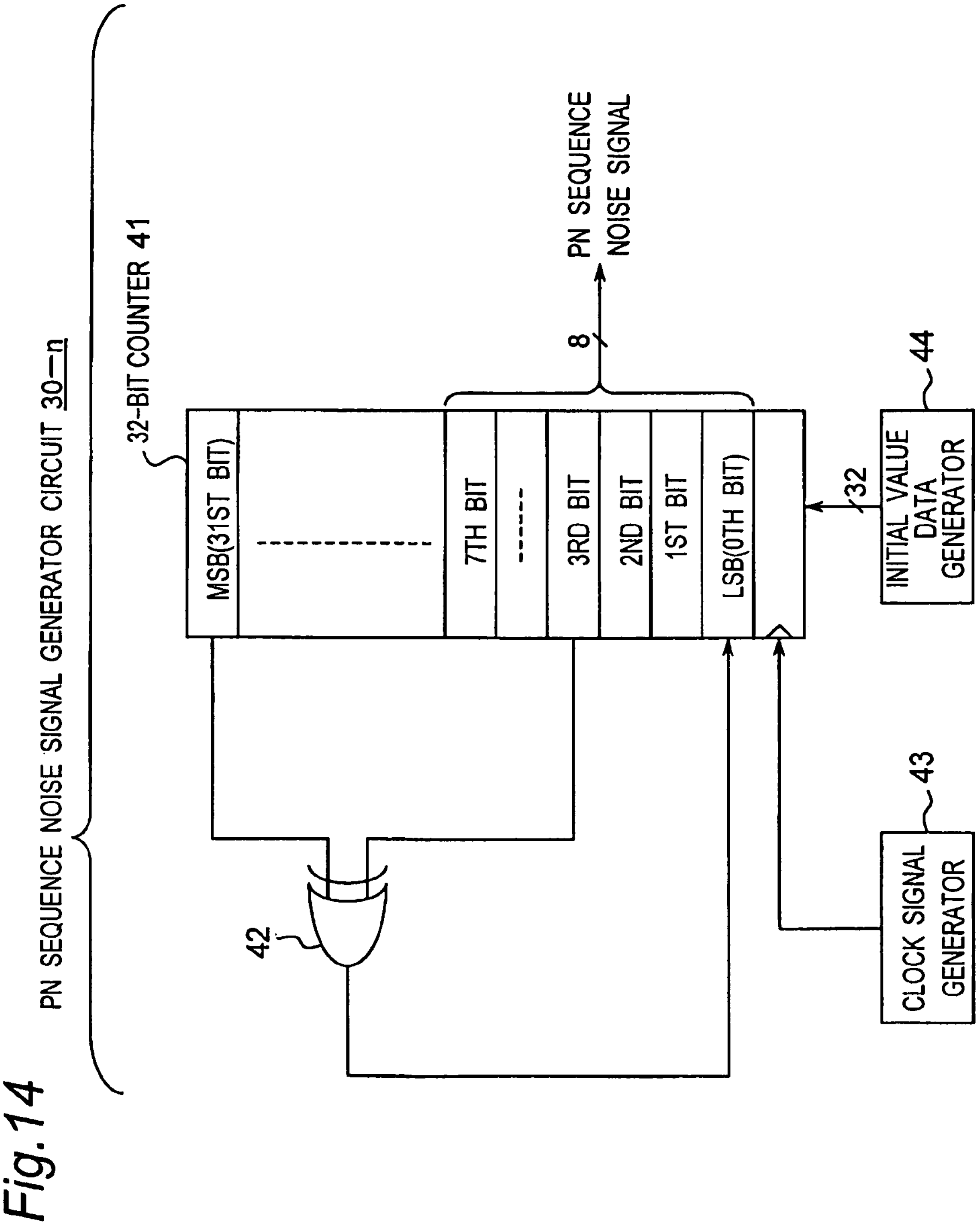
FIG. 14 is a block diagram showing a configuration of a PN sequence noise signal generator circuit 30-n (n=1, 2, . . . , N) shown in FIG. 13.

In this case, as shown in FIG. 14, each of PN sequence noise signal generator circuits 30-n (n=1, 2, . . . , N) is constituted by including a 32-bit counter 41, an exclusive-OR gate 42, a clock signal generator 43, and an initial value data generator 44. An initial value of 32 bits is set into the 32-bit counter 41 by the initial value data generator 44. The initial values of 32 bits for the respective PN sequence noise signal generator circuits 30-n are different from each other, and then the 32-bit counter 41 counts so as to increment by one according to a clock signal generated by the clock signal generator 43. Among data of 32 bits (including data of 0th bit to data of 31st bit) of the 32-bit counter 41, one-bit data of most significant bit (MSB; 31st bit) and one-bit data of the 3rd bit are inputted to an input terminal of the exclusive-OR gate 42. The exclusive-OR gate 42 sets one-bit data of a calculated exclusive logical sum to a least significant bit (LSB) of the 32-bit counter 41. Finally, data of lower eight bits of the 32-bit counter 41 is outputted as a PN sequence noise signal. By thus constituting the PN sequence noise signal generator circuits 30-n, PN sequence noise signals outputted from the respective PN sequence noise signal generator circuits 30-n become the eight-bit PN sequence noise signals independent of one another.

In the example shown in FIG. 14, the PN sequence noise signal generator circuits 30-n are constituted as described above so as to generate the eight-bit PN sequence noise signals independent of one another. However, the present invention is not limited to this. The PN sequence noise signal generator circuits 30-n may be constituted as follows.

(1) The bit locations of eight-bit in 32-bit counter 41, from which the PN sequence noise signals are taken out, are set to be different from each other. Namely, the PN sequence noise signal generator circuit 30-1 takes out an eight-bit PN sequence noise signal from the least significant eight bits, the PN sequence noise signal generator circuit 30-2 takes out a PN sequence noise signal from eight bits right on the least significant eight bits, and the subsequent PN sequence noise signal generator circuits take out PN sequence noise signals in a manner similar to above.

(2) Instead, the bit locations of the respective 32-bit counters 41, from which one-bit data inputted to corresponding exclusive-OR gates 42 are taken out, are set to be different from each other.

(3) Alternatively, at least two of the example shown in FIG. 14, a modified example as described in (1), and a modified example as described in (2) are combined.

Figure 18A:
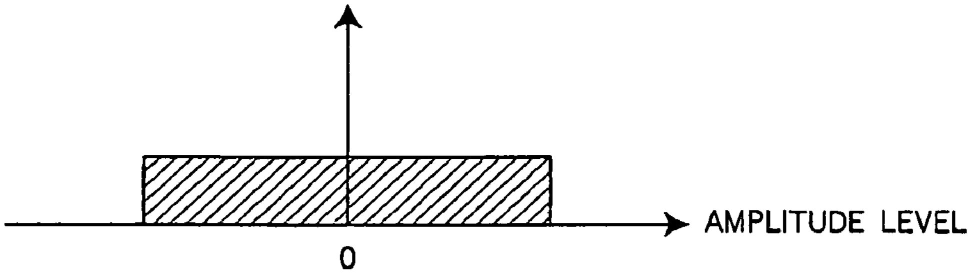
FIG. 18A is a graph showing a function of a probability density relative to an amplitude level of a white noise signal generated by the independent white noise generator circuit 380 shown in FIG. 13 at N=1.
Figure 18B:
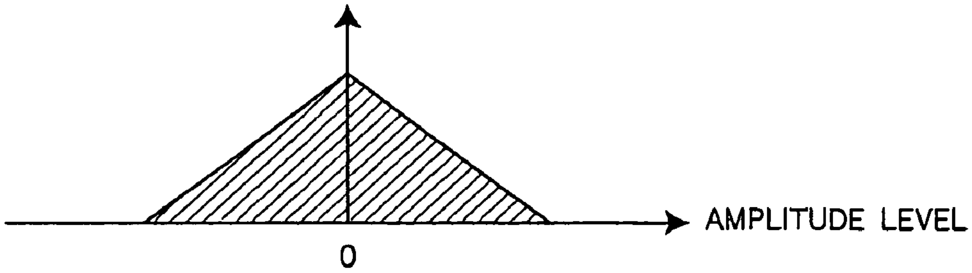
FIG. 18B is a graph showing a function of a probability density relative to an amplitude level of a diamond noise signal generated by the independent white noise generator circuit 380 shown in FIG. 13 at N=2.
Figure 18C:
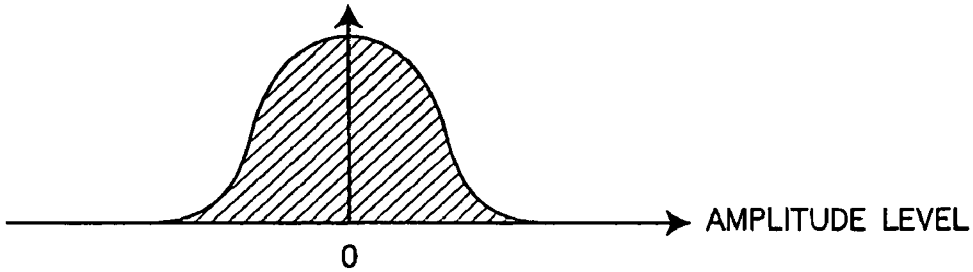
FIG. 18C is a graph showing a function of a probability density relative to an amplitude level of a bell noise signal generated by the independent white noise generator circuit 380 shown in FIG. 13 at N=3.

By adding up a plurality of PN sequence noises independent of one another, a PN sequence noise signal having a probability density relative to an amplitude level can be generated as shown in FIGS. 18A, 18B, and 18C, according to number “N” of the PN sequence noise signal generator circuits 30. If “N” is 1, for example, a white noise signal generally having such a probability density that is uniformly distributed relative to the amplitude level can be generated. In addition, if “N” is 12, by adding up the PN sequence noise signals from the respective PN sequence noise signal generator circuits 30-n that generate twelve uniformly random numbers, a Gaussian distribution type noise signal generally having a probability density of the Gaussian distribution relative to the amplitude level can be generated as shown in FIG. 18A, since a Gaussian distribution has a dispersion of 1/12 according to the central limit theorem. Further, if “N” is 3, a bell distribution type (hanging bell type) noise signal having a probability density of a bell distribution or a hanging bell distribution similar to the Gaussian distribution and having a slightly greater dispersion than that of the Gaussian distribution, relative to the amplitude level can be generated as shown in FIG. 18C. As described so far, by constructing circuits as shown in FIGS. 13 and 14, and generating a noise signal shown in, for example, FIG. 18B or 18C, a dither signal similar to a natural sound or a musical sound signal can be generated using such a circuit that is small in size.

Referring back to FIG. 12, the random noise signal from the lower-order bits cutting-out circuit 321 is outputted to the adder 330. On the other hand, the independent white noise generator circuit 380, which has the configuration at N=1 in FIG. 13 as stated above, generates the white noise signal, and outputs the white noise signal to the adder 330. The adder 330 adds up two inputted noise signals, and outputs a noise signal having an addition result to the multiplier 340. In the level correlated white noise generator circuit 300-5 shown in FIG. 12, the noise signal has a level-correlation to the inputted signal. However, the level correlated white noise generator circuit 300-5 can generate a white noise signal having a reduced level correlation, since the white noise signal from the independent white noise generator circuit 380 is also used.

SIXTH IMPLEMENTAL EXAMPLE

Figure 15:
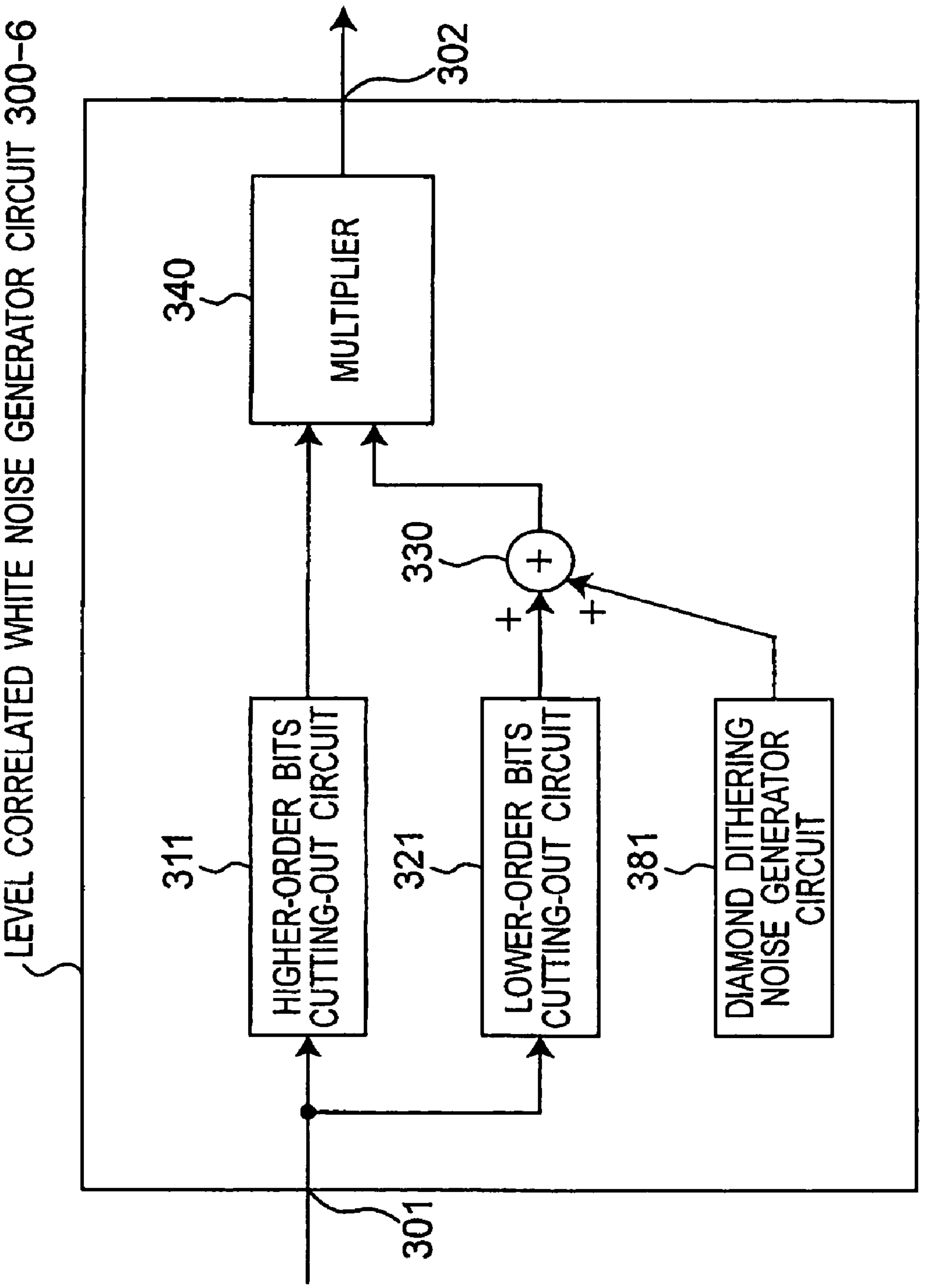
FIG. 15 is a block diagram showing a configuration of a level correlated white noise generator circuit 300-6 according to a sixth implemental example of the level correlated white noise generator circuit 300 shown in FIGS. 1 to 4.

FIG. 15 is a block diagram showing a configuration of a level correlated white noise generator circuit 300-6 according to a sixth implemental example of the level correlated white noise generator circuit 300 shown in FIGS. 1 to 4. The level correlated white noise generator circuit 300-6 shown in FIG. 15 is characterized by including a diamond dithering noise generator circuit 381 instead of the independent white noise generator circuit 380, as compared with the level correlated white noise generator circuit 300-5. In this case, the diamond dithering noise generator circuit 381 is constructed by having a configuration of the white noise generator circuit 380 shown in FIG. 13 at N=2, and generates and outputs a diamond noise signal having the probability density of the amplitude level shown in FIG. 18B. In the level correlated white noise generator circuit 300-6 shown in FIG. 15, similarly to the white noise generator circuit 300-5 shown in FIG. 12, the noise signal has a level-correlation to the inputted signal. However, the level correlated white noise generator circuit 300-6 can generate the white noise signal having the reduced level correlation, since the white noise signal from the independent white noise generator circuit 380 is also used.

SEVENTH IMPLEMENTAL EXAMPLE

Figure 19:
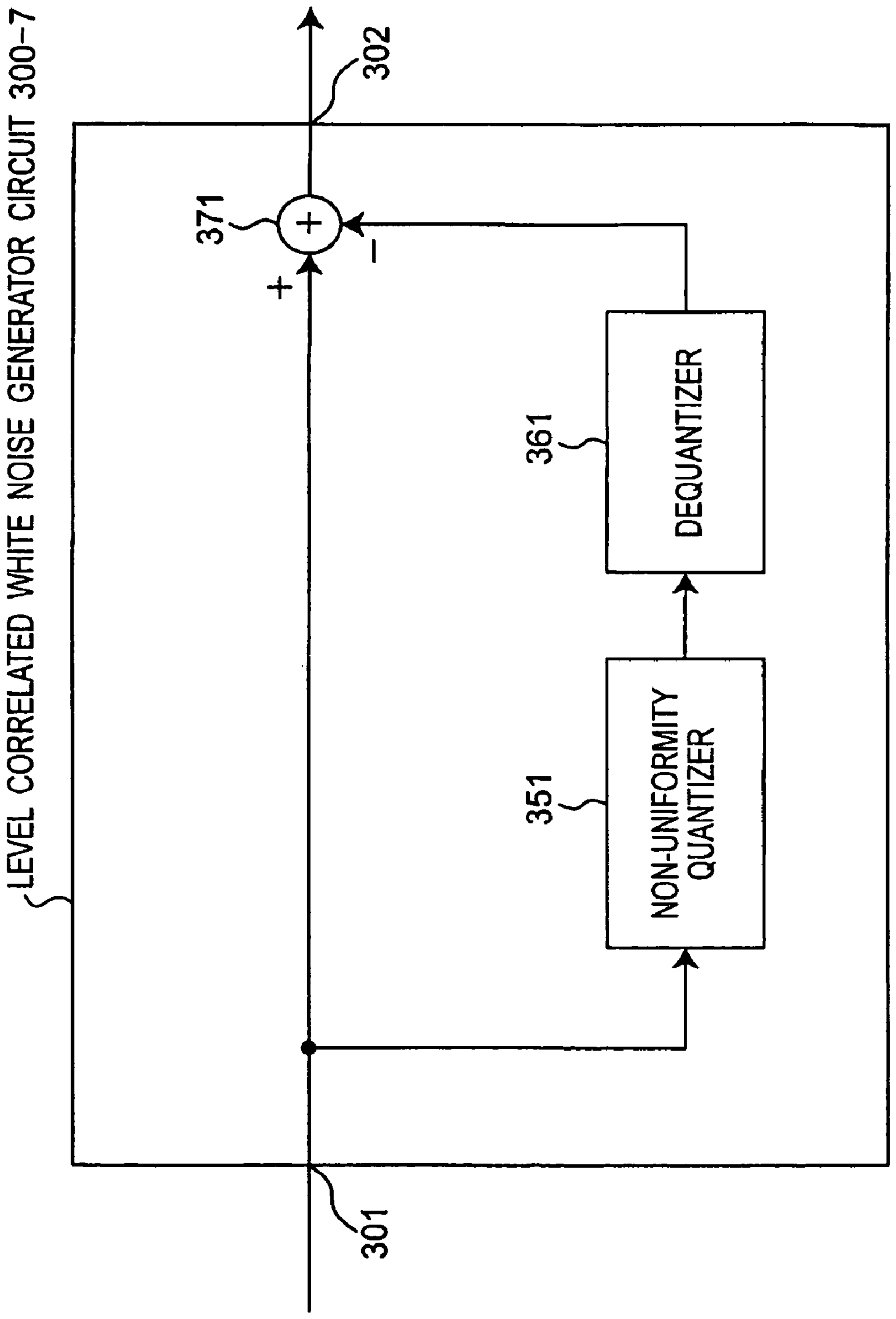
FIG. 19 is a block diagram showing a configuration of a level correlated white noise generator circuit 300-7 according to a seventh implemental example of the level correlated white noise generator circuit 300 shown in FIGS. 1 to 4.

FIG. 19 is a block diagram showing a configuration of a level correlated white noise generator circuit 300-7 according to a seventh implemental example of the level correlated white noise generator circuit 300 shown in FIGS. 1 to 4. The level correlated white noise generator circuit 300-7 shown in FIG. 19 is constructed by including a non-uniformity quantizer 351 for quantizing an inputted signal non-uniformly relative to a level of the inputted signal, a dequantizer 361 for executing quantization that is opposite to the quantization executed by the non-uniformity quantizer 351, and a subtracter 371. In this case, the non-uniformity quantizer 351 executes the quantization using, for example, run-length 1/N compression floating coding.

Referring to FIG. 19, an inputted signal (in this case, the inputted signal is an audio signal having a sampling frequency fs of 44.1 Hz and a word length of 16 bits) inputted via an input terminal 301 is inputted to the subtracter 371 and the non-uniformity quantizer 351. The non-uniformity quantizer 351 compresses the word length of the inputted signal of 16 bits into 1/N thereof, and thereafter outputs a compressed signal to the dequantizer 361. A method for the compression will be described later in detail. The dequantizer 361 dequantizes the compressed signal so as to exhibit a compression characteristic that is opposite to that of the non-uniformity quantizer 351, and extends the compressed signal to a signal of 16 bits. A re-quantized signal re-quantized by the non-uniformity quantizer 351 and the dequantizer 361 is outputted to the subtracter 371. The subtracter 371 outputs a quantized noise signal, which is a differential signal between a re-quantized inputted signal and the original inputted signal, via an output terminal 302.

By configuring the level correlated white noise generator circuit 300-7 as shown in FIG. 19, by calculating a difference between an outputted signal from the dequantizer 361 and the inputted signal, the difference becomes a quantized noise, and a value of the difference is changed according to the level of the inputted signal. As a result, a level-correlated noise signal can be obtained.

Figure 21:
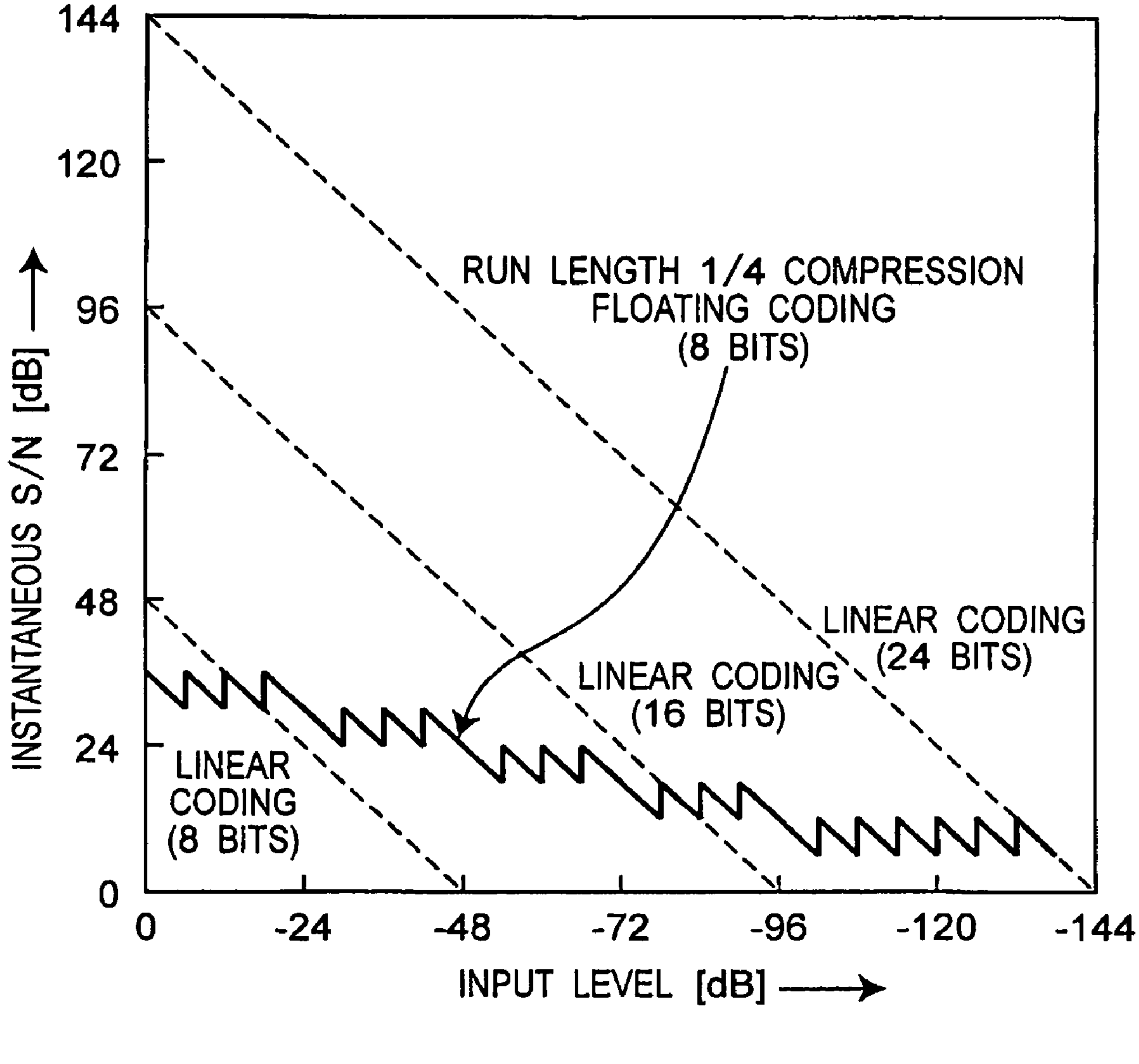
FIG. 21 is a graph showing an instantaneous signal to noise ratio (an instantaneous S/N) relative to an input level for run length ¼ compression floating coding by a non-uniformity quantizer 351, 352 or 353 shown in FIGS. 19 and 20 and that for linear coding of 8 bits, 16 bits or 24 bits.

Various characteristics of a quantized noise signal generated by the level correlated white noise generator circuit 300-7 shown in FIG. 19 will be described in detail. Cause of the quantized noise is an error signal created by a roughness of a quantization scale. FIG. 21 is a diagram showing a characteristic of an instantaneous S/N ratio relative to the level of the inputted signal showing such a case where the non-uniformity quantizer 351 and the dequantizer 361 shown in FIG. 19 are combined. In FIG. 21, a vertical axis indicates the instantaneous S/N ratio. The instantaneous S/N is a signal to noise distortion factor in a signal band from 0 Hz to 44.1 kHz or the Nyquist frequency (which is a sampling frequency limit at which no aliasing occurs to a signal, and which satisfies a relationship of (Nyquist frequency)=(sampling frequency) in an ideal state of zero margin in the present preferred embodiment). As apparent from FIG. 21, as compared with linear coding (8 bits, 16 bits, and 24 bits) according to the prior art, the instantaneous S/N ratio can be greatly improved relative to almost all input levels. As a concrete compression method of the non-uniformity quantizer 351, the run-length 1/N compression floating coding method is used as stated above.

Figures 23A, 23B:
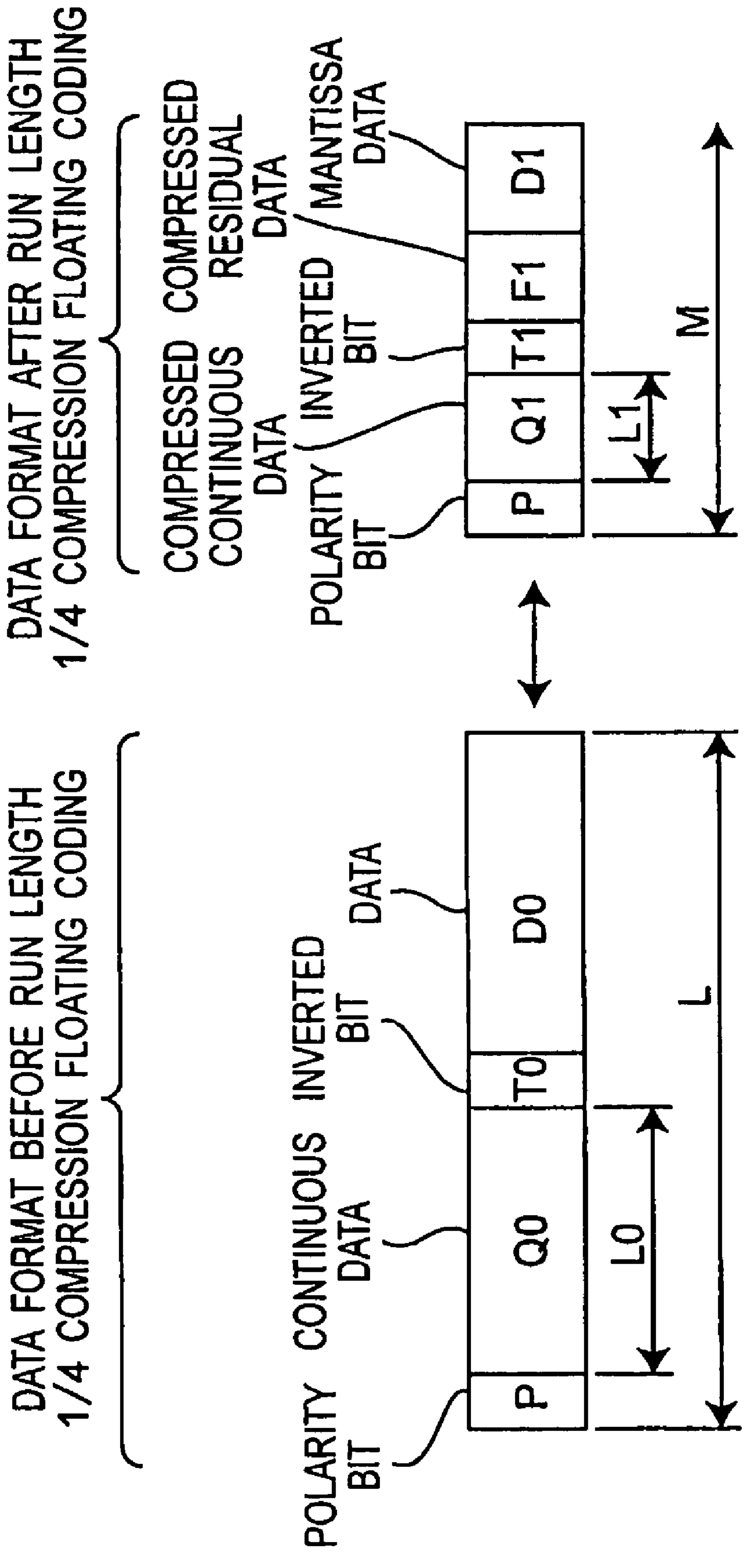
FIG. 23A is a diagram showing a data format before the run length ¼ compression floating coding by the non-uniformity quantizer 351, 352 or 353 shown in FIGS. 19 and 20.
FIG. 23B is a diagram showing depicts a data format after the run length ¼ compression floating coding by the non-uniformity quantizer 351, 352 or 353 shown in FIGS. 19 and 20.

Next, the run-length 1/N compression floating coding method will be described with reference to FIG. 23A. According to this coding method, a linear code of “L” bits is inputted to the non-uniformity quantizer 351 which is a coder. In this case, the linear code of “L” bits is present in a higher-order part of a linear code that is original data to be coded, and constituted by a polarity bit P, continuous data Q0 of continuous bits each having a predetermined logic, an inverted bit T0 that breaks the continuity of the continuous data Q0, and lower-order data D0 following the inverted bit T0. The non-uniformity quantizer 351 converts the linear code of “L” bits into a compressed data of “M” bits and outputs the compressed data of “M” bits. In this case, the compressed data of “M” bits is constituted by a sign bit P and compressed continuous data Q1 obtained by compressing a run length of the continuous data Q0, an inverted bit T1 that breaks the continuity of the compressed continuous data Q1, compressed residual data F1 that represents a residue generated upon compressing the run length, and mantissa data D1 obtained by rounding the lower-order data D0. Provided that the run length of the continuous data Q0 is L0, the run length of the compressed continuous data Q1 is L1, and "n" is an integer equal to or larger than 2, the run length L1 and the compressed residual data F1 are expressed by the following equations, respectively:

$$L1=\mathrm{Int}(L0/N), \text{ and} \quad (1)$$

$$F1=L0 \bmod N \quad (2).$$

In this case, "Int" is a function that represents an integer value of an argument, and "A mod B" is a function that represents a residue obtained when "A" is divided by "B".

Next, in the dequantization processing executed by the dequantizer 361, the above-stated dequantization processing is executed using a reverse conversion processing of the run-length 1/N compression floating coding. The dequantization will be described with reference to FIG. 23B.

The dequantizer 361 extends compressed data so as to generate and output extended data. In this case, the compressed data is constituted by the polarity bit P and the compressed continuous data Q1 of the continuous bits having the predetermined logic in the higher-order part, the inverted bit T1 that breaks the continuity of the compressed continuous data Q1, the compressed residual data F1 that represents the residue generated upon compressing the run length, and the mantissa data D1. The dequantizer 361 extends the compressed data by extending the run length of the Q1 by "N" times, adding continuous data having a length corresponding to a value of the data F1, adding the inverted bit T0 for breaking the continuity of the Q0, further adding the mantissa data D1 to a resultant data, and reading out the continuous data Q0, the inverted bit T0, and the mantissa data D0. Provided that the run length of the continuous data Q0 is L0, the run length of the compressed continuous data Q1 is L1, the residue obtained from the compressed residual data F1 is F1, and "N" is an integer equal to or larger than 2, the run length L0 and the mantissa data D0 are expressed by the following equations, respectively:

$$L0=L1*n+F1, \text{ and} \quad (3)$$

$$D0=D1 \quad (4).$$

In this case, * is an arithmetic symbol that represents multiplication.

The compression method and compression apparatus based on the above-stated run-length 1/N compression floating coding are concretely described in Japanese patent laid-open publication No. 4-286421, Japanese patent laid-open publication No. 5-183445, and Japanese patent laid-open publication No. 5-284039, respectively. Calculation results and resolution thereof in such a case where a linear code of 24 bits is compressed to a compressed code of eight bits and a run length of ¼ are shown in Table 1.

Referring to Table 1, the linear code of 24 bits is an aliasing binary code, and the floating code is an aliasing run-length ¼ compressed floating code. In the columns of the run length L0, the run length L1, and the resolution in Table 1, each value is represented decimally. An expression accuracy, that is a resolution, of a decoded code (a dequantized signal) obtained by decoding (dequantizing) and extending the compressed code (a non-uniformly quantized signal) is determined by rounding of the linear code, and changed according to the run length L0. As apparent from Table 1, the highest accuracy of 24 to 15 bits is obtained. In addition, calculation results arranged so as to be suitable for numeric conversion and table conversion using the DSP are shown in Tables 2 and 3.

Figure 22:
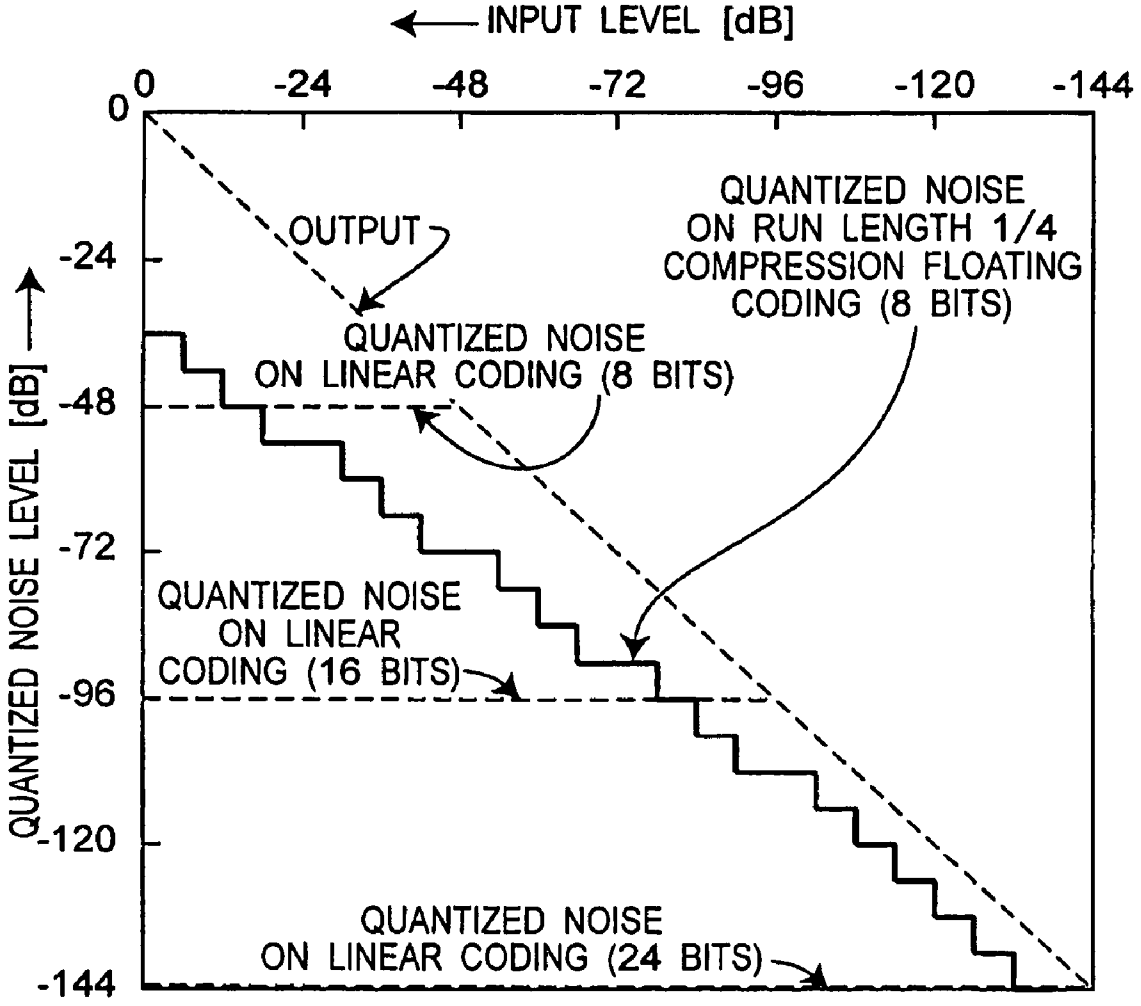
FIG. 22 is a graph showing a quantized noise level relative to an input level for the run length ¼ compression floating coding by a non-uniformity quantizer 351, 352 or 353 shown in FIGS. 19 and 20 and that for linear coding of 8 bits, 16 bits or 24 bits.

Table 2 is a non-uniformity quantization conversion table. In Table 2, "X" is a non-uniformly quantized input code and "W" is a non-uniformly quantized output code. When a code length of the output code "W" exceeds 24, the code length is rounded to 24. When the code length of the input code "X" is insufficient, "0" is inserted to a lower-order part of the input code "X". Table 2 also shows effective bits and quantized noise. As apparent from Table 2, the effective bits range from six bits to 24 bits, and the quantized noise has a value from −36 dB to −144 dB as shown in FIG. 22. Table 3 shows the quantized noise (24 bits) corresponding to respective linear codes of 24 bits.

TABLE 1

| | LINEAR CODE 24 BITS | | RUN-LENGTH ¼ COMPRESSED FLOATING CODE | |
|---|---|---|---|---|
| | 000000000011111111112222 | | 8 BITS | RESO- |
| L0 | 012345678901234567890123 (MSB LSB) | L1 | 01234567 (MSB LSB) | LUTION BITS |
| 0 | P1ABCD################## | 0 | P111ABCD | 6 |
| 1 | P01ABCD################# | 0 | P110ABCD | 7 |
| 2 | P001ABCD################ | 0 | P101ABCD | 8 |
| 3 | P0001ABCD############### | 0 | P100ABCD | 9 |
| 4 | P00001ABC############### | 1 | P0111ABC | 9 |
| 5 | P000001ABC############## | 1 | P0110ABC | 10 |
| 6 | P0000001ABC############# | 1 | P0101ABC | 11 |
| 7 | P00000001ABC############ | 1 | P0100ABC | 12 |
| 8 | P000000001AB############ | 2 | P00111AB | 12 |
| 9 | P0000000001AB########### | 2 | P00110AB | 13 |
| 10 | P00000000001AB########## | 2 | P00101AB | 14 |
| 11 | P000000000001AB######### | 2 | P00100AB | 15 |
| 12 | P0000000000001A######### | 3 | P000111A | 15 |
| 13 | P00000000000001A######## | 3 | P000110A | 16 |
| 14 | P000000000000001A####### | 3 | P000101A | 17 |
| 15 | P0000000000000001A###### | 3 | P000100A | 18 |
| 16 | P00000000000000001###### | 4 | P0000111 | 18 |
| 17 | P000000000000000001##### | 4 | P0000110 | 19 |
| 18 | P0000000000000000001#### | 4 | P0000101 | 20 |
| 19 | P00000000000000000001### | 4 | P0000100 | 21 |
| 20 | P000000000000000000001## | 5 | P0000011 | 22 |
| 21 | P0000000000000000000001# | 5 | P0000010 | 23 |
| 22 | P0000000000000000000000A | 5 | P000000A | 24 |

TABLE 2

| $\lvert X\rvert =$ | $\lvert W\rvert =$ | EFFECTIVE BITS | QUANTIZED NOISE |
|---|---|---|---|
| $2^{-1} \leqq \lvert X\rvert$ | $2^{-1}+2^{-2}+2^{-2}*\lvert X\rvert$ | 6 | −36[dB] |
| $2^{-2} \leqq \lvert X\rvert < 2^{-1}$ | $2^{-1}+2^{-3}+2^{-1}*\lvert X\rvert$ | 7 | −40[dB] |
| $2^{-3} \leqq \lvert X\rvert < 2^{-2}$ | $2^{-1}+2^{-0}*\lvert X\rvert$ | 8 | −48[dB] |
| $2^{-4} \leqq \lvert X\rvert < 2^{-3}$ | $2^{-2}+2^{-3}+2^{1}*\lvert X\rvert$ | 9 | −54[dB] |
| $2^{-5} \leqq \lvert X\rvert < 2^{-4}$ | $2^{-2}+2^{-3}+2^{1}*\lvert X\rvert$ | 9 | −54[dB] |
| $2^{-6} \leqq \lvert X\rvert < 2^{-5}$ | $2^{-2}+2^{-4}+2^{2}*\lvert X\rvert$ | 10 | −60[dB] |
| $2^{-7} \leqq \lvert X\rvert < 2^{-6}$ | $2^{-2}+2^{3}*\lvert X\rvert$ | 11 | −66[dB] |
| $2^{-8} \leqq \lvert X\rvert < 2^{-7}$ | $2^{-3}+2^{-4}+2^{4}*\lvert X\rvert$ | 12 | −72[dB] |
| $2^{-9} \leqq \lvert X\rvert < 2^{-8}$ | $2^{-3}+2^{-4}+2^{4}*\lvert X\rvert$ | 12 | −72[dB] |
| $2^{-10} \leqq \lvert X\rvert < 2^{-9}$ | $2^{-3}+2^{-5}+2^{5}*\lvert X\rvert$ | 13 | −78[dB] |
| $2^{-11} \leqq \lvert X\rvert < 2^{-10}$ | $2^{-3}+2^{6}*\lvert X\rvert$ | 14 | −84[dB] |
| $2^{-12} \leqq \lvert X\rvert < 2^{-11}$ | $2^{-4}+2^{-5}+2^{7}*\lvert X\rvert$ | 15 | −90[dB] |
| $2^{-13} \leqq \lvert X\rvert < 2^{-12}$ | $2^{-4}+2^{-5}+2^{7}*\lvert X\rvert$ | 15 | −90[dB] |
| $2^{-14} \leqq \lvert X\rvert < 2^{-13}$ | $2^{-4}+2^{-6}+2^{8}*\lvert X\rvert$ | 16 | −96[dB] |
| $2^{-15} \leqq \lvert X\rvert < 2^{-14}$ | $2^{-4}+2^{9}*\lvert X\rvert$ | 17 | −102[dB] |
| $2^{-16} \leqq \lvert X\rvert < 2^{-15}$ | $2^{-5}+2^{-6}+2^{10}*\lvert X\rvert$ | 18 | −108[dB] |
| $2^{-17} \leqq \lvert X\rvert < 2^{-16}$ | $2^{-5}+2^{-6}+2^{10}*\lvert X\rvert$ | 18 | −108[dB] |
| $2^{-18} \leqq \lvert X\rvert < 2^{-17}$ | $2^{-5}+2^{-7}+2^{11}*\lvert X\rvert$ | 19 | −114[dB] |
| $2^{-19} \leqq \lvert X\rvert < 2^{-18}$ | $2^{-5}+2^{12}*\lvert X\rvert$ | 20 | −120[dB] |
| $2^{-20} \leqq \lvert X\rvert < 2^{-19}$ | $2^{-6}+2^{-7}+2^{13}*\lvert X\rvert$ | 21 | −126[dB] |
| $2^{-21} \leqq \lvert X\rvert < 2^{-20}$ | $2^{-6}+2^{-7}+2^{14}*\lvert X\rvert$ | 22 | −132[dB] |
| $2^{-22} \leqq \lvert X\rvert < 2^{-21}$ | $2^{-6}+2^{15}*\lvert X\rvert$ | 23 | −138[dB] |
| $\lvert X\rvert < 2^{-22}$ | $2^{16}*\lvert X\rvert$ | 24 | −144[dB] |

TABLE 3

| L0 | LINEAR CODE 24 BITS<br>000000000011111111112222<br>012345678901234567890123<br>(MSB LSB) | QUANTIZED NOISE 24 BITS<br>000000000011111111112222<br>012345678901234567890123<br>(MSB LSB) |
|---|---|---|
| 0 | P1ABCD################## | P00000################## |
| 1 | P01ABCD################# | P000000################# |
| 2 | P001ABCD################ | P0000000################ |
| 3 | P0001ABCD############### | P00000000############### |
| 4 | P00001ABC############### | P00000000############### |
| 5 | P000001ABC############## | P000000000############## |
| 6 | P0000001ABC############# | P0000000000############# |
| 7 | P00000001ABC############ | P00000000000############ |
| 8 | P000000001AB############ | P00000000000############ |
| 9 | P0000000001AB########### | P000000000000########### |
| 10 | P00000000001AB########## | P0000000000000########## |
| 11 | P000000000001AB######### | P00000000000000######### |
| 12 | P0000000000001A######### | P00000000000000######### |
| 13 | P00000000000001A######## | P000000000000000######## |
| 14 | P000000000000001A####### | P0000000000000000####### |
| 15 | P0000000000000001A###### | P00000000000000000###### |
| 16 | P00000000000000001###### | P00000000000000000###### |
| 17 | P000000000000000001##### | P000000000000000000##### |
| 18 | P0000000000000000001#### | P0000000000000000000#### |
| 19 | P00000000000000000001### | P00000000000000000000### |
| 20 | P000000000000000000001## | P000000000000000000000## |
| 21 | P0000000000000000000001# | P0000000000000000000000# |
| 22 | P0000000000000000000000A | P00000000000000000000000 |

As apparent from above-mentioned Tables 1, 2 and 3, the run-length 1/N compression floating code used in the present preferred embodiment is characterized by coding by quantizing the inputted signal so that a quantization width increases as the level of the inputted signal is larger.

In the above-stated preferred embodiment, the run length 1/N compression floating coding is used, and the linear code is the aliasing binary code. However, the present invention is similarly applicable to any other linear code such as 2'S complementary code or an offset binary code only by converting the code into another code or changing the predetermined logic value. In addition, only a case where "N" is "4" has been described, however, "N" may be arbitrarily set as long as "N" is an integer "equal to or larger than 2". In this case, a number of cases of the compressed residual data changes according to the value of "N". Accordingly, it is needless to say that a word length of the compressed residual data may be changed. In addition, the apparatus is not always constructed by a hardware circuit and may be constructed by a hardware circuit of the DSP that performs the table conversion and data conversion and a program of software installed into the hardware circuit.

As stated so far, when the run length of the original data is small, an exponent part, that is a range, is represented by fewer bits. When the run length becomes larger, bits are allocated so that the exponent part, that is the range, is represented by larger number of bits. Since the word length of the entire code is a fixed length, the number of bits of the mantissa part is changed according to the run length. These functions can extend an expression space of the range of the compressed code outputted from an output part, and also improve the expression accuracy.

EIGHTH IMPLEMENTAL EXAMPLE

Figure 20:
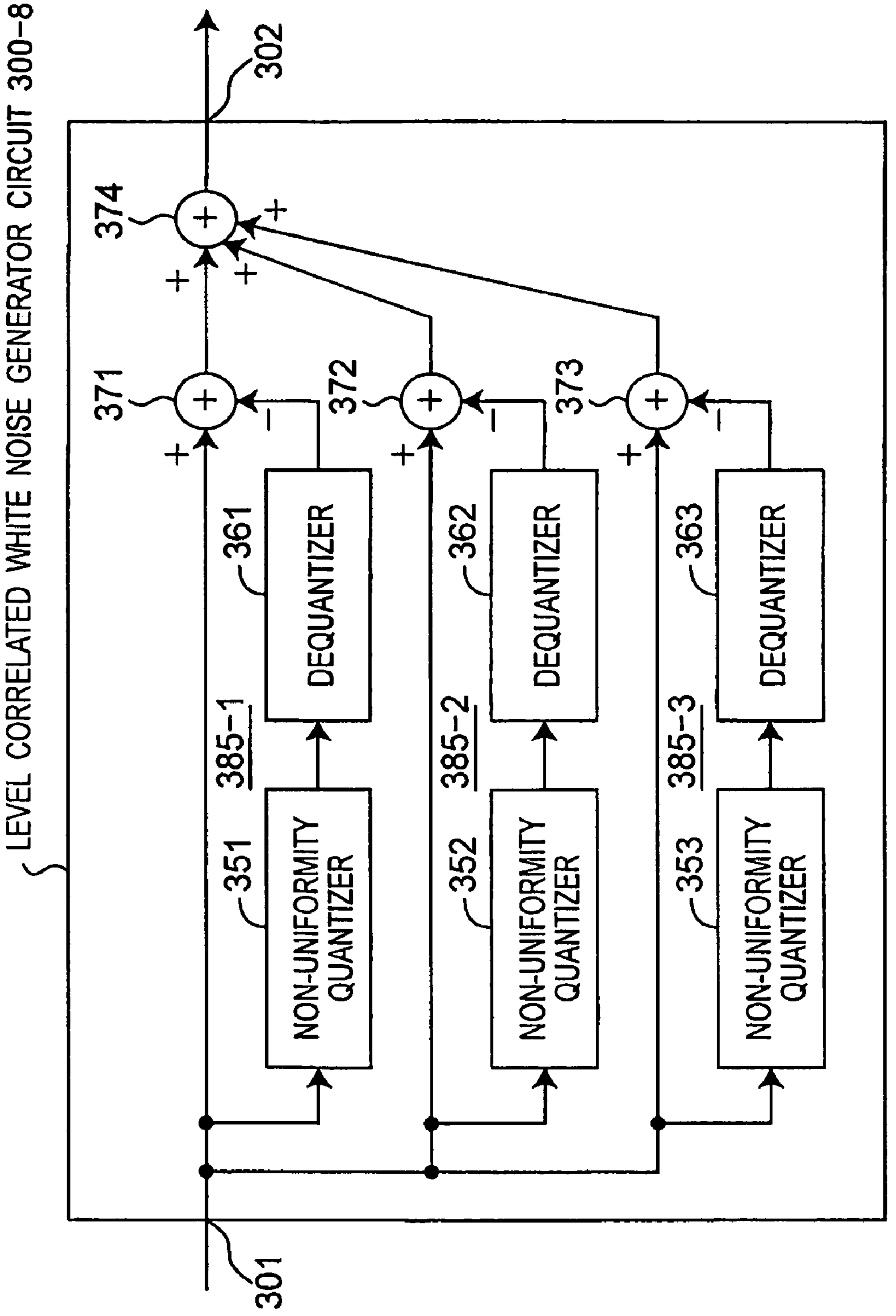
FIG. 20 is a block diagram showing a configuration of a level correlated white noise generator circuit 300-8 according to an eighth implemental example of the level correlated white noise generator circuit 300 shown in FIGS. 1 to 4.

FIG. 20 is a block diagram showing a configuration of a level correlated white noise generator circuit 300-8 according to an eighth implemental example of the level correlated white noise generator circuit 300 shown in FIGS. 1 to 4. The level correlated white noise generator circuit 300-8 shown in FIG. 20 has such a configuration that three white noise generator circuits 385-1, 385-2, and 385-3, each configured by the level correlated white noise generator circuit 300-7 shown in FIG. 19, are connected in parallel, and obtains a noise signal by adding up outputted signals from the respective whit noise generator circuits 385-1, 385-2, and 385-3 by an adder 374. The level correlated white noise generator circuit 385-1 is constructed by including the non-uniformity quantizer 351, the dequantizer 361, and the subtracter 371. The level correlated white noise generator circuit 385-2 is constructed by including a non-uniformity quantizer 352, a dequantizer 362, and a subtracter 372. The level correlated white noise generator circuit 385-3 is constructed by including a non-uniformity quantizer 353, a dequantizer 363, and a subtracter 373. These three level correlated white noise generator circuits 385-1, 385-2, and 385-3 have configurations similar to each other, and generate three noise signals similar to each other. The adder 374 adds up the three noise signals so as to be able to generate a noise signal having a probability density of, for example, the bell noise signal shown in FIG. 18C.

NINTH IMPLEMENTAL EXAMPLE

Figure 24:
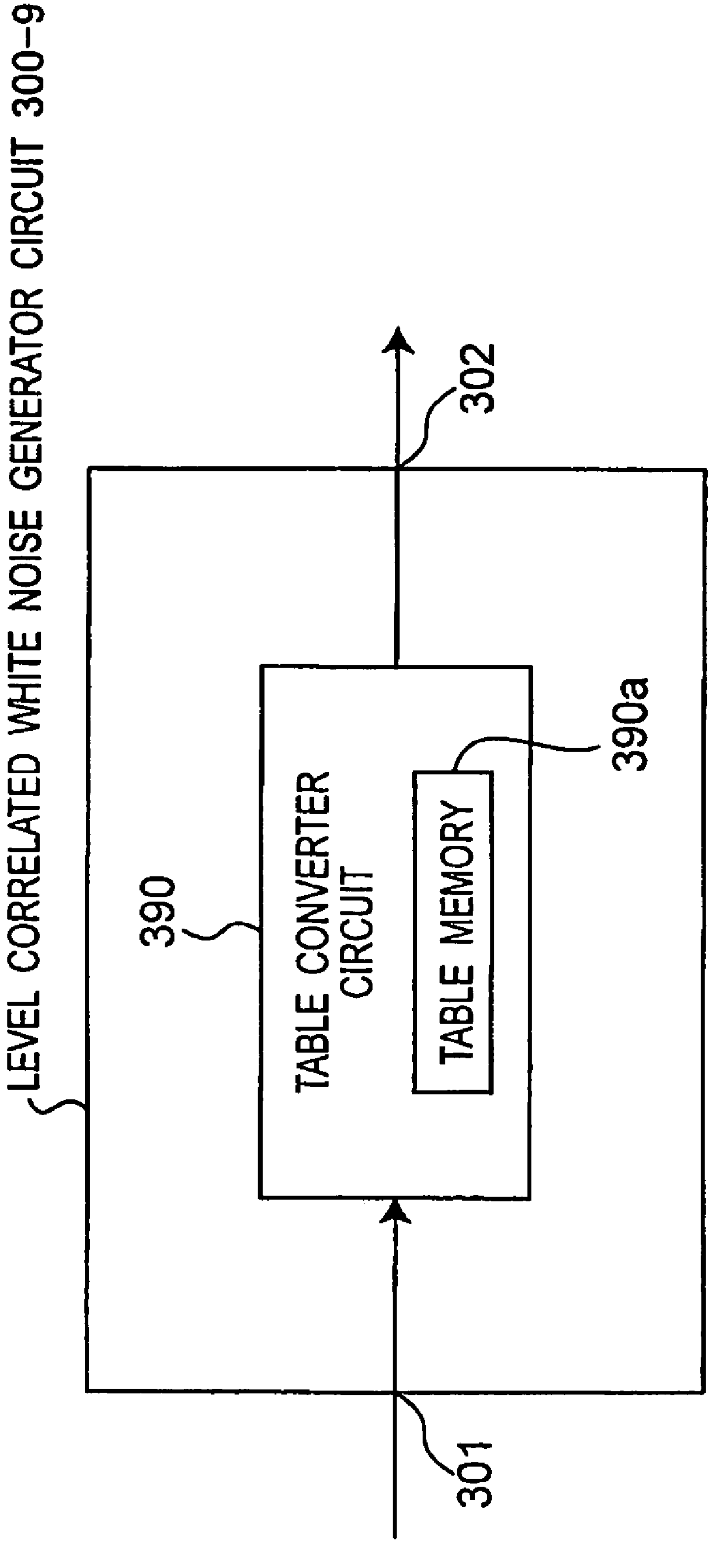
FIG. 24 is a block diagram showing a configuration of a level correlated white noise generator circuit 300-9 according to a ninth implemental example of the level correlated white noise generator circuit 300 shown in FIGS. 1 to 4.

FIG. 24 is a block diagram showing a configuration of a level correlated white noise generator circuit 300-9 according to a ninth implemental example of the level correlated white noise generator circuit 300 shown in FIGS. 1 to 4. The level correlated white noise generator circuit 300-9 is constructed by including a table converter circuit 390 that stores a table memory 390*a* in it. The table memory 390*a* includes data representing a relationship between the inputted signal and outputted signal of FIG. 19 or 20, that is, a data table representing values of outputted signals relative to all inputted signals. The level correlated white noise generator circuit 300-9 receives the inputted signal inputted via the input terminal 301, responsive to the inputted signal inputted to the input terminal 301, refers to the table memory 390*a* to search a value of an outputted signal corresponding to a value of the inputted signal, generates an outputted signal that is a noise signal having a value of an outputted signal having a search result, and outputs a resultant outputted signal via the output terminal 302. As stated above, according to the level correlated white noise generator circuit 300-9 shown in FIG. 24, a level correlated white noise generator circuit can be constituted with a circuit having an extremely simple configuration as compared with the configurations of the other level correlated white noise generator circuits 300-1 to 300-8.

Figure 25:
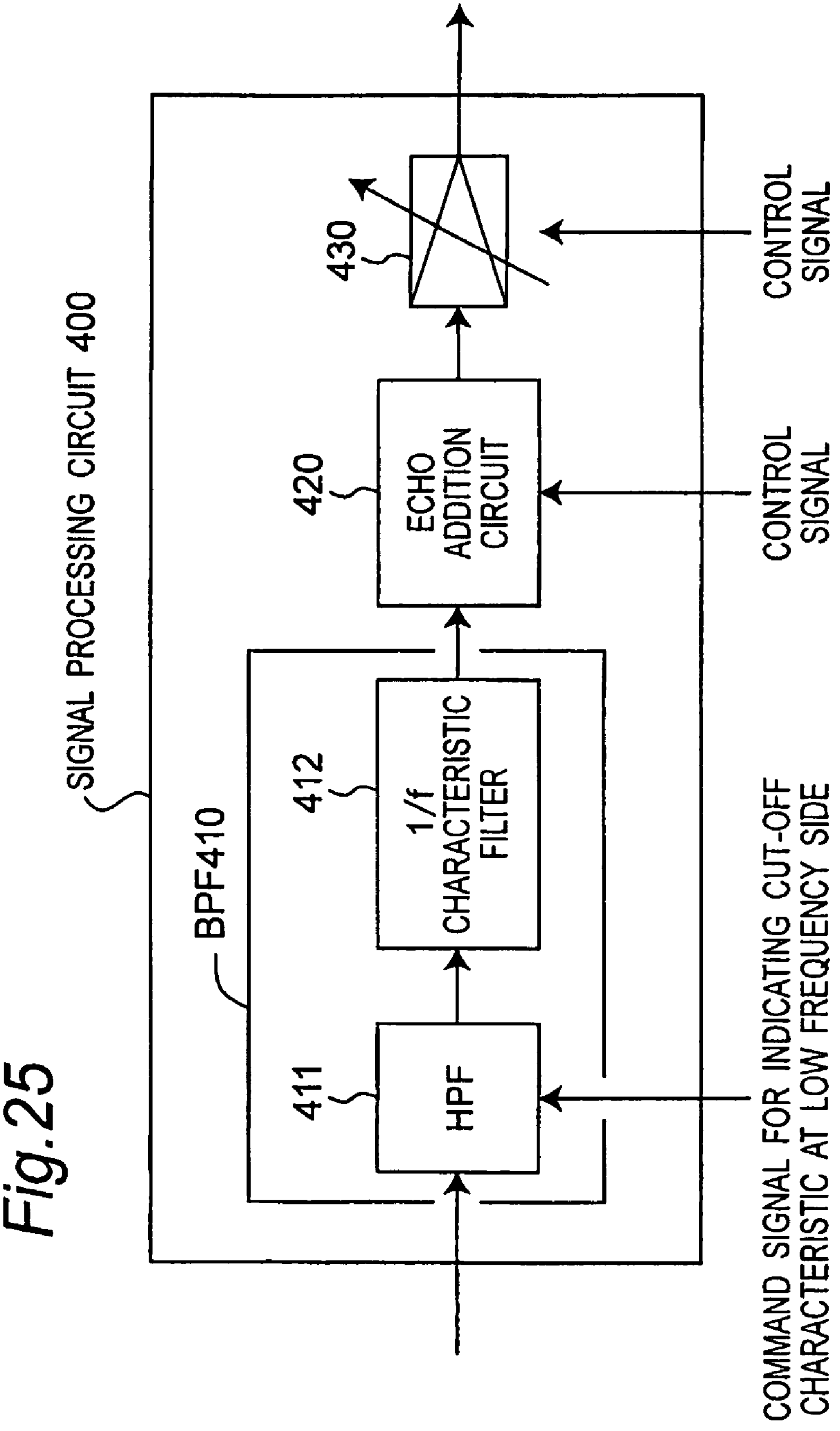
FIG. 25 is a block diagram showing a configuration of a signal processing circuit 400 shown in FIGS. 1 to 4.
Figure 26:
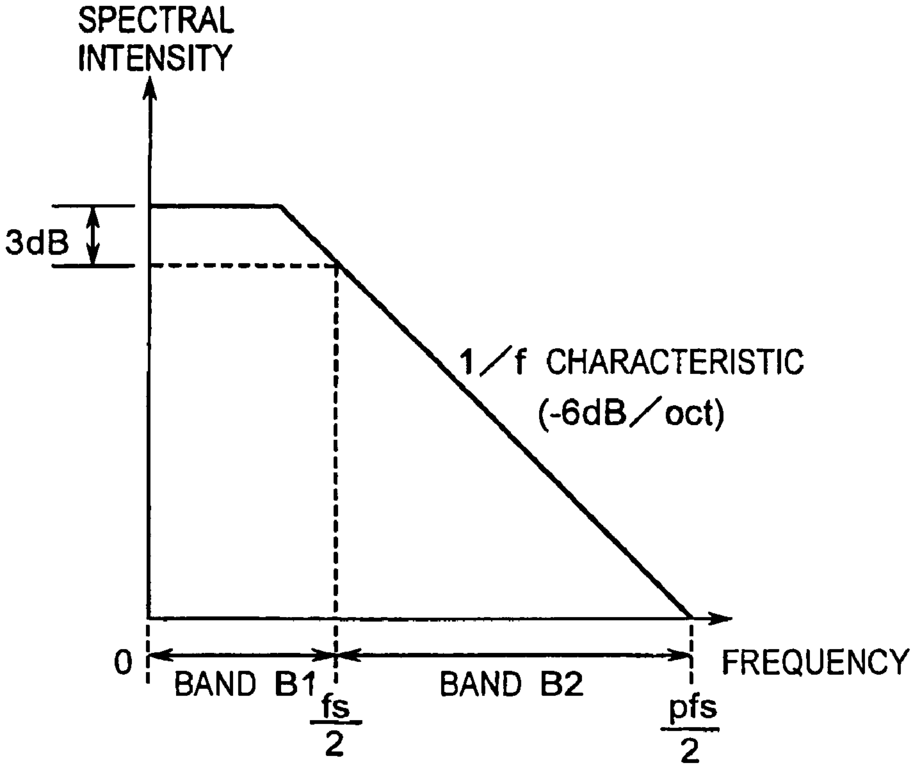
FIG. 26 is a graph showing a frequency characteristic of a (1/f) characteristic of a (1/f) characteristic filter 412 shown in FIG. 25.

FIG. 25 is a block diagram showing a configuration of the signal processing circuit 400 shown in FIGS. 1 to 4. As shown in FIG. 25, the signal processing circuit 400 is constructed by including a bandpass filter 410, an echo addition circuit 420, and a variable multiplier 430. As shown in FIG. 25, the bandpass filter 410 has such a configuration that a high-pass filter (HPF) 411 and a (1/f) characteristic filter 412, which is a low-pass filter, are connected in cascade to each other. When the inputted digital audio signal is, for example, an uncompressed digital signal outputted from a CD player or the like, the babdpass filter 410 preferably has the following specifications:

(1) A cutoff frequency fLC on a lower frequency side is about fs/2;

(2) A cutoff characteristic on the lower frequency side is an attenuation amount equal to or larger than 80 dB at a frequency fs/4. The attenuation amount is close to an SN ratio based on a quantization number of the original sound. When the quantization number of the original sound is, for example, 16 bits, a theoretical SN is 98 dB. Accordingly, the babdpass filter 410 preferably has the attenuation amount equal to or larger than 80 to 100 dB. It is noted that softer sound quality is obtained as the cutoff characteristic on the lower frequency side is slower, and that sharper sound quality tendency is obtained as the cutoff frequency on the lower frequency side is sharper. In the latter case, a band extension effect can be exhibited without damaging sound quality tendency of the original sound. Accordingly, it is preferable that the cutoff characteristic on the lower frequency side of the digital low-pass filter 412 can be selectively changed over between, for example, the above-stated two characteristics according to a user's command signal from an external controller;

(3) A cutoff frequency fHC on a higher frequency side is about fs/2; and (4) A cutoff characteristic on the higher frequency side is −6 dB/oct (See, for example, FIG. 26).

In this case, as shown in FIG. 26, the (1/f) characteristic filter 412 is a so-called (1/f) characteristic low-pass filter that possesses such an attenuation characteristic that an inclination of −6 dB/oct in a band B2 that extends from frequency of fs/2 to p·fs/2, where the band B2 is higher that a band B1 that extends from frequency of 0 to fs/2. It is noted that "p" is an oversampling ratio, for example, an integer equal to or larger than 2 and equal to or smaller than about 8.

The babdpass filter 410 bandpass-filters an inputted digital signal, and outputs a bandpass-filtered digital band-extended signal via the echo addition circuit 420 and the variable amplifier 430 as described above.

Figure 28:
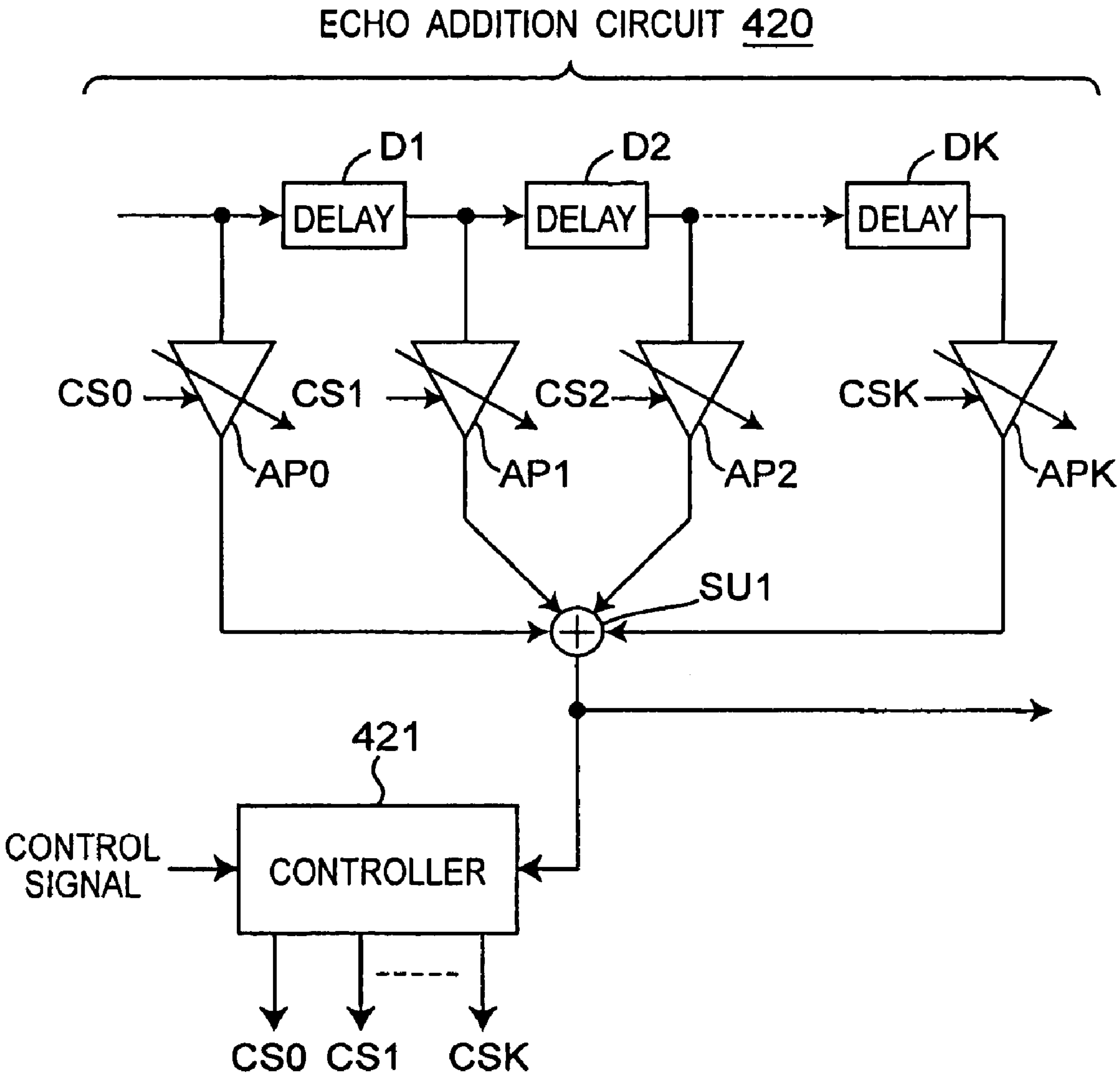
FIG. 28 is a block diagram showing a configuration of a transversal filter that is one implemental example of an echo addition circuit 480 shown in FIG. 25.

The echo addition circuit 420 is constructed by, for example, a transversal filter shown in FIG. 28. The echo addition circuit 420 adds an echo signal having a correlation to an inputted signal to the inputted signal according to a control signal that represents a degree of echo addition and that is inputted from an external circuit, and outputs a resultant signal. In this case, the inputted signal inputted to the echo addition circuit 420 is inputted to "N" delay circuits D1 to DK connected in cascade to each other and each delaying a signal by, for example, one sample of time, and inputted to an adder SU1 via a variable multiplier AP0. In this case, the variable multiplier AP0 multiplies an inputted signal by a multiplication value indicated by a multiplication value command control signal CS0 from a controller 421, generates a signal having a value of a multiplication result, and outputs a generated signal to the adder SU1. In addition, an outputted signal from the delay circuit D1 is outputted to the adder SU1 via a variable multiplier AP1 that multiplies the inputted signal by a multiplication value indicated by a multiplication value command control signal CS1 from the controller 421. Further, the outputted signal from the delay circuit D2 is outputted to the adder SU1 via a variable multiplier AP2 that multiplies the inputted signal by a multiplication value indicated by a multiplication value command control signal CS2 from the controller 421. In a manner similar to above stated manner, the outputted signal from the delay circuit Dk (k=3, 4, . . . , K) is outputted to the adder SU1 via a variable multiplier APk that multiplies the inputted signal by a multiplication value indicated by a multiplication value command control signal CSk from the controller 421. The adder SU1 adds up inputted (K+1) signals, outputs a signal having an addition result to the controller 421, and outputs to the external circuit as an outputted signal. In this case, the controller 421 adds a predetermined echo signal to the inputted signal to the echo addition circuit 420 based on a signal from the adder SU1, to generate multiplication value command control signals CSk (k=1, 2, . . . , K), and output respective signals CSk to the respective variable multipliers AP0 to APK.

The signal processing circuit 400 shown in FIG. 25 includes the echo addition circuit 420. However, the present invention is not limited to this. The signal processing circuit 400 does not necessarily include the echo addition circuit 420.

By providing the echo addition circuit 420 shown in FIG. 25, the echo signal is added only to the band-extended signal. Accordingly, when a magnitude of the inputted signal changes greatly, a sustain effect of smoothing a drop in the magnitude of the inputted signal and sustaining a noise component in a higher frequency range is produced. Due to the sustain effect, the signal sounds more natural. In addition, when the echo addition circuit 420 is not additionally provided, the band-extended signal is added to the inputted signal always interlocking with the change in the magnitude of the inputted signal. Therefore, the signal exhibits the most faithful time spectral characteristic.

In this case, the variable amplifier 430 shown in FIG. 25 is a level control circuit. The variable amplifier 430 changes a level (amplitude value) of an inputted digital signal by an amplification ratio (which is set for a positive amplification processing but may be set for a negative amplification or an attenuation processing) based on a control signal, and outputs a level-changed digital signal as an outputted signal. The variable amplifier 430 is used to relatively adjust levels of two signals inputted to the adder 800. This adjustment is preferably set so that the levels of these two signals substantially coincide with each other, i.e., set so as to keep the spectral continuity thereof, at the frequency of, for example, fs/2 in the adder 800.

Figure 29A:
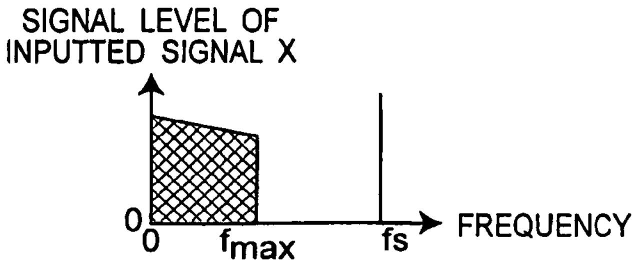
FIG. 29A is a frequency spectral view of an inputted signal X in an operation of the audio signal band extending apparatus 100-3 according to the third preferred embodiment shown in FIG. 3 (at p=2, that is a twofold oversampling).
Figure 29B:
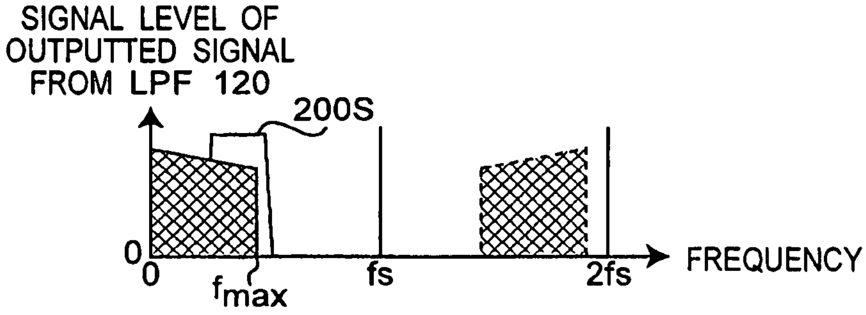
FIG. 29B is a frequency spectral view of an outputted signal from an LPF 120 in the same operation as that shown in FIG. 29A.
Figure 29C:
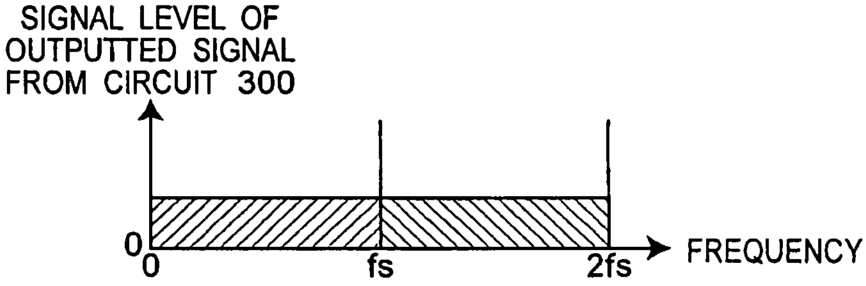
FIG. 29C is a frequency spectral view of an outputted signal from a circuit 300 in the same operation as that shown in FIG. 29A.
Figure 29D:
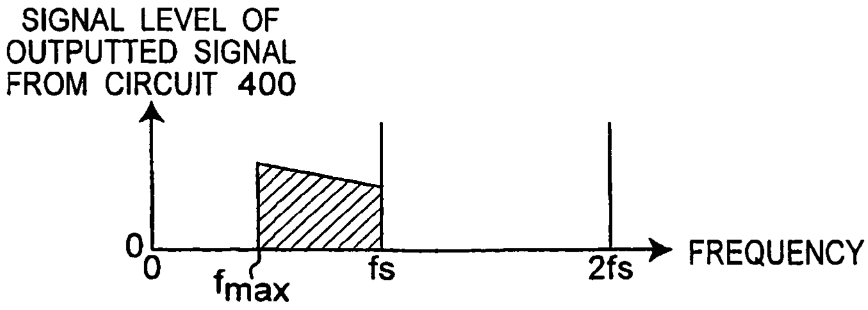
FIG. 29D is a frequency spectral view of an outputted signal from a circuit 400 in the same operation as that shown in FIG. 29A.
Figure 29E:
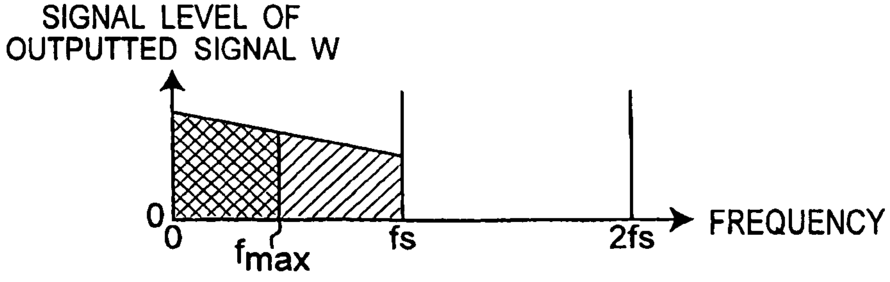
FIG. 29E is a frequency spectral view of an outputted signal W in the same operation as that shown in FIG. 29A.

FIGS. 29A to 29E are frequency spectral views showing an operation of the audio signal band extending apparatus 100-3 (at p=2, that is during twofold oversampling) according to the third preferred embodiment shown in FIG. 3. FIG. 29A is a frequency spectral view of the inputted signal X, FIG. 29B is a frequency spectral view of the outputted signal from the LPF 120, FIG. 29C is a frequency spectral view of the outputted signal from the circuit 300, FIG. 29D is a frequency spectral view of the outputted signal from the circuit 400, and FIG. 29E is a frequency spectral view of the outputted signal W.

Referring to FIGS. 3 and 29A to 29E, the operation of the audio signal band extending apparatus 100-3 will be described. As shown in FIGS. 29A and 29B, the inputted signal having a predetermined maximum frequency fmax is oversampled and low-pass filtered by the oversampling type low-pass filter 120, and then bandpass filtered using a bandpass filtering characteristic 200S of the bandpass filter 200, and a resultant frequency spectrum is shown in FIG. 29B. In this case, the maximum frequency fmax of the inputted signal is equal to or lower than fs/2, and when a margin for frequency is set, the maximum frequency fmax is lower than fs/2. Based on the inputted signal from the bandpass filter 200, the level correlated white noise generator circuit 300 generates a white noise signal shown in FIG. 29C, the level of which changes according to the level of the inputted signal i.e., generates a white-noise signal which is level-correlated to the inputted signal. Next, the signal processing circuit 400 executes the bandpass filtering processing, the echo addition processing, and the level adjustment processing on a generated white noise signal, so as to generate a band-extended addition signal shown in FIG. 29D. In this case, a lower limit frequency of the band-extended addition signal is fmax. Further, as shown in FIG. 29E, the adder 800 adds up a signal from the oversampling type LPF 120 and a signal from the signal processing circuit 400 so as to keep the spectral continuity thereof at the frequency fmax, and outputs a signal having an addition result as the outputted signal.

Figure 30A:
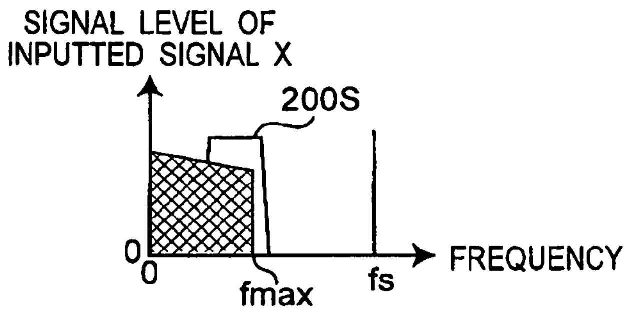
FIG. 30A is a frequency spectral view of an inputted signal X in an operation of the audio signal band extending apparatus 100-4 according to the fourth preferred embodiment shown in FIG. 4 (at p=2, that is a twofold oversampling).
Figure 30B:
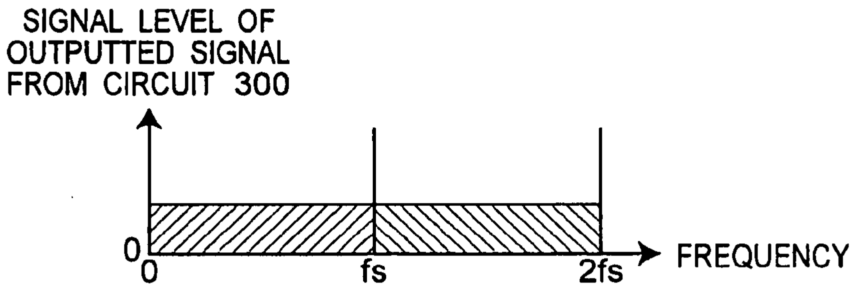
FIG. 30B is a frequency spectral view of an outputted signal from a circuit 300 in the same operation as that shown in FIG. 30A.
Figure 30C:
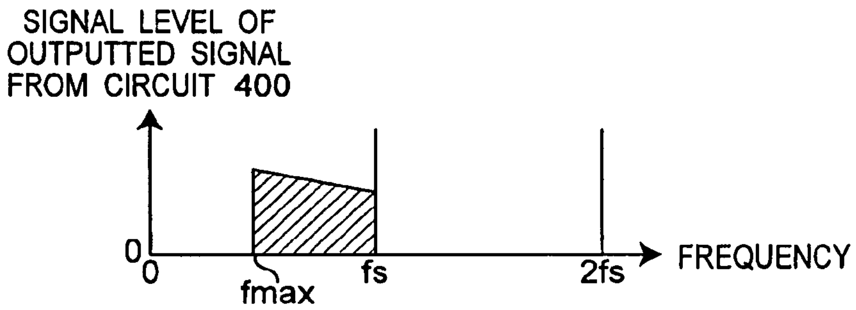
FIG. 30C is a frequency spectral view of an outputted signal from a circuit 400 in the same operation as that shown in FIG. 30A.
Figure 30D:
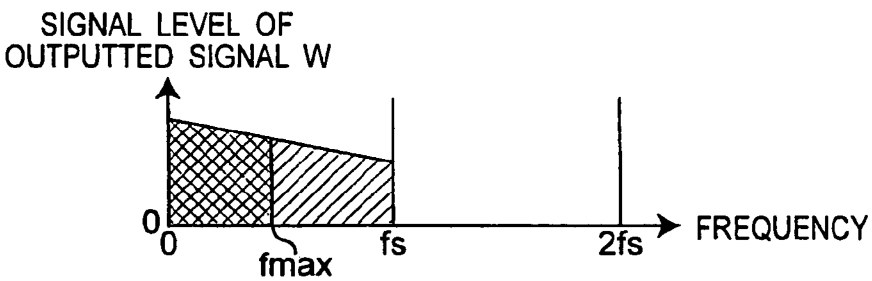
FIG. 30D is a frequency spectral view of an outputted signal W in the same operation as that shown in FIG. 30A.

FIGS. 30A to 30D are frequency spectral views showing an operation of the audio signal band extending apparatus 100-4 (at p=2, that is during twofold oversampling) according to the fourth preferred embodiment shown in FIG. 4. FIG. 30A is a frequency spectral view of the inputted signal X, FIG. 30B is a frequency spectral view of the outputted signal from the circuit 300, FIG. 30C is a frequency spectral view of the outputted signal from the circuit 400, and FIG. 30D is a frequency spectral view of the outputted signal W. As shown in FIGS. 30A to 30D, the audio signal band extending apparatus 100-4 performs an operation similar to that shown in FIGS. 29A to 29E except for the following differences.

The differences between the audio signal band extending apparatus 100-3 shown in FIG. 3 and the audio signal band extending apparatus 100-4 shown in FIG. 4 will be described hereinafter. In the audio signal band extending apparatus 100-3 shown in FIG. 3, the inputted signal is oversampled and low-pass filtered, and thereafter the bandpass filtering processing, the noise generation processing, and the signal processing are executed on a resultant signal. In the audio signal band extending apparatus 100-4 shown in FIG. 4, differently from audio signal band extending apparatus 100-3 shown in FIG. 3, the inputted signal is bandpass filtered, and thereafter the noise generation processing is executed on a resultant signal. Due to this difference, a clock rate for putting the bandpass filter 200 and the noise generation circuit 300 into operation can be reduced as compared with such a case where the bandpass filter 200 and the noise generation circuit 300 is provided at the subsequent stage of the oversampling circuit 120 shown in FIG. 3. The audio signal band extending apparatus 100-4 shown in FIG. 4 exhibits such advantages effects that size of circuits can be made small, the clock rate can be reduced, and the number of steps of the DSP processing can be decreased. The signal after the noise generation is oversampled and the signal processing is executed on a resultant signal, while the inputted signal is oversampled. Finally, an oversampled inputted signal is added to the signal after the noise generation. As a result, a signal that is the same as that shown in FIG. 3 can be obtained as the outputted signal W. The audio signal band extending apparatus 100-4 shown in FIG. 4 requires the two oversampling circuits 120 and 121. However, the oversampling circuits 120 and 121 for processing the signal after the noise generation may only interpolate zero in response to the clock signal, and do not require any low-pass filters. Due to this, size of circuits or the like is hardly increased but can be reduced in the end.

Figure 31A:
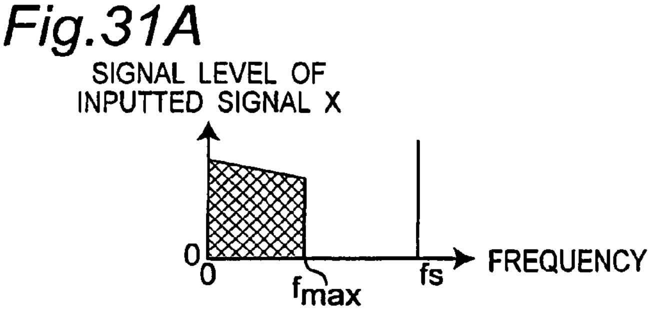
FIG. 31A is a frequency spectral view of an inputted signal X in an operation of the audio signal band extending apparatus 100-3 according to the third preferred embodiment shown in FIG. 3 (at p=4, that is a fourfold oversampling).
Figure 31B:
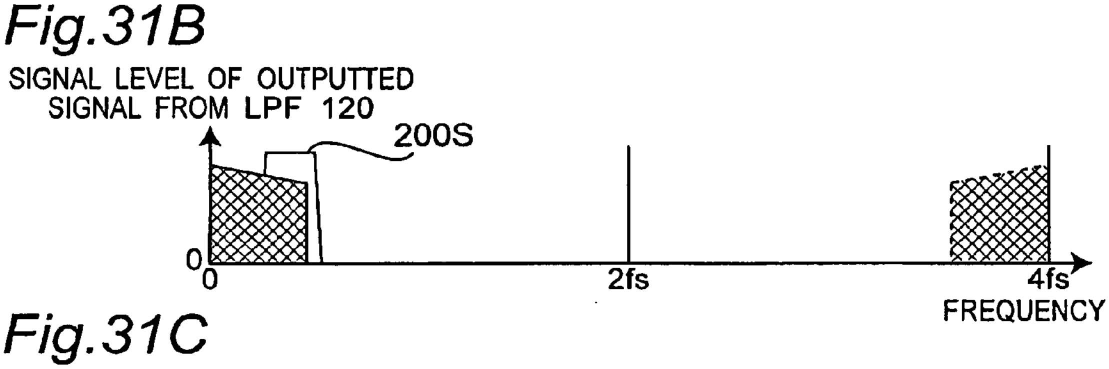
FIG. 31B is a frequency spectral view of the outputted signal from the LPF 120 in the same operation as that shown in FIG. 31A.
Figure 31C:
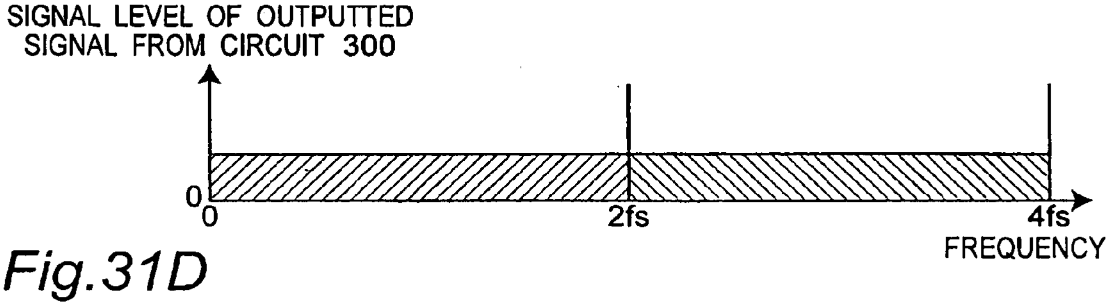
FIG. 31C is a frequency spectral view of the outputted signal from the circuit 300 in the same operation as that shown in FIG. 31A.
Figure 31D:
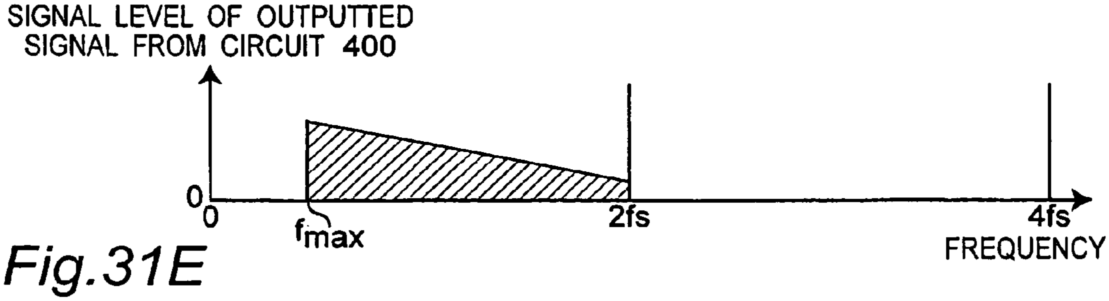
FIG. 31D is a frequency spectral view of the outputted signal from the circuit 400 in the same operation as that shown in FIG. 31A.
Figure 31E:
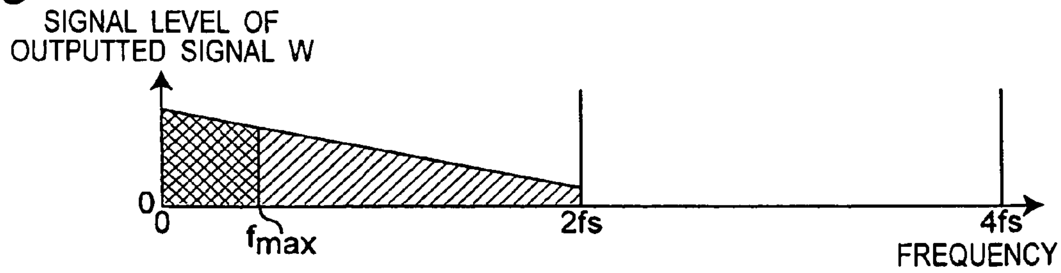
FIG. 31E is a frequency spectral view of the outputted signal W in the same operation as that shown in FIG. 31A.
Figure 32A:
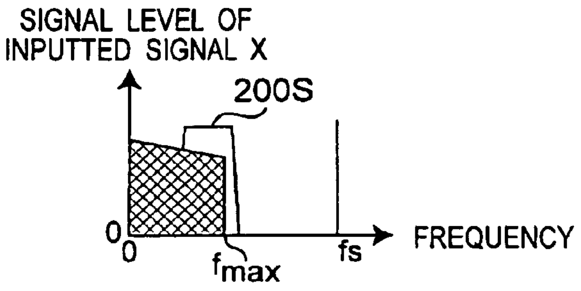
FIG. 32A is a frequency spectral view of an inputted signal X in an operation of the audio signal band extending apparatus 100-4 according to the fourth preferred embodiment shown in FIG. 4 (at p=4, that is a fourfold oversampling).
Figure 32B:
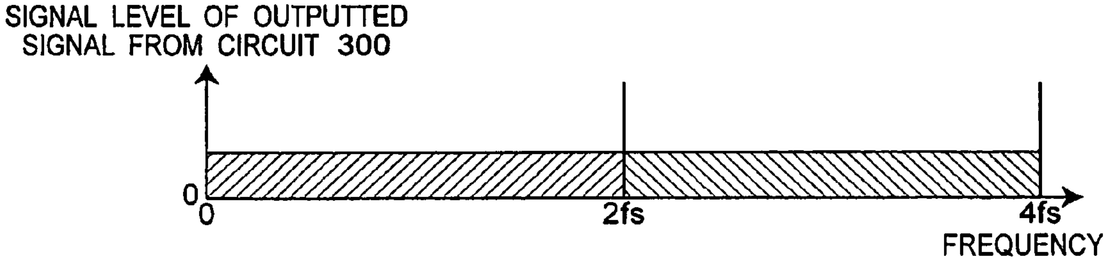
FIG. 32B is a frequency spectral view of the outputted signal from a circuit 300 in the same operation as that shown in FIG. 32A.
Figure 32C:
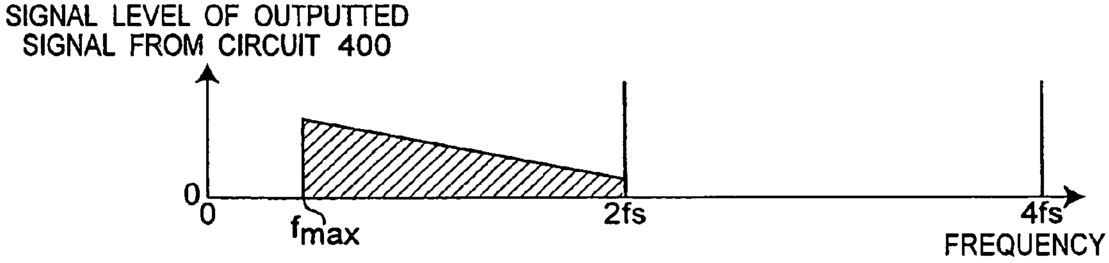
FIG. 32C is a frequency spectral view of the outputted signal from a circuit 400 in the same operation as that shown in FIG. 32A.
Figure 32D:
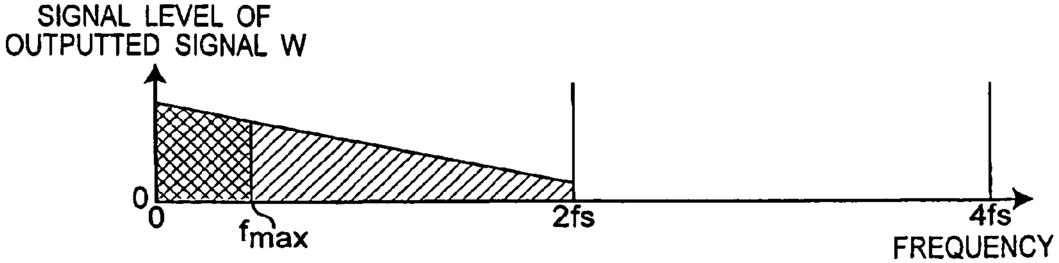
FIG. 32D is a frequency spectral view of the outputted signal W in the same operation as that shown in FIG. 32A.

FIGS. 31A to 31E are frequency spectral views showing an operation of the audio signal band extending apparatus (at p=4, that is during fourfold oversampling) according to the third preferred embodiment shown in FIG. 3. FIG. 31A is a frequency spectral view of the inputted signal X, FIG. 31B is a frequency spectral view of the outputted signal from the LPF 120, FIG. 31C is a frequency spectral view of the outputted signal from the circuit 300, FIG. 31D is a frequency spectral view of the outputted signal from the circuit 400, and FIG. 31E is a frequency spectral view of the outputted signal W. In addition, FIGS. 32A to 32D are frequency spectral views showing an operation of the audio signal band extending apparatus (at p=4, that is during fourfold oversampling) according to the fourth preferred embodiment shown in FIG. 4. FIG. 32A is a frequency spectral view of the inputted signal X, FIG. 32B is a frequency spectral view of the outputted signal from the circuit 300, FIG. 32C is a frequency spectral view of the outputted signal from the circuit 400, and FIG. 32D is a frequency spectral view of the outputted signal W.

The operation shown in FIGS. 31A to 31E is similar to the operation shown in FIGS. 29A to 29E except that a multiple number of oversampling in the operation shown in FIGS. 31A to 31E is twofold of that of oversampling in the operation shown in FIGS. 29A to 29E. In addition, the operation shown in FIGS. 32A to 32D is similar to the operation shown in FIGS. 30A to 30D except that a multiple number of oversampling in the operation shown in FIGS. 32A to 32D is twofold of that of oversampling in the operation shown in FIGS. 30A to 30D.

Figure 27:
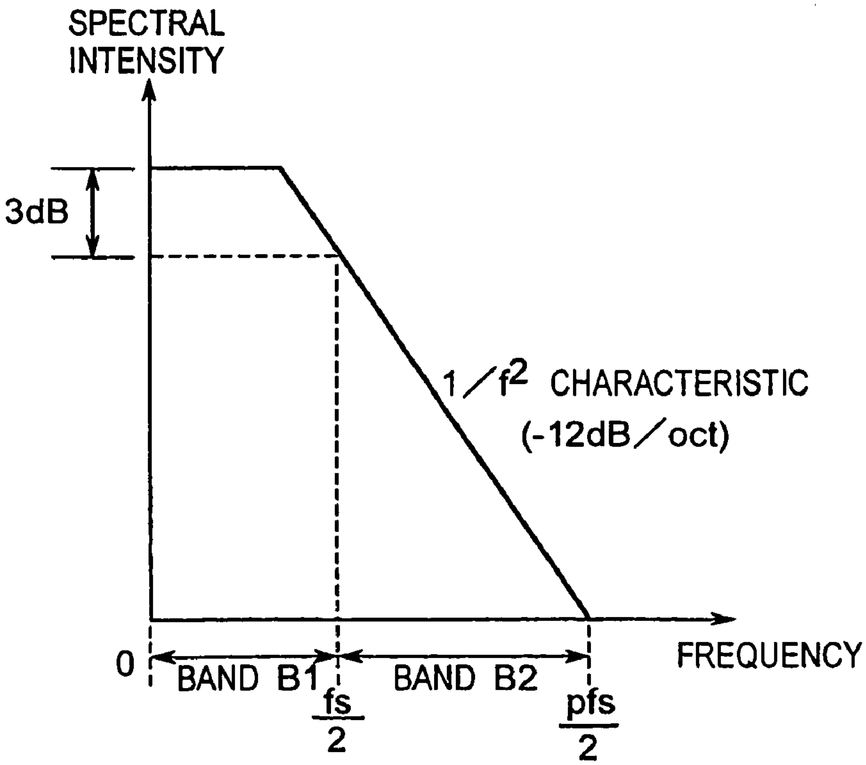
FIG. 27 is a graph showing a frequency characteristic a ($1/f^2$) characteristic of a modified example of the (1/f) characteristic filter 412 shown in FIG. 25.
Figure 33A:
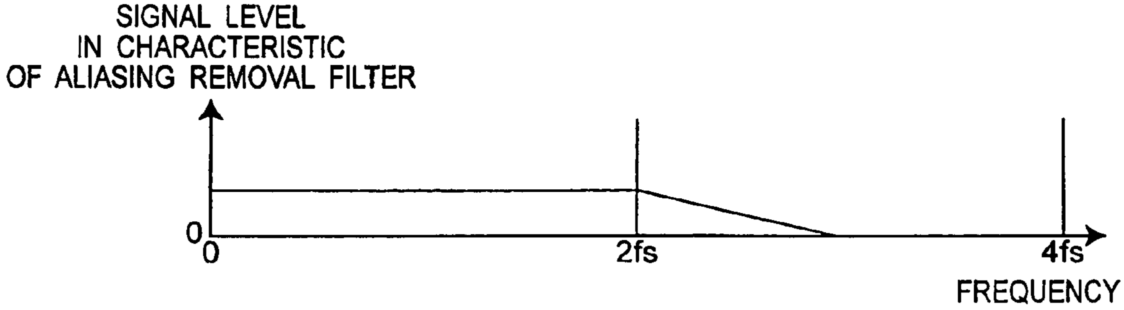
FIG. 33A is a frequency spectral view showing a characteristic of an aliasing removal filter instead of the (1/f) characteristic filter 412 that is a modified example of FIGS. 31A to 31E and FIGS. 32A to 32D.
Figure 33B:
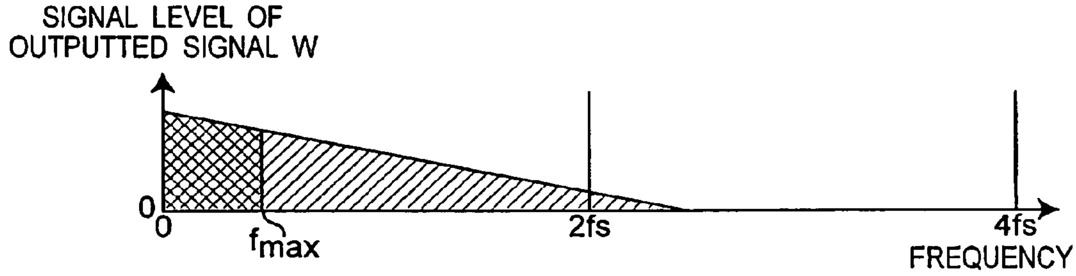
FIG. 33B is a frequency spectral view of an outputted signal W from the aliasing removal filter shown in FIG. 33A.

FIGS. 33A and 33B show modified examples of FIGS. 31A to 31E and 32A to 32D. FIG. 33A is a frequency spectral view showing a characteristic of an aliasing removal filter instead of the (1/f) characteristic filter 412, and FIG. 33B is a spectral view of the outputted signal W. A higher frequency range component in an upper limit frequency characteristic of the generated noise signal is generally removed by a higher frequency range removal characteristic shown in FIG. 26 or 27. However, by employing, for example, the aliasing removal filter shown in FIG. 33A, components at frequencies up to a predetermined frequency exceeding the Nyquist frequency remain, so that the following advantageous effects can be exhibited:

(1) As shown in FIG. 33B, an audio band extension range can be extended to be higher than the Nyquist frequency; and (2) Since the simplification of the configuration such as a decrease in the number of stages of the aliasing removal filter can be realized, the apparatus can be manufactured at a low cost. In addition, since the number of steps of the processing using the DSP or the like can be decreased, a number of steps per unit time (MIPS) can be decreased.

As described so far, according to the preferred embodiments of the present invention, as shown in FIG. 1, there is generated a noise signal having a level changing according to a level of an inputted signal and correlated to the level of the inputted signal in bands equal to or higher than the band of the inputted signal, and the noise signal is added to the inputted signal so as to keep the spectral continuity thereof. Accordingly, it is possible to easily generate a signal having an extended audio band as compared with the prior art. In addition, a band-extended signal obtained as stated above changes according to a level of an original sound and keeps its spectral continuity. Accordingly, the method or apparatus according to the present invention exhibits such an advantageous effect that a higher frequency component of the band-extended signal sounds not artificial but natural relative to the original sound.

In addition, the bandpass filtering processing, the level correlated white noise generating processing, and the signal processing are executed by digital signal processing as shown in FIG. 2. Accordingly, variations in performance do not occur due to variations in components that constitute circuits, and temperature characteristic. In addition, deterioration in sound quality does not occur when the audio signal passes through each of the circuits. Further, even if the accuracy of each filter that constitutes the same circuit is improved, size of circuits is not made large and manufacturing cost is not increased, in a manner different from that of an apparatus constituted by analog circuits.

Further, before the bandpass filtering processing and the final adding processing are executed, the oversampling processing and the low-pass filtering processing are executed as shown in FIG. 3. Accordingly, a lower-order analog low-pass filter can be provided at the previous stage of the A/D converter, and this leads to extremely large reduction in the phase distortion and the noise accompanied by the filtering processing. In addition, the quantized noise can be reduced, and conversion at a low quantization bit rate can be easily performed. Further, a higher-order higher harmonic wave component of the inputted signal X can be generated in advance and used, and therefore the higher-order higher harmonic wave component can be easily generated.

Still further, the oversampling processing is inserted between the level correlated white noise generating processing and the signal processing, and executed as shown in FIG. 4. In addition, before the final adding processing is executed, the oversampling processing and the low-pass filtering processing are executed on the inputted signal. Accordingly, it is possible to set a signal rate to a higher signal rate in the circuits provided at the subsequent stage of the oversampling type low-pass filter and the oversampling circuit. In other words, it is possible to set signal rates of circuits provided at the previous stage of the oversampling type low-pass filter and the oversampling circuit to lower signal rates, and this leads to simplification of the circuit configuration.

Fifth Preferred Embodiment

Figure 34:
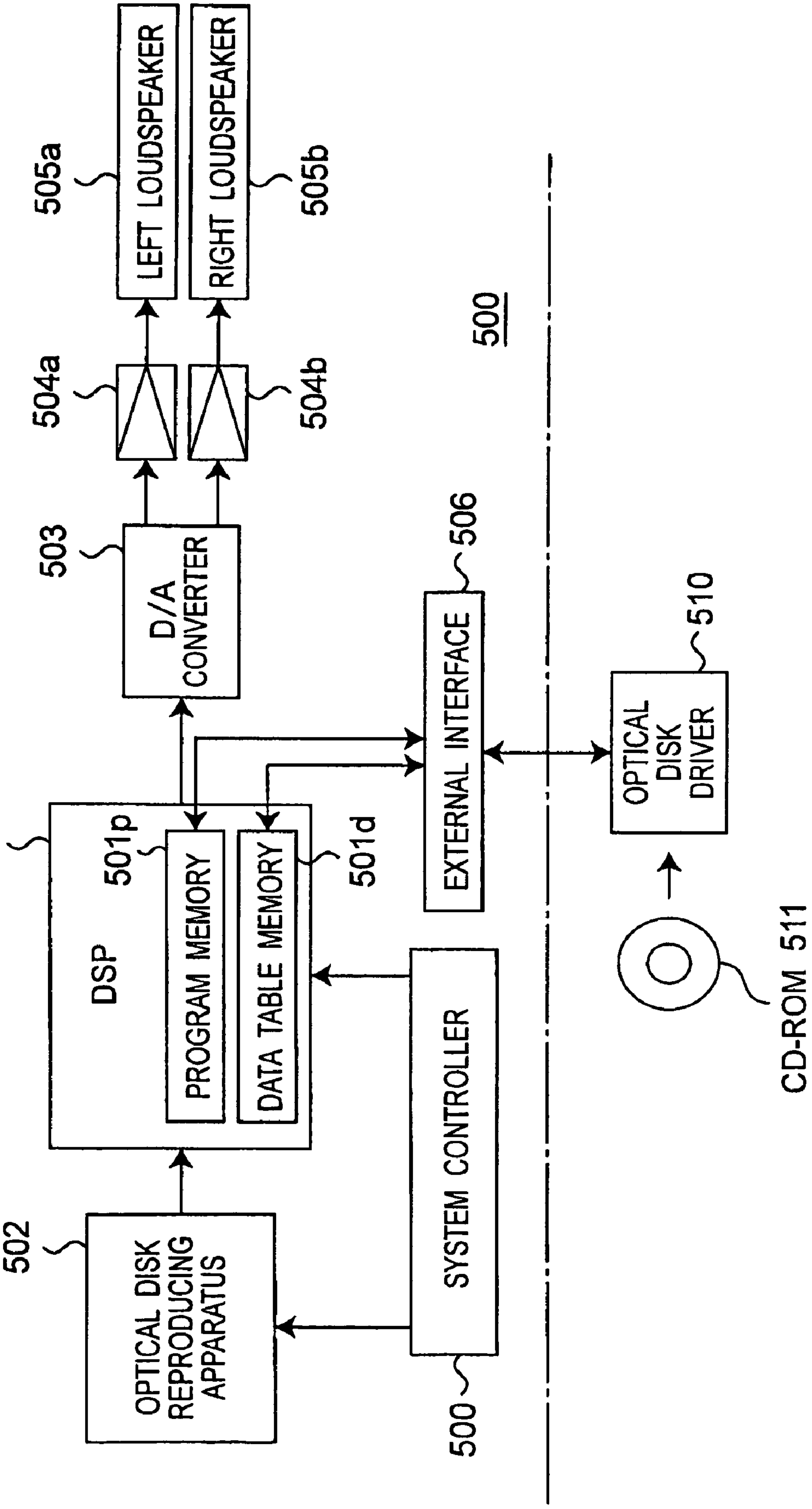
FIG. 34 is a block diagram showing a configuration of an optical disk reproduction system 500, which is one example of an application of the audio signal band extending apparatus, according to a fifth preferred embodiment of the present invention.

FIG. 34 is a block diagram showing a configuration of an optical disk reproduction system 500, which is one example of an application of the audio signal band extending apparatus, according to a fifth preferred embodiment of the present invention.

In the first to fourth preferred embodiments described above, the audio signal band extending apparatuses 100-1 to 100-4 are constituted by hardware or the digital signal processing circuit. However, the present invention is not limited to this. For example, each of processing steps in the configuration of the audio signal band extending apparatuses 100-1 to 100-4 shown in FIGS. 1 to 4 may be realized by a signal processing program for extending a band of an audio signal. In addition, the signal processing program may be stored in a program memory 501*p* of a DSP 501 shown in FIG. 34 and executed by the DSP 501. It is noted that a data table memory 501*d* of the DSP 501 stores various kinds of data necessary to execute the signal processing program.

Referring to FIG. 34, an optical disk reproducer apparatus 502 is an apparatus for reproducing a content of an optical disk, for example, a DVD player, a CD player, or an MD player. The DSP 501 executes the signal processing program for left and right digital audio signals reproduced by the optical disk reproducer apparatus 502, and audio digital signals which are band-extended from an inputted audio digital signals are obtained and outputted to a D/A converter 503. Next, the D/A converter 503 converts an inputted digital audio signals into analog audio signals, and outputs the analog audio signals to left and right loudspeakers 505*a* and 505*b* via power amplifiers 504*a* and 504*b*, respectively. In this case, a system controller 500 controls an overall operation of the optical disk reproduction system and particularly controls operations of the optical disk reproducer apparatus 502 and the DSP 501. In addition, the program memory 501*p* and the data table memory 501*d* of the DSP 501 are constituted by nonvolatile memories such as flash memories or EEPROMs.

In the optical disk system constituted as described so far, digital audio signals reproduced by the optical disk reproducer apparatus 502 can be appropriately band-extended by the DSP 501 and then reproduced by the left and right loudspeakers 505*a* and 505*b*, respectively.

As described so far, according to the fifth preferred embodiment, the respective processing steps in the configuration of the audio signal band extending apparatuses 100-1 to 100-4 shown in FIGS. 1 to 4 are realized by the signal processing program for extending the band of the audio signal, and the signal processing program is executed by the DSP 501 shown in FIG. 34. Accordingly, it is possible to easily upgrade versions for adding functions of the signal processing program and for debugging.

In the fifth preferred embodiment, the signal processing program and data for executing the program may be stored in the program memory 501*p* and the data table memory 501*d*, respectively, in advance during a manufacturing process. Alternatively, as shown below, the signal processing program and the data for executing the program which are recorded in a computer readable recording medium such as a CD-ROM 511 may be reproduced by an optical disk drive 510 including a controller such as a computer or the like, and the reproduced program and data may be stored in the program memory 501*p* and the data table memory 501*d* within the DSP 501, respectively, via an external interface 506.

In the present preferred embodiment, the DSP 501 is employed. However, the present invention is not limited to this, and a controller for a digital calculator such as a micro processor unit (MPU) may be employed.

INDUSTRIAL APPLICABILITY

As stated above in detail, according to the audio signal band extending apparatus and the method thereof according to the present invention, there is generated a noise signal having a level changing according to a level of an inputted signal and correlated to the level of the inputted signal in bands equal to or higher than the band of the inputted signal, and the noise signal is added to the inputted signal so as to keep the spectral continuity thereof. Accordingly, it is possible to easily generate a signal having an extended audio band as compared with the prior art. In addition, a band-extended signal obtained as stated above changes according to a level of an original sound and keeps its spectral continuity. Accordingly, the method or apparatus according to the present invention exhibits such an advantageous effect that a higher frequency component of the band-extended signal sounds not artificial but natural relative to the original sound.

In addition, according to the audio signal band extending apparatus and the method thereof according to the present invention, the bandpass filtering processing, the level correlated white noise generating processing, and the signal processing are executed by digital signal processing. Accordingly, variations in performance do not occur due to variations in components that constitute circuits, and temperature characteristic. In addition, deterioration in sound quality does not occur when the audio signal passes through each of the circuits. Further, even if the accuracy of each filter that constitutes the same circuit is improved, size of circuits is not made large and manufacturing cost is not increased, in a manner different from that of an apparatus constituted by analog circuits.

Further, according to the audio signal band extending apparatus and the method thereof according to the present invention, before the bandpass filtering processing and the final adding processing are executed, the oversampling processing and a low-pass filtering processing are executed. Accordingly, the lower-order analog low-pass filter can be provided at the previous stage of the A/D converter, and this leads to extremely large reduction in the phase distortion and the noise accompanied by the filtering processing. In addition, the quantized noise can be reduced, and_conversion at a low quantization bit rate can be easily performed. Further, a higher-order higher harmonic wave component of the inputted signal X can be generated in advance and used, and therefore a higher-order higher harmonic wave component can be easily generated.

Still further, according to the audio signal band extending apparatus and the method thereof according to the present invention, the oversampling processing is inserted between the level correlated white noise generating processing and the signal processing, and executed. In addition, before the final adding processing is executed, the oversampling processing and the low-pass filtering processing are executed on the inputted signal. Accordingly, it is possible to set a signal rate to a higher signal rate in the circuits provided at the subsequent stage of the oversampling type low-pass filter and the oversampling circuit. In other words, it is possible to set signal rates of circuits provided at the previous stage of the oversampling type low-pass filter and the oversampling circuit to lower signal rates, and this leads to simplification of the circuit configuration.

In addition, the optical disk system according to the present invention can reproduce an audio signal stored in an optical disk, extends a band of a reproduced audio signal, and output a band-extended audio signal. Accordingly, it is possible to easily generate a signal having an extended audio band based on the audio signal stored in the optical disk as compared with the prior.

Further, according to the program according to the present invention, there can be provided a program that includes the respective steps of the above-mentioned audio signal band extending method.

Still further, according to the computer readable recording medium according to the present invention, there can be provided a recording medium that stores the program including the respective steps of the above-mentioned audio signal band extending method.

The invention claimed is:

1. An audio signal band extending apparatus comprising:

a noise generating device for generating a noise signal level-correlated to and so as to change according to one of a level of an inputted signal and a level of a signal in a partial band obtained by bandpass-filtering the inputted signal using a bandpass filtering device;

a signal processing device for multiplying a generated noise signal by a predetermined transfer function so that, at a lower limit frequency of a predetermined band-extended signal, a level of the generated noise signal substantially coincides with the level of the inputted signal and a spectral continuity thereof is kept when addition is executed by an adding device, and for outputting a signal having a multiplication result; and an adding device for adding up the inputted signal and an outputted signal from said signal processing device, and for outputting a signal having an addition result, wherein said noise generating device comprises:

a level signal generating device for detecting a level of a signal inputted to said noise generating device, and for generating and outputting a level signal having a detected level;

a noise signal generating device for generating and outputting a noise signal according to the signal inputted to said noise generating device; and a multiplying device for multiplying the level signal from said level signal generating device by the noise signal from said noise signal generating device, and for outputting a noise signal having a multiplication result.

2. An audio signal band extending apparatus comprising:

a noise generating device for generating a noise signal level-correlated to and so as to change according to one of a level of an inputted signal and a level of a signal in a partial band obtained by band pass-filtering the inputted signal using a bandpass filtering device;

a signal processing device for multiplying a generated noise signal by a predetermined transfer function so that, at a lower limit frequency of a predetermined band-extended signal, a level of the generated noise signal substantially coincides with the level of the inputted signal and a spectral continuity thereof is kept when addition is executed by an adding device, and for outputting a signal having a multiplication result; and an adding device for adding up the inputted signal and an outputted signal from said signal processing device, and for outputting a signal having an addition result, wherein said noise generating device comprises:

a first cutting-out device for cutting out predetermined higher-order bits from the signal inputted to said noise generating device, and for outputting a signal including the higher-order bits;

at least one second cutting-out device for cutting out at least one of predetermined intermediate-order bits and predetermined lower-order bits from the signal inputted to said noise generating device, and for outputting a signal including the at least one of the predetermined intermediate-order bits and predetermined lower-order bits; and a multiplying device for multiplying a signal from said first cutting-out device by a signal from said second cutting-out device, and for outputting a noise signal having a multiplication result.

3. An audio signal band extending apparatus comprising:

a noise generating device for generating a noise signal level-correlated to and so as to change according to one of a level of an inputted signal and a level of a signal in a partial band obtained by band pass-filtering the inputted signal using a bandpass filtering device;

a signal processing device for multiplying a generated noise signal by a predetermined transfer function so that, at a lower limit frequency of a predetermined band-extended signal, a level of the generated noise signal substantially coincides with the level of the inputted signal and a spectral continuity thereof is kept when addition is executed by an adding device, and for outputting a signal having a multiplication result; and an adding device for adding up the inputted signal and an outputted signal from said signal processing device, and for outputting a signal having an addition result, wherein said noise generating device comprises:

a non-uniformity quantization device for quantizing a signal inputted to said noise generating device non-uniformly relative to a level thereof, and for outputting a resultant signal;

a dequantization device for executing a processing opposite to a processing executed by said non-uniformity quantization device on a signal from said non-uniformity quantization device, and for outputting a resultant signal; and a subtraction device for generating and outputting a quantized noise signal of the signal inputted to said noise generating device by calculating a difference between the signal inputted to said noise generating device and a signal from said dequantization device.

4. The audio signal band extending apparatus as claimed in claim 1, further comprising:

a first conversion device provided so as to be inserted at the previous stage of said bandpass filtering device, said first conversion device converting the inputted signal into a digital signal; and a second conversion device provided so as to be inserted between said signal processing device and said adding device, said second conversion device converting the outputted signal from said signal processing device into an analog signal.

5. The audio signal band extending apparatus as claimed in claim 1, further comprising:

an oversampling type low-pass filtering device provided so as to be inserted at the previous stage of said bandpass filtering device and said adding device, said oversampling type low-pass filtering device oversampling and low-pass filtering the inputted signal, and outputting a resultant signal to said bandpass filtering device and said adding device.

6. The audio signal band extending apparatus as claimed in claim 1, further comprising:

an oversampling type low-pass filtering device provided to be inserted at the previous stage of said adding device, said oversampling type low-pass filtering device oversampling and low-pass filtering the inputted signal, and outputting a resultant signal to said adding device; and an oversampling device provided to be inserted between said noise generating device and said signal processing device, said oversampling device oversampling the noise signal from said noise generating device, and outputting a resultant signal to said signal processing device.

7. The audio signal band extending apparatus as claimed in claim 1, wherein said noise signal generating device comprises a delta sigma modulator type quantizer, generates a quantized noise signal of a signal inputted to said noise signal generating device, and outputs a generated quantized noise signal as the noise signal.

8. The audio signal band extending apparatus as claimed in claim 2, wherein said second cutting-out device cuts out either one of a combination of intermediate-order bits and lower-order bits, and two intermediate-order bits, at different bit locations and with a predetermined bit width, adding up cut out bits, and outputs a signal having an addition result.

9. The audio signal band extending apparatus as claimed in claim 2, wherein said second cutting-out device cuts out either one of a combination of intermediate-order bits and two lower-order bits, and three intermediate-order bits, at different bit locations and with a predetermined bit width, adding up cut out bits, and outputs a signal having an addition result.

10. The audio signal band extending apparatus as claimed in claim 2, further comprising:

an independent noise generating device for generating a noise signal independent of the inputted signal; and a further adding device for adding up the noise signal from said second cutting-out device and the noise signal from said independent noise generating device, and for outputting a signal having an addition result to said multiplying device.

11. The audio signal band extending apparatus as claimed in claim 10, wherein said independent noise generating device generates a plurality of noise signals different from each other, adds up said plurality of noise signals, and outputs a signal having an addition result.

12. The audio signal band extending apparatus as claimed in claim 10, wherein said independent noise generating device generates a diamond dithering noise signal.

13. The audio signal band extending apparatus as claimed in claim 3, wherein said non-uniformity quantization device quantizes an inputted signal so as to increase a quantization width as a level of the inputted signal is larger.

14. The audio signal band extending apparatus as claimed in claim 3, wherein said non-uniformity quantization device compresses a run length of a linear code of L bits into 1/N thereof so as to generate and output data of M bits, where L, M and N are positive integers each of which equals to or larger than 2.

15. The audio signal band extending apparatus as claimed in claim 3, wherein said non-uniformity quantization device converts a linear code of L bits that consists of continuous data Q0 of continuous bits each having a predetermined logic and being allocated in a higher order part, an inverted bit TO that breaks continuity of the continuous data Q0, and lower-order data D0 following the inverted bit T0, into compressed data of M bits consisting of compressed continuous data Q1 obtained by compressing a run length of the continuous data Q0, an inverted bit T1 for that breaks continuity of the compressed continuous data Q1, compressed residual data F1 representing a residue generated upon compressing the run length, and mantissa data D1 obtained by rounding the lower-order data D0, and outputs the compressed data of M bits, and wherein, provided that the run length of the continuous data Q0 is L0, a run length of the compressed continuous data Q1 is L1, and that N is an integer equal to or larger than 2, the run length L1 of the compressed continuous data Q1 and the compressed residual data F1 are expressed by L1=Int (L0/N) and F1=L0 mod N, respectively, where Int is a function that represents an integer value of an argument, and A mod B is a function that represents a residue obtained when A is divided by B.

16. The audio signal band extending apparatus as claimed in claim 3, wherein said dequantization device extends a compressed data that consists of compressed continuous data Q1 of continuous bits each having a predetermined logic and being allocated in a higher-order part, an inverted bit T1 that breaks continuity of the compressed continuous data Q1, compressed residual data F1 representing a residue generated upon compressing a run length of the compressed continuous data Q1, and a mantissa data D1, by extending the run length of the compressed continuous data Q1 by "N" times, adding continuous data having a length corresponding to a value of the F1, adding an inverted bit TO that breaks continuity of Q0, further adding the mantissa data D1 to a resultant data, reading out the continuous data Q0, the inverted bit T0, and the mantissa data DO, and outputting an extended data, and wherein, provided that a run length of the continuous data Q0 is L0, a run length of said compressed continuous data Q1 is L1, a residue obtained from the compressed residual data F1 is F1, and N is an integer equal to or larger than 2, the run length L0 and the mantissa data D0 are expressed by L0=L1*n+F1 and D0=D1, respectively, where * is an arithmetic symbol representing multiplication.

17. The audio signal band extending apparatus as claimed in claim 3, wherein said non-uniformity quantization device floating-encodes an inputted linear code into a floating code having a predetermined effective bit length, and outputs an encoded signal having the floating code.

18. The audio signal band extending apparatus as claimed in claim 1, wherein said noise generating device comprises:

a table memory device for storing a relationship between the signal inputted to said noise generating device and a noise signal level-correlated to the signal inputted to said noise generating device so as to change according to a level of the signal inputted to said noise generating device; and a conversion device for, responsive to the signal inputted to said noise generating device, reading out and outputting a noise signal corresponding to the signal inputted to said noise generating device from said table memory device.

19. The audio signal band extending apparatus as claimed in claim 1, wherein said signal processing device comprises at least a first filtering device, and wherein said signal processing device filters out frequency bands higher than a frequency band of the inputted signal.

20. The audio signal band extending apparatus as claimed in claim 1, wherein said signal processing device comprises at least a (1/f) filtering device, and wherein said signal processing device applies a (1/f) reduction characteristic to a higher frequency band spectrum of the signal inputted to said signal processing device.

21. The audio signal band extending apparatus as claimed in claim 1, wherein said signal processing device comprises at least an echo adding processing device, and wherein said signal processing device adds an echo signal to a higher frequency band spectrum of the signal inputted to said signal processing device.

22. The audio signal band extending apparatus as claimed in claim 1, wherein said signal processing device comprises at least a second filtering device, and wherein said signal processing device filters out frequency bands higher than a frequency band of the signal inputted to said signal processing device so as to include frequency bands exceeding a Nyquist frequency.

* * * * *